(12) United States Patent
Leu et al.

(10) Patent No.: US 7,094,676 B1
(45) Date of Patent: *Aug. 22, 2006

(54) SEMICONDUCTOR CHIP ASSEMBLY WITH EMBEDDED METAL PILLAR

(75) Inventors: Chuen-Rong Leu, Hsinchu (TW); Charles W. C. Lin, Singapore (SG)

(73) Assignee: Bridge Semiconductor Corporation, Taipei (TW)

( * ) Notice: Subject to any disclaimer, the term of this patent is extended or adjusted under 35 U.S.C. 154(b) by 429 days.

This patent is subject to a terminal disclaimer.

(21) Appl. No.: 10/719,823

(22) Filed: Nov. 21, 2003

Related U.S. Application Data

(60) Continuation of application No. 10/714,794, filed on Nov. 17, 2003, which is a continuation-in-part of application No. 10/235,331, filed on Sep. 5, 2002, now Pat. No. 6,653,742, which is a division of application No. 09/939,140, filed on Aug. 24, 2001, now Pat. No. 6,576,539, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835, said application No. 10/714,794.

(60) Provisional application No. 60/509,299, filed on Oct. 7, 2003, provisional application No. 60/507,145, filed on Sep. 30, 2003.

(51) Int. Cl.
*H01L 21/44* (2006.01)

(52) U.S. Cl. .................. 438/611; 438/106; 438/617

(58) Field of Classification Search ............... 438/106, 438/107, 118, 125, 611, 613, 617
See application file for complete search history.

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |

(Continued)

FOREIGN PATENT DOCUMENTS

EP 0 718 882 A1 6/1996

(Continued)

OTHER PUBLICATIONS

Markstein et al., "Controlling the Variables in Stencil Printing," Electronic Packaging & Production, Feb. 1997, pp. 48-56.

(Continued)

*Primary Examiner*—Phuc T. Dang
(74) *Attorney, Agent, or Firm*—David M. Sigmond

(57) ABSTRACT

A method of making a semiconductor chip assembly includes forming a routing line on a metal base, etching the metal base wherein an unetched portion of the metal base forms a pillar, mechanically attaching a semiconductor chip to the routing line and the pillar wherein the chip includes a conductive pad, the routing line extends laterally from the pillar towards the chip and the chip and the pillar extend vertically beyond the routing line in the same direction, forming an encapsulant wherein the chip and the pillar are embedded in the encapsulant, and forming a connection joint that electrically connects the routing line and the pad.

300 Claims, 36 Drawing Sheets

U.S. PATENT DOCUMENTS

| | | | |
|---|---|---|---|
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Isaacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,353,498 A | 10/1994 | Fillion et al. | 29/840 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,668,405 A | 9/1997 | Yamashita | 257/668 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,856,212 A | 1/1999 | Chun | 438/126 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,973,393 A | 10/1999 | Chia et al. | 257/690 |
| 5,994,222 A | 11/1999 | Smith et al. | 438/689 |
| 6,001,671 A | 12/1999 | Fjelstad | 438/112 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,025,650 A | 2/2000 | Tsuji et al. | 257/786 |
| 6,034,427 A * | 3/2000 | Lan et al. | 257/698 |
| 6,037,665 A | 3/2000 | Miyazaki | 257/773 |
| 6,038,133 A | 3/2000 | Nakatani et al. | 361/760 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,180,881 B1 | 1/2001 | Isaak | 174/52.4 |
| 6,188,127 B1 | 2/2001 | Senba et al. | 257/686 |
| 6,218,728 B1 | 4/2001 | Kimura | 257/693 |
| 6,303,997 B1 | 10/2001 | Lee | 257/778 |
| 6,359,235 B1 | 3/2002 | Hayashi | 174/260 |
| 6,483,718 B1 | 11/2002 | Hashimoto | 361/803 |
| 6,492,597 B1 | 12/2002 | Fujii et al. | 174/255 |
| 6,504,241 B1 | 1/2003 | Yanagida | 257/686 |
| 6,538,210 B1 | 3/2003 | Sugaya et al. | 174/258 |
| 6,608,371 B1 | 8/2003 | Kurashima et al. | 257/686 |

| | | | |
|---|---|---|---|
| 6,774,467 B1 | 8/2004 | Horiuchi et al. | 257/673 |

FOREIGN PATENT DOCUMENTS

| WO | WO 97/38563 | 10/1997 |
|---|---|---|
| WO | WO 99/57762 | 11/1999 |

OTHER PUBLICATIONS

Elenius, "Choosing a Flip Chip Bumping Supplier—Technology an IC Package contractor should look for," Advanced Packaging, Mar./Apr. 1998, pp. 70-73.

Erickson, "Wafer Bumping: The Missing Link for DCA," Electronic Packaging & Production, Jul. 1998, pp. 43-46.

Kuchenmeister et al., "Film Chip Interconnection Systems Prepared By Wet Chemical Metallization," IEEE publication 0-7803-4526-6/98, Jun. 1998, 5 pages.

Ghaffarian, "Long Time BGA Assembly Reliability," Advancing Microelectronics, vol. 25, No. 6, Sep./Oct. 1998, pp. 20-23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via-Fill".

U.S. Appl. No. 09/464,561, filed Dec. 16, 1999, entitled "Bumpless Flip Chip Assembly With Strips-In-Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly with Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through-Hole For A Semiconductor Chip Assembly".

U.S. Appl. No. 09/677,207, filed Oct. 2, 2000, entitled "Method Of Making A Semiconductor Chip Assembly With A Conductive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly with Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

* cited by examiner

SEMICONDUCTOR CHIP ASSEMBLY WITH EMBEDDED METAL PILLAR

CROSS-REFERENCE TO RELATED APPLICATIONS

This application is a continuation of U.S. application Ser. No. 10/714,794 filed Nov. 17, 2003, which is a continuation-in-part of U.S. application Ser. No. 10/235,331 filed Sep. 5, 2002 (U.S. Pat. No. 6,653,742), which is a divisional of U.S. application Ser. No. 09/939,140 filed Aug. 24, 2001 (U.S. Pat. No. 6,576,539), which is a continuation-in-part of U.S. application Ser. No. 09/878,626 filed Jun. 11, 2001 (U.S. Pat. No. 6,653,217), which is a continuation-in-part of U.S. application Ser. No. 09/687,619 filed Oct. 13, 2000 (U.S. Pat. No. 6,640,835), each of which is incorporated by reference.

U.S. application Ser. No. 10/714,794 filed Nov. 17, 2003 also claims the benefit of U.S. Provisional Application Ser. No. 60/509,299 filed Oct. 7, 2003, and U.S. Provisional Application Ser. No. 60/507,145 filed Sep. 30, 2003, each of which is incorporated by reference.

BACKGROUND OF THE INVENTION

1. Field of the Invention

The present invention relates to a semiconductor chip assembly, and more particularly to a semiconductor chip assembly with an embedded metal pillar and its method of manufacture.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost.

Other techniques besides wire bonding, TAB and flip-chip technologies have been developed to provide connection joints that electrically connect pads on chips to external conductive traces. These connection joints can be formed by electroplated metal, electrolessly plated metal, solder or conductive adhesive.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed. Electroplating is relatively fast and easy to control. However, a plating bus is needed to supply current where electroplating is desired. The plating bus creates design constraints and must be removed after the electroplating occurs. Non-uniform plating may arise at the bottom of relatively deep through-holes due to poor current density distribution. Furthermore, the electrolytic bath is relatively expensive.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus. However, electroless plating is relatively slow. Furthermore, the electroless bath is relatively expensive.

Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Conductive adhesive joints with conductive fillers in polymer binders are relatively inexpensive, but do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

Accordingly, each of these connection joint techniques has various advantages and disadvantages. The optimal approach for a given application depends on design, reliability and cost considerations.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using is photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, versatile, provides a pillar with excellent mechanical and electrical properties, and makes advantageous use the particular connection joint technique best suited for a given application.

SUMMARY OF THE INVENTION

An object of the present invention is to provide a semiconductor chip assembly with a chip and a conductive trace that provides a low cost, high performance, high reliability package.

Another object of the present invention is to provide a convenient, cost-effective method for manufacturing a semiconductor chip assembly.

Generally speaking, the present invention provides a semiconductor chip assembly that includes a semiconductor chip that includes a conductive pad, a conductive trace that includes a routing line and a pillar, a connection joint that electrically connects the routing line and the pad, and an encapsulant. The routing line extends laterally from the pillar towards the chip, the pillar includes tapered sidewalls, and the chip and the pillar are embedded in the encapsulant and extend vertically beyond the routing line in the same direction.

Generally speaking, the present invention also provides a method of making a semiconductor chip assembly that includes forming a routing line on a metal base, etching the metal base wherein an unetched portion of the metal base forms a pillar, mechanically attaching a semiconductor chip to the routing line and the pillar wherein the chip includes a conductive pad, the routing line extends laterally from the pillar towards the chip and the chip and the pillar extend vertically beyond the routing line in the same direction, forming an encapsulant wherein the chip and the pillar are embedded in the encapsulant, and forming a connection joint that electrically connects the routing line and the pad.

In accordance with an aspect of the invention, a semiconductor chip assembly includes a semiconductor chip that includes first and second opposing surfaces, is wherein the first surface of the chip includes a conductive pad, a conductive trace that includes a routing line and a pillar, wherein the pillar includes first and second opposing surfaces and tapered sidewalls therebetween, the first surface of the pillar faces away from the routing line, the second surface of the pillar contacts the routing line, and the tapered sidewalls are adjacent to the first and second surfaces of the pillar and slant inwardly towards the first surface of the pillar, a connection joint that electrically connects the routing line and the pad, and an encapsulant that includes first and second opposing surfaces, wherein the first surfaces of the pillar and the encapsulant face in a first direction, the second surfaces of the pillar and the encapsulant face in a second direction opposite the first direction, the chip, the pillar and the encapsulant extend vertically beyond the routing line in the first direction, the pillar is disposed outside a periphery of the chip, the routing line extends laterally from the pillar towards the chip, the chip and the pillar are embedded in the encapsulant, the encapsulant does not cover the first surface of the pillar, and the conductive trace extends through the first surface of the encapsulant.

The first surface of the chip can face in the first direction and the second surface of the chip can face in the second direction. Alternatively, the first surface of the chip can face in the second direction and the second surface of the chip can face in the first direction.

The routing line can extend vertically beyond the chip and the pillar in the second direction. The routing line can be an essentially flat planar metal lead. In addition, the routing line can extend within and outside the periphery of the chip, or alternatively, be disposed outside the periphery of the chip.

The pillar can have a conical shape that is narrowest at its first surface and widest at its second surface. The first surface of the pillar can extend vertically beyond the encapsulant in the first direction, or alternatively, the first surface of the pillar can be laterally aligned with the encapsulant, or alternatively, the first surface of the pillar can be recessed relative to the encapsulant in the first direction. Likewise, the first surface of the pillar can extend vertically beyond the chip in the first direction, or alternatively, the first surface of the pillar can be laterally aligned with the chip. Likewise, the first surface of the pillar can be laterally aligned with the chip and the encapsulant. The second surface of the pillar can extend vertically beyond the chip in the second direction. The first and second surfaces of the pillar can be flat and parallel to one another. In addition, the surface area of the first surface of the pillar can be at least 20 percent smaller than the surface area of the second surface of the pillar.

The encapsulant can cover the chip, or alternatively, the second surface of the chip can face in the first direction and be exposed. The encapsulant can contact the chip and the pillar.

The connection joint can contact and electrically connect the routing line and the pad. The connection joint can extend vertically beyond the chip and the routing line in the first direction, or alternatively, the connection joint can extend vertically beyond the chip, the routing line and the pillar in the second direction. The connection joint can contact the encapsulant, or alternatively, the connection joint can be spaced from the encapsulant. The connection joint can be an electroplated metal, an electrolessly plated metal, solder, conductive adhesive or a wire bond.

The assembly can include an insulative base that contacts the routing line and extends vertically beyond the chip, the routing line and the pillar in the second direction.

The assembly can include an adhesive that mechanically attaches the chip to the routing line and the pillar. The adhesive can contact and be sandwiched between the chip and the insulative base. The adhesive can also contact and be sandwiched between the routing line and the pad.

The assembly can include a through-hole that extends through the insulative base and the adhesive, wherein the connection joint contacts and electrically connects the routing line and the pad in the through-hole. Alternatively, the assembly can include a first through-hole that extends through the insulative base and is spaced from the adhesive and a second through-hole that extends through the insulative base and the adhesive, wherein the connection joint is electrically connected to the routing line in the first through-hole and the pad in the second through-hole.

The assembly can include a first terminal that contacts the first surface of the pillar, extends vertically beyond the pillar in the first direction and is spaced from the connection joint. The first terminal can be plated on the pillar and extend vertically beyond the encapsulant and the insulative base in the first direction.

The assembly can include a second terminal that contacts the routing line, extends vertically beyond the routing line in the second direction and is spaced from the connection joint. The second terminal can be plated on the routing line and extend vertically beyond the encapsulant and the insulative base in the second direction.

The assembly can include a first solder ball on the first terminal and a second solder ball on the second terminal.

The assembly can include a heat sink that is mechanically attached to the chip, electrically isolated by the chip, overlapped by the chip and disposed vertically beyond the chip in the second direction. The heat sink can be disposed vertically beyond the insulative base in the second direction.

The assembly can include a ground plane that is mechanically attached to the routing line, electrically connected to the routing line, overlapped by the routing line and disposed vertically beyond the routing line in the second direction. The ground plane can be disposed vertically beyond the insulative base in the second direction.

The assembly can be devoid of wire bonds, TAB leads, solder and conductive adhesive.

In accordance with another aspect of the invention, a method of making a semiconductor chip assembly includes providing a metal base, forming a routing line on the metal base, etching the metal base, wherein an unetched portion of the metal base forms a pillar that includes first and second opposing surfaces, the first surface of the pillar faces away from the routing line and the second surface of the pillar contacts the routing line, then mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip, forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant, and forming a connection joint that electrically connects the routing line and the pad, wherein a conductive trace that includes the routing line and the pillar is electrically connected to the pad and extends through the first surface of the encapsulant.

The method can include forming the routing line by selectively depositing the routing line on the metal base.

The method can include forming the routing line by providing a plating mask on the metal base, wherein the plating mask includes an opening that exposes a portion of the metal base, and then electroplating the routing line on the exposed portion of the metal base through the opening in the plating mask.

The method can include providing the metal base with first and second opposing surfaces, then forming an etch mask on the first surface of the metal base and the routing line on the second surface of the metal base, and then etching the metal base such that an unetched portion of the metal base defined by the etch mask forms the pillar and the first surface of the pillar contacts the etch mask.

The method can include forming the etch mask and the routing line by simultaneously depositing the etch mask and the routing line on the metal base.

The method can include forming the etch mask and the routing line by providing a first plating mask on the metal base, wherein the first plating mask includes an opening that exposes a first portion of the metal base, providing a second plating mask on the metal base, wherein the second plating mask includes an opening that exposes a second portion of the metal base, and then simultaneously electroplating the etch mask on the first exposed portion of the metal base through the opening in the first plating mask and the routing line on the second exposed portion of the metal base through the opening in the second plating mask.

The method can include etching the metal base to form the pillar, thereby etching through the metal base, exposing the routing line, reducing contact area between the metal base and the routing line and electrically isolating the routing line from other routing lines formed on the metal base.

The method can include mechanically attaching the chip to the routing line and the pillar such that the first surface of the chip faces in the first direction and the second surface of the chip faces in the second direction, or alternatively, the first surface of the chip faces in the second direction and the second surface of the chip faces in the first direction.

The method can include mechanically attaching the chip to the routing line and the pillar such that routing line extends vertically beyond the chip and the pillar in the second direction.

The method can include mechanically attaching the chip to the routing line and the pillar such that the routing line extends within and outside the periphery of the chip, or alternatively, the routing line is disposed outside the periphery of the chip.

The method can include mechanically attaching the chip to the routing line and the pillar such that the first surface of the pillar extends vertically beyond the chip in the first direction and the second surface of the pillar extends vertically beyond the chip in the second direction.

The method can include forming the encapsulant by depositing the encapsulant on the pillar such that the encapsulant covers the pillar and then removing a portion of the encapsulant such that the first surface of the pillar is exposed, or alternatively, depositing the encapsulant on the pillar such that the first surface of the pillar is exposed.

The method can include removing a portion of the encapsulant to expose the first surface of the pillar, expose the second surface of the chip, laterally align the first surfaces of the encapsulant and the pillar, laterally align the first surface of the encapsulant and the second surface of the chip, laterally align the first surface of the pillar and the second surface of the chip, and/or laterally align the first surfaces of the encapsulant and the pillar and the second surface of the chip.

The method can include forming the connection joint by plating the connection joint on the routing line and the pad. For instance, the connection joint can be electroplated or electrolessly plated on the routing line and the pad. Alternatively, the method can include forming the connection joint by depositing a non-solidified material on the routing line and the pad and then hardening the non-solidified material. For instance, solder paste can be deposited on the routing line and the pad and then hardened by reflowing, or conductive adhesive can be deposited on the routing line and the pad and then hardened by curing. Alternatively, the method can include forming the connection joint by wire bonding. For instance, the wire bond can extend vertically beyond the chip and the routing line in the first direction when the first surface of the chip faces in the first direction, or alternatively, the wire bond can extend vertically beyond the chip, the routing line and the pillar in the second direction when the first surface of the chip faces in the second direction.

The method can include forming the connection joint before or after forming the encapsulant.

The method can include forming an insulative base that contacts the metal base and the routing line before forming the pillar, wherein the insulative base extends vertically beyond the chip, the routing line and the pillar in the second direction after mechanically attaching the chip to the routing line and the pillar.

The method can include mechanically attaching the metal base and the routing line to a support before forming the pillar, and removing the support after forming the encapsulant. For instance, the insulative base can contact and be sandwiched between the metal base and the support, and between the routing line and the support. Removing the support can include etching the support, or alternatively, peeling-off the support. The method can include removing the support before or after forming the connection joint, and before or after removing the portion of the encapsulant.

The method can include mechanically attaching the chip to the routing line and the pillar using an adhesive before forming the encapsulant.

The method can include forming a through-hole that extends through the insulative base and the adhesive and exposes the pad, and then forming the connection joint. For instance, the through-hole can extend through the insulative base and the adhesive and expose the routing line and the pad, and then the connection joint can contact and electrically connect the routing line and the pad in the through-hole. Alternatively, a first through-hole can extend through the insulative base and be spaced from the adhesive and expose the routing line, a second through-hole can extend through the insulative base and the adhesive and expose the pad, and then the connection joint can be electrically connected to the routing line in the first through-hole and the pad in the second through-hole.

The method can include simultaneously forming the connection joint and a first terminal that contacts the first surface of the pillar, extends vertically beyond the pillar in the first direction and is spaced from the connection joint during a plating operation.

The method can include simultaneously forming the connection joint and a second terminal that contacts the routing line, extends vertically beyond the routing line in the second direction and is spaced from the connection joint during a plating operation.

The method can include simultaneously forming the connection joint, a first terminal that contacts the first surface of the pillar, extends vertically beyond the pillar in the first direction and is spaced from the connection joint, and a second terminal that contacts the routing line, extends vertically beyond the routing line in the second direction and is spaced from the connection joint and the first terminal during a plating operation.

The method can include including forming a first solder ball on the first terminal and a second solder ball on the second terminal.

The method can include mechanically attaching a heat sink to the chip, the routing line, the pillar, the encapsulant and the connection joint, wherein the heat sink is electrically isolated from the chip, overlapped by the chip and disposed vertically beyond the chip in the second direction.

The method can include mechanically attaching a ground plane to the chip, the routing line, the pillar, the encapsulant and the connection joint, and then electrically connecting the ground plane to the routing line, wherein the ground plane is overlapped by the routing line and disposed vertically beyond the routing line in the second direction.

An advantage of the present invention is that the semiconductor chip assembly can be manufactured conveniently and cost effectively. Another advantage is that the insulative base and the support can be provided before the metal base is etched, thereby enhancing the mechanical support and protection for the routing line after the pillar is formed. Another advantage is that the pillar can be formed using etching (i.e., subtractively) rather than by electroplating or electroless plating (i.e., additively) which improves uniformity and reduces manufacturing time and cost. Another advantage is that the assembly can include a connection joint made from a wide variety of materials and processes, thereby making advantageous use of mature connection joint technologies in a unique and improved manufacturing approach. Another advantage is that the assembly need not include wire bonds, TAB leads, solder or conductive adhesive, although the process is flexible enough to accommodate these techniques if desired. Another advantage is that the pillar can extend across a thickness of the chip and the first and second terminals can protrude from the encapsulant and the insulative base, respectively, thereby facilitating a three-dimensional stacked arrangement. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be is understood when read in conjunction with the following drawings, in which:

FIGS. 1A–19A are cross-sectional views showing a method of making a semiconductor chip assembly in accordance with a first embodiment of the present invention;

FIGS. 1B–19B are top plan views corresponding to FIGS. 1A–19A, respectively;

FIGS. 1C–19C are bottom plan views corresponding to FIGS. 1A–19A, respectively;

DETAILED DESCRIPTION OF THE PREFERRED EMBODIMENTS

FIGS. 1A–19A, 1B–19B and 1C–19C are cross-sectional, top and bottom views, respectively, of a method of making a semiconductor chip assembly in accordance with a first embodiment of the present invention.

Figure 1A:
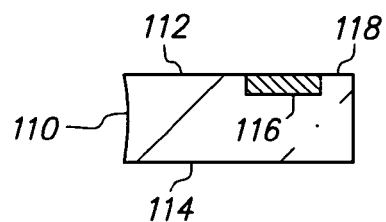
Figure 1B:
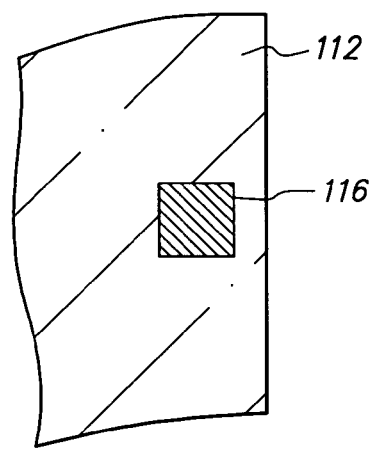
Figure 1C:
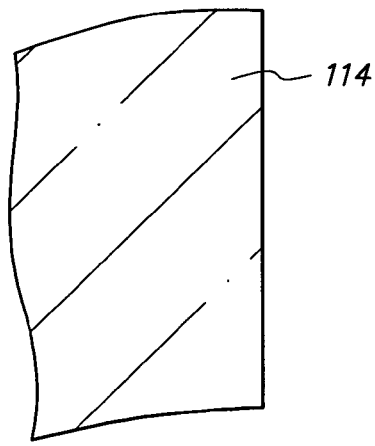

FIGS. 1A, 1B and 1C are cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, a connection joint is formed with electrolessly plated nickel. Therefore, pad 116 is treated to provide a surface layer that will accommodate this connection joint. Pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 is treated by forming a nickel surface layer on the aluminum base. For instance, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

Figure 2A:
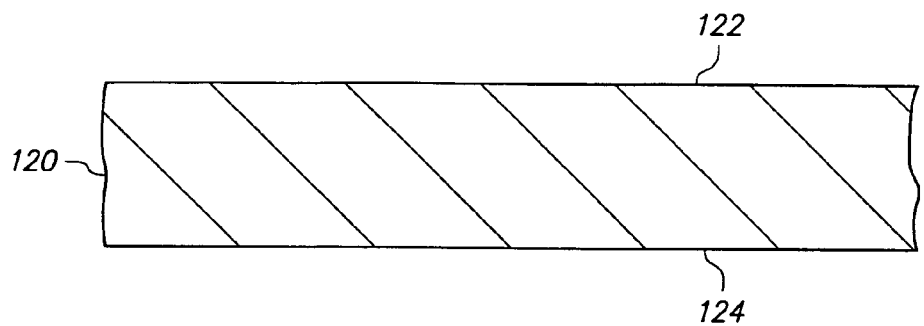
Figure 2B:
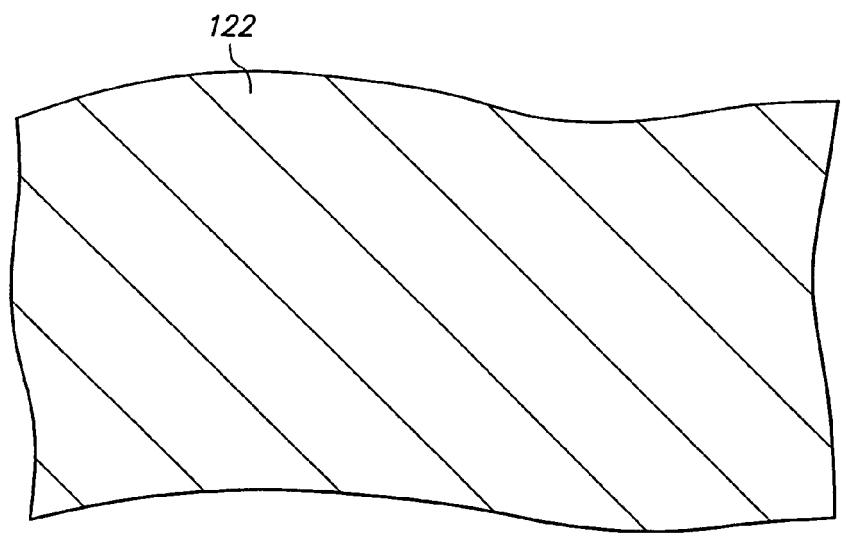
Figure 2C:
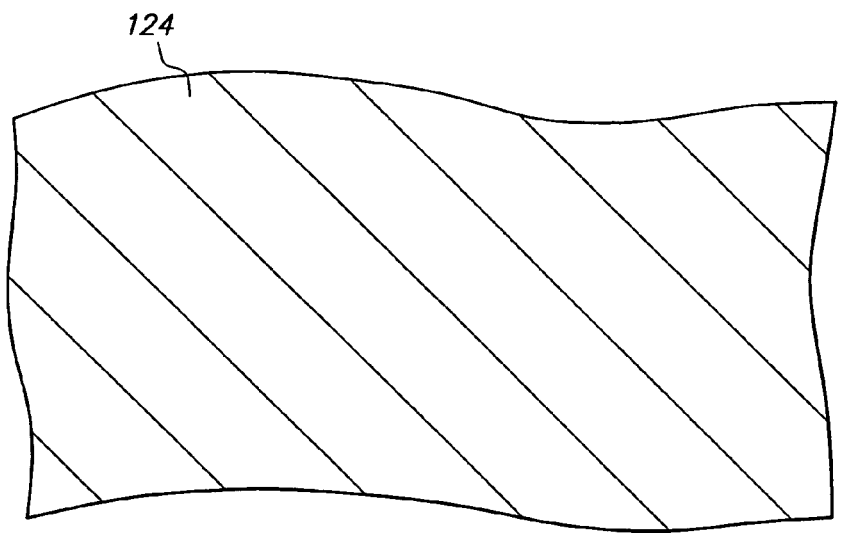

FIGS. 2A, 2B and 2C are cross-sectional, top and bottom views, respectively, of metal base 120 which includes opposing major surfaces 122 and 124. Metal base 120 is a copper plate with a thickness of 250 microns.

Figure 3A:
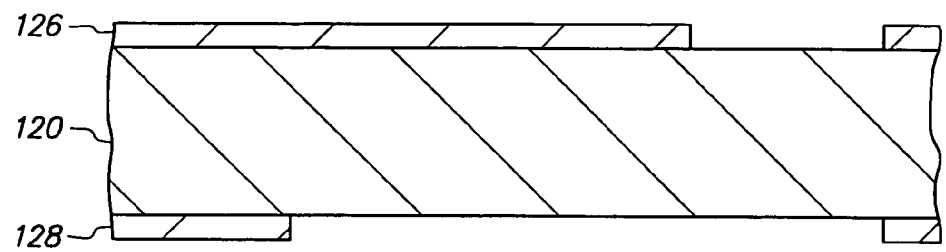
Figure 3B:
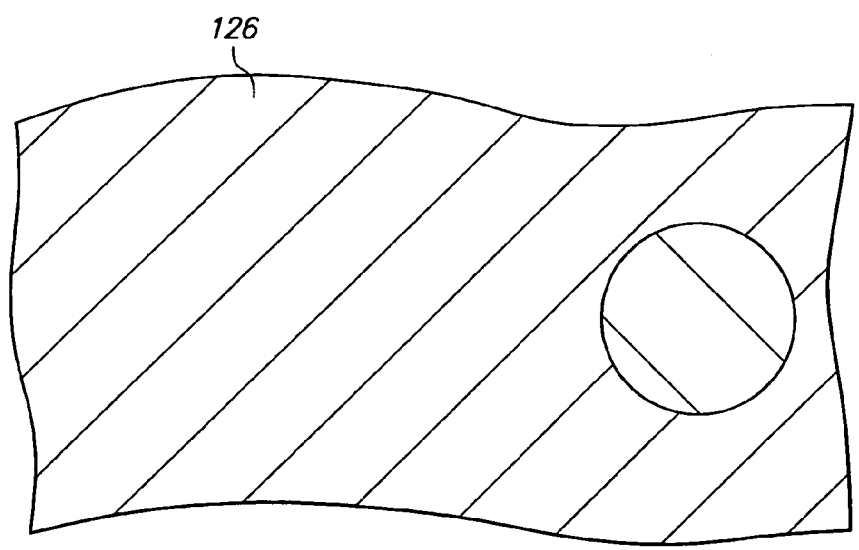
Figure 3C:
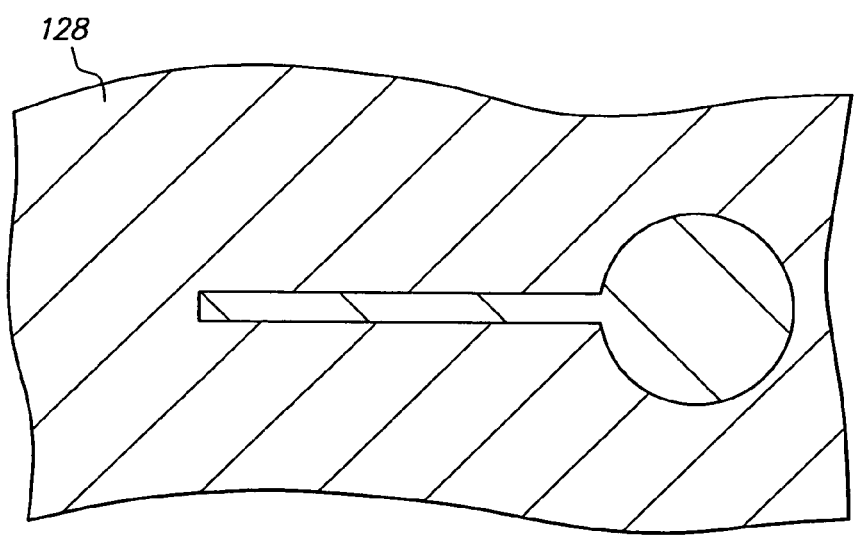

FIGS. 3A, 3B and 3C are cross-sectional, top and bottom views, respectively, of photoresist layers 126 and 128 formed on metal base 120. Photoresist layers 126 and 128 are deposited using a dry film lamination process in which hot rolls simultaneously press photoresist layers 126 and 128 onto surfaces 122 and 124, respectively. Reticles (not shown) are positioned proximate to photoresist layers 126 and 128. Thereafter, photoresist layers 126 and 128 are simultaneously patterned by selectively applying light through the reticles, applying a developer solution to remove the photoresist portions rendered soluble by the light, and then hard baking, as is conventional. As a result, photoresist layer 126 contains an opening that selectively exposes surface 122 of metal base 120, and photoresist layer 128 contains an opening that selectively exposes surface 124 of metal base 120. Photoresist layers 126 and 128 each have a thickness of 25 microns.

Figure 4A:
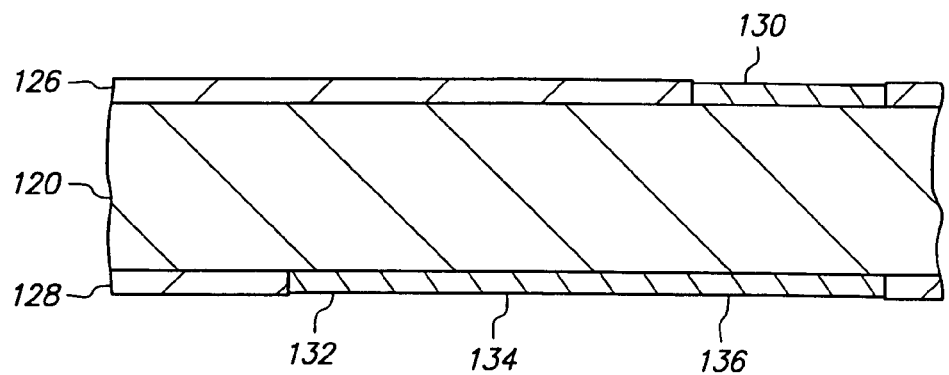
Figure 4B:
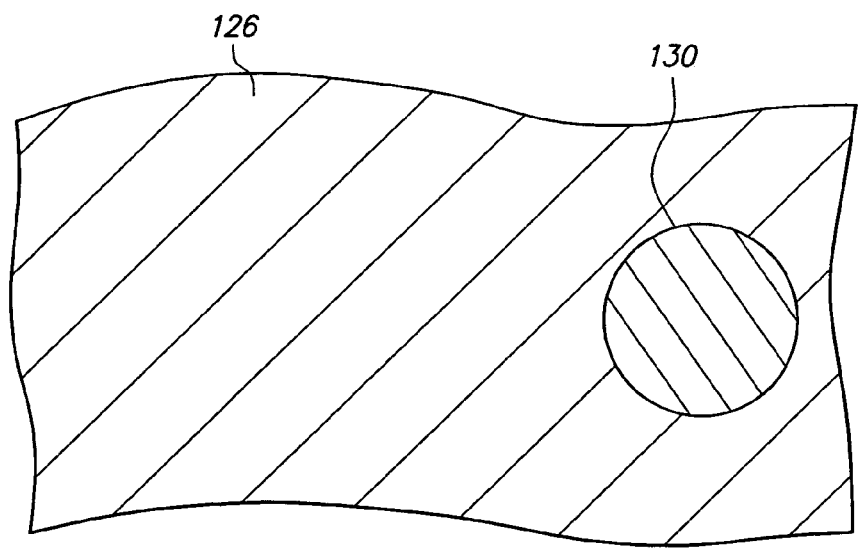
Figure 4C:
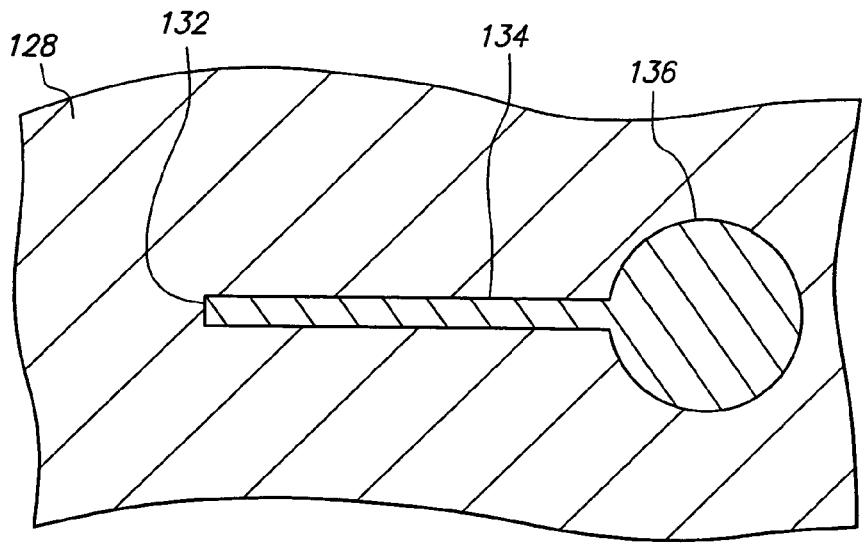

FIGS. 4A, 4B and 4C are cross-sectional, top and bottom views, respectively, of etch mask 130 and routing line 132 formed on metal base 120.

Etch mask 130 and routing line 132 are electroplated on the exposed portions of surfaces 122 and 124, respectively. Etch mask 130 is composed of a nickel layer electroplated on metal base 120 and a copper layer electroplated on the nickel layer, and routing line 132 is composed of a nickel layer electroplated on metal base 120 and a copper layer electroplated on the nickel layer. The nickel layers contact and are sandwiched between metal base 120 and the copper layers, and the copper layers are spaced and separated from metal base 120 and exposed. For convenience of illustration, the nickel and copper layers are shown as a single layer.

Etch mask 130 and routing line 132 are simultaneously formed by an electroplating operation using photoresist layers 126 and 128 as plating masks. Thus, etch mask 130 and routing line 132 are formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the nickel layers electroplate (deposit or grow) on the exposed portions of surfaces 122 and 124, respectively. The nickel electroplating operation continues until the nickel layers have the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layers on the nickel layers. The copper electroplating operation continues until the copper layers have the desired thickness. Thereafter, the structure is removed from the electrolytic copper plating solution and rinsed in distilled water to remove contaminants.

Etch mask 130 and routing line 132 each have a thickness of 23 microns, the nickel layers each have a thickness of 3 microns, and the copper layers each have a thickness of 20 microns. Etch mask 130 has a circular shape with a diameter of 500 microns. Routing line 132 is a flat planar lead that includes elongated region 134 with a width (orthogonal to its elongated length) of 50 microns and enlarged circular region 136 with a diameter of 500 microns. Furthermore, etch mask 130 and enlarged circular region 136 are vertically aligned with one another.

Figure 5A:
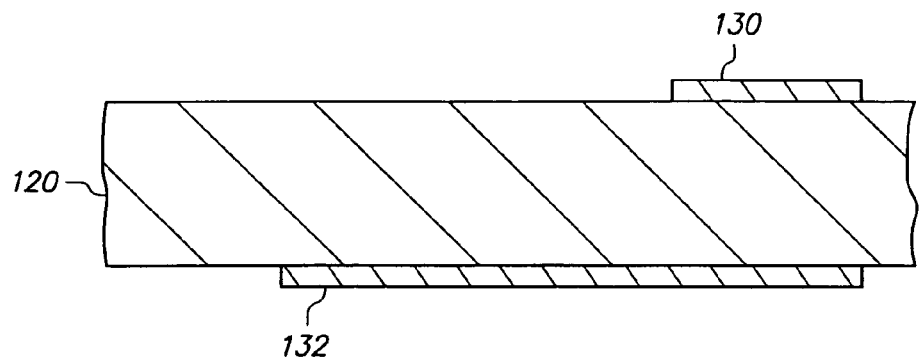
Figure 5B:
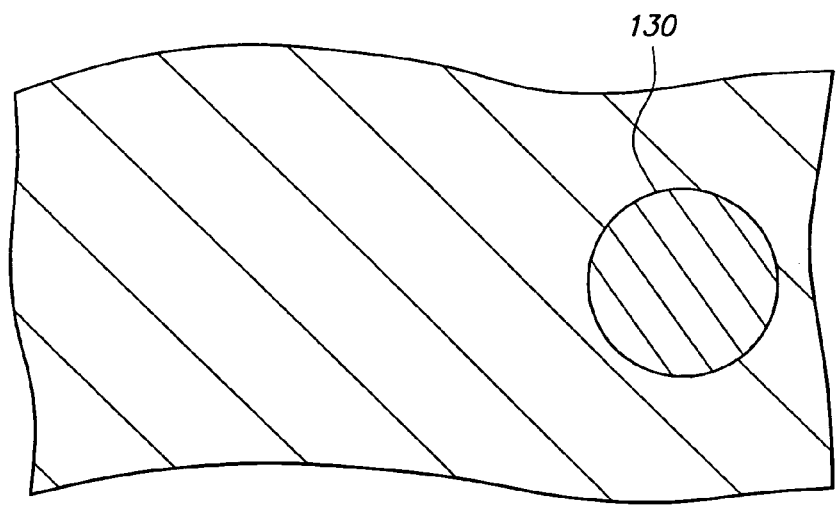
Figure 5C:
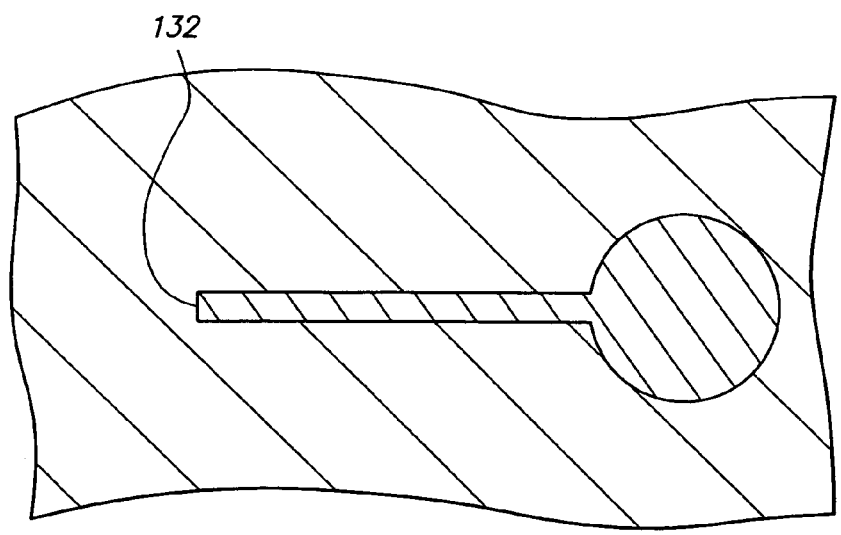

FIGS. 5A, 5B and 5C are cross-sectional, top and bottom views, respectively, of metal base 120, etch mask 130 and routing line 132 after photoresist layers 126 and 128 are stripped. Photoresist layers 126 and 128 are removed using a solvent, such as a mild alkaline solution with a pH of 9, that is highly selective of photoresist with respect to copper and nickel. Therefore, no appreciable amount of metal base 120, etch mask 130 or routing line 132 is removed.

Figure 6A:
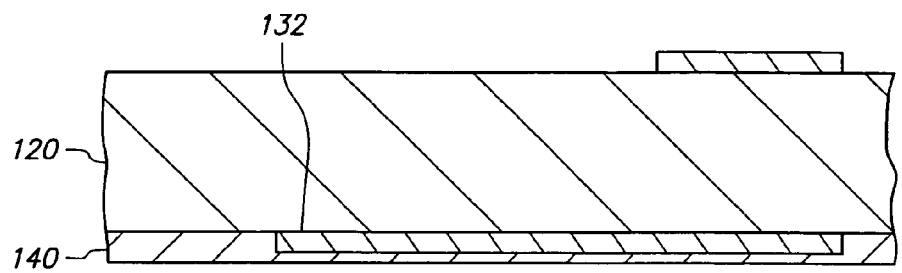
Figure 6B:
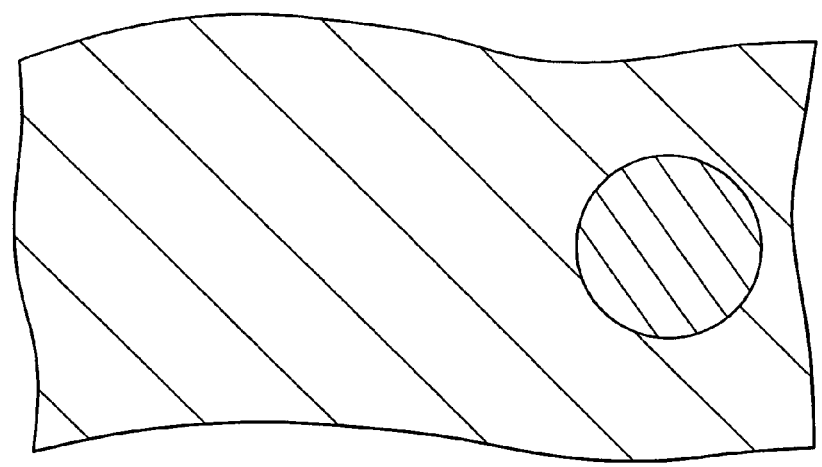
Figure 6C:
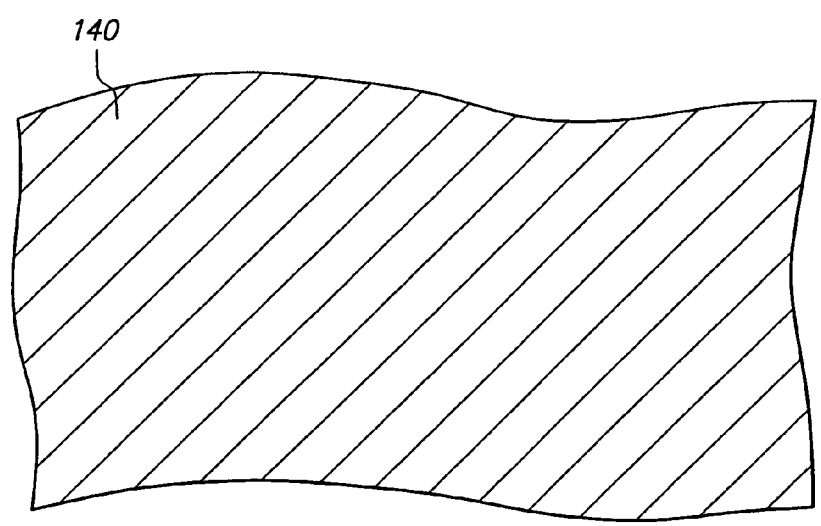

FIGS. 6A, 6B and 6C are cross-sectional, top and bottom views, respectively, of insulative base 140 formed on metal base 120 and routing line 132.

Insulative base 140 may include an organic surface protectant such as HK 2000 which is promptly applied to the structure after routing line 132 is formed to reduce native oxide formation on the exposed copper surfaces. The use of organic surface protectant layers in insulative bases for semiconductor chip assemblies is well-known in the art.

Thereafter, a liquid resin (A stage) such as polyamic acid is applied over metal base 120 and routing line 132 using stencil printing. During stencil printing, a stencil (not shown) is placed over metal base 120, a stencil opening is aligned with metal base 120, and then a squeegee (not shown) pushes the liquid resin along the surface of the stencil opposite metal base 120, through the stencil opening and onto metal base 120 and routing line 132. The liquid resin is compliant enough at room temperature to conform to virtually any shape. Therefore, the liquid resin flows over routing line 132 and covers metal base 120 and routing line 132.

Thereafter, the structure is placed in an oven and insulative base 140 is heated to a relatively low temperature such as 100° C. As a result, insulative base 140 is partially polymerized (B stage) and forms a gel but is not fully cured.

For convenience of illustration, insulative base 140 is shown below metal base 120 to retain a single orientation throughout the figures for ease of comparison between the figures, although in this step metal base 120 would be inverted so that gravitational force would assist the liquid resin flow.

Figure 7A:
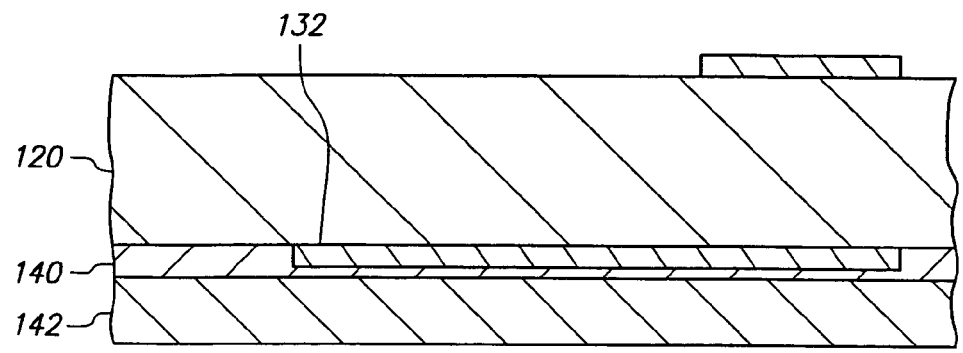
Figure 7B:
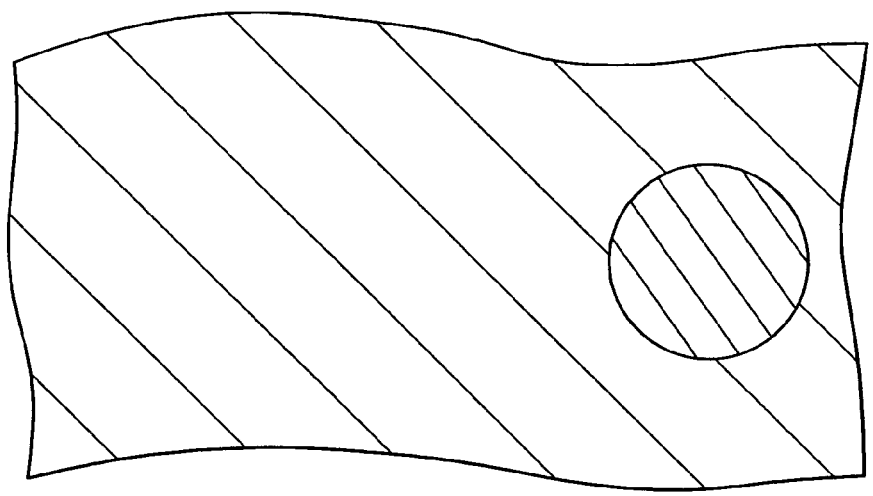
Figure 7C:
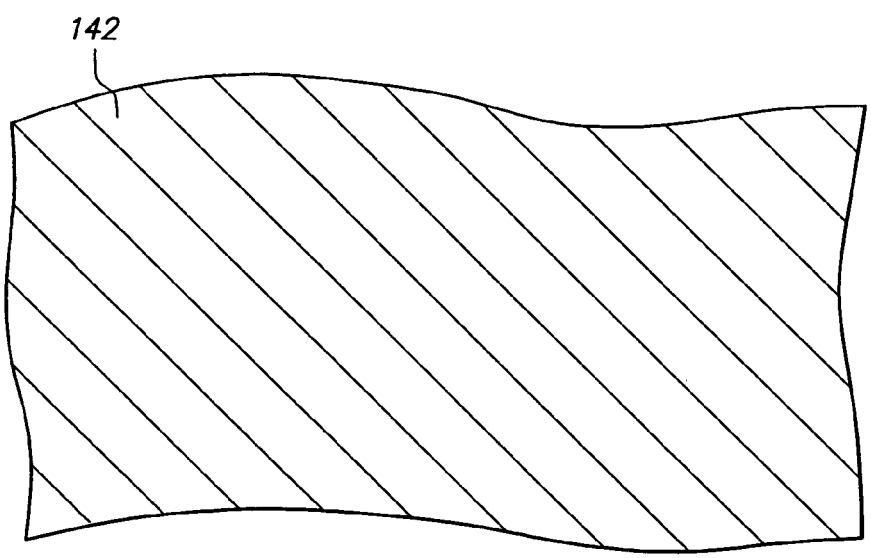

FIGS. 7A, 7B and 7C are cross-sectional, top and bottom views, respectively, of support 142 mechanically attached to metal base 120 and routing line 132 by insulative base 140.

Insulative base 140 extends between and contacts metal base 120 and support 142, and likewise, insulative base 140 extends between and contacts routing line 132 and support 142. Metal base 120 and support 142 do not contact one another, and routing line 132 and support 142 do not contact one another.

Support 142 is a copper plate with a thickness of 150 microns. Metal base 120 and support 142 have identical lateral shapes and sizes. That is, metal base 120 and support 142 are identical to one another except that metal base 120 is thicker than support 142 by 100 microns (250–150).

The structure is placed on support 142, and insulative base 140 contacts support 142 and is sandwiched between metal base 120 and support 142 and between routing line 132 and support 142 while insulative base 140 is a gel. As a result, insulative base 140 provides a loose mechanical bond between metal base 120 and support 142, and between routing line 132 and support 142.

Metal base 120 and support 142 are positioned relative to one another so that they are vertically aligned with one another. Metal base 120 and support 142 can be aligned using an automated pattern recognition system.

Thereafter, the structure is placed in an oven and insulative base 140 is fully cured (C stage) at relatively low temperature in the range of 200 to 250° C. to form a solid adhesive insulative thermosetting polyimide layer that mechanically attaches metal base 120 and routing line 132 to support 142. Insulative base 140 is 30 microns thick between metal base 120 and support 142 and 7 microns thick between routing line 132 and support 142.

At this stage, routing line 132 is covered from above by metal base 120 and covered from below by insulative base 140, insulative base 140 is covered from above by metal base 120 and covered from below by support 142, and support 142 is separated from metal base 120 and routing line 132 by the thickness of insulative base 140.

Figure 8A:
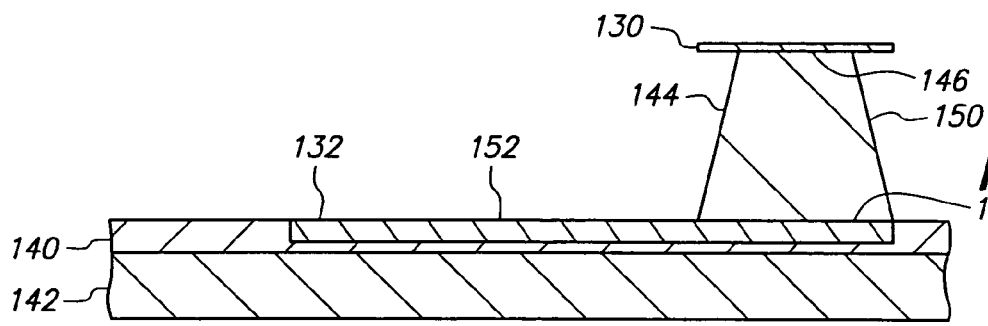
Figure 8B:
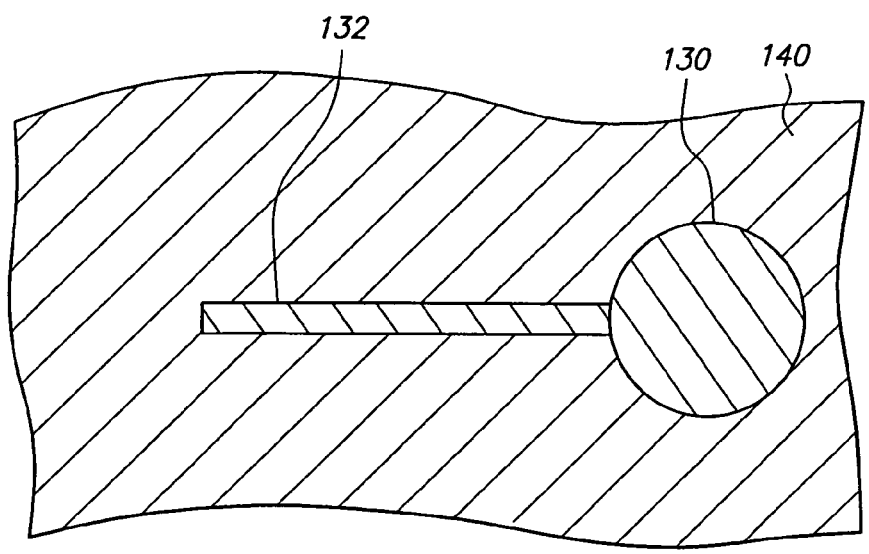
Figure 8C:
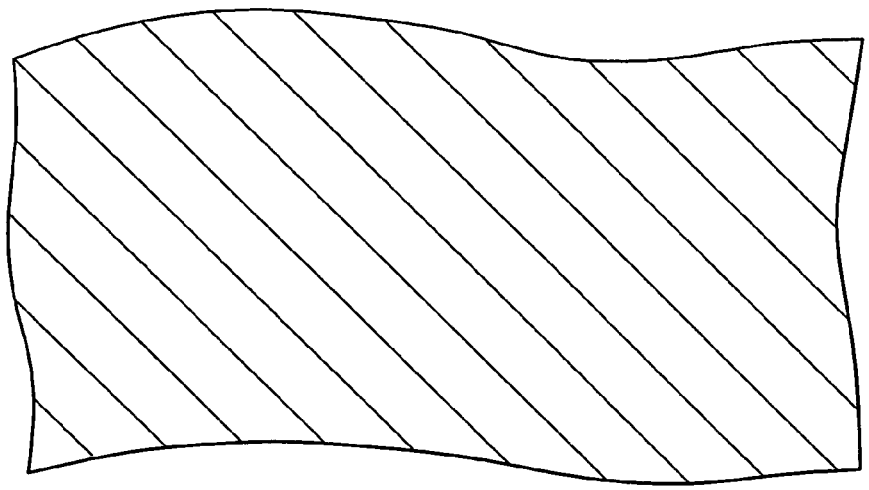

FIGS. 8A, 8B and 8C are cross-sectional, top and bottom views, respectively, of pillar 144 formed from metal base 120.

Pillar 144 is formed by applying a wet chemical etch to metal base 120 using etch mask 130 to selectively protect metal base 120. Thus, pillar 144 is an unetched portion of metal base 120 defined by etch mask 130 that is formed subtractively.

A "front-side" wet chemical etch is applied to surface 122 of metal base 120 and etch mask 130. For instance, the wet chemical etch can be sprayed on surface 122 and etch mask 130, or a protective mask can be deposited on support 142 and then the structure can be dipped in the wet chemical etch. The wet chemical etch is highly selective of copper with respect to nickel and polyimide, and therefore, highly selective of metal base 120 and the copper layer of etch mask 130 with respect to the nickel layer of etch mask 130, the nickel layer of routing line 132 and insulative base 140.

The wet chemical etch etches completely through metal base 120, thereby effecting a pattern transfer of etch mask 130 onto metal base 120, exposing routing line 132 and insulative base 140, reducing but not eliminating contact area between metal base 120 and routing line 132, and reducing and eliminating contact area between metal base 120 and insulative base 140. The wet chemical etch also removes the copper layer of etch mask 130 (that extends upwardly beyond the nickel layer of etch mask 130), and etch mask 130 becomes much thinner. However, no appreciable amount of the nickel layer of etch mask 130, the nickel layer of routing line 132 or insulative base 140 is removed. Furthermore, the nickel layer of routing line 132 protects the underlying copper layer of routing line 132 from the etch, and insulative base 140 protects support 142 from the etch. Therefore, no appreciable amount of routing line 132 or support 142 is removed.

The wet chemical etch laterally undercuts metal base 120 beneath etch mask 130, causing pillar 144 to taper inwardly with increasing height. A suitable taper is between 45 and slightly less than 90 degrees, such as approximately 75 degrees.

A suitable wet chemical etch can be provided by a solution containing alkaline ammonia. The optimal etch time for exposing metal base 120 to the wet chemical etch in order to etch through metal base 120 without excessively exposing the nickel layers to the wet chemical etch can be established through trial and error.

Support 142 provides mechanical support for routing line 132 and pillar 144 and reduces mechanical strain on insulative base 140. Support 142 protects routing line 132 and pillar 144 from mechanical damage by the wet chemical etch and subsequent cleaning steps (such as rinsing in distilled water and air blowing). For instance, support 142 absorbs physical force of the wet chemical etch and cleaning steps that might otherwise separate routing line 132 from pillar 144. Thus, support 142 improves structural integrity and allows the wet chemical etch and subsequent cleaning steps to be applied more vigorously, thereby improving manufacturing throughput.

Pillar 144 includes opposing surfaces 146 and 148 and tapered sidewalls 150 therebetween. Surface 146 of pillar 144 constitutes an unetched portion of surface 122 of metal base 120, and surface 148 of pillar 144 constitutes an unetched portion of surface 124 of metal base 120. Surface 146 contacts and faces towards etch mask 130 and is spaced from and faces away from routing line 132, and surface 148 contacts and faces towards routing line 132 and is spaced from and faces away from etch mask 130. Surfaces 146 and 148 are flat and parallel to one another. Tapered sidewalls 150 are adjacent to surfaces 146 and 148 and slant inwardly towards surface 146.

Pillar 144 has a conical shape with a height (between surfaces 146 and 148) of 250 microns and a diameter that decreases as the height increases (towards surface 146 and away from surface 148). Surface 146 has a circular shape with a diameter of 300 microns, and surface 148 has a circular shape with a diameter of 500 microns. Thus, surface 146 has a surface area of 70,650 square microns ($\pi(300/2)^2$), and surface 148 has a surface area of 196,250 square microns ($\pi(500/2)^2$). Accordingly, the surface area of surface 146 is 36 percent as large as the surface area of surface 148. In other words, the surface area of surface 146 is 64 percent smaller than the surface area of surface 148 ((196,250−70,650)/196,250).

Surfaces 146 and 148 are vertically aligned with etch mask 130, with enlarged circular region 136, and with one another. Thus, surface 146 is concentrically disposed within the surface areas of etch mask 130, enlarged circular region 136 and surface 148, and the periphery of surface 146 is laterally offset from the peripheries of etch mask 130, enlarged circular region 136 and surface 148 by 100 microns ((500−300)/2).

Conductive trace 152 includes routing line 132 and pillar 144. Conductive trace 152 is adapted for providing horizontal and vertical routing between pad 116 and a next level assembly.

At this stage, pillar 144 contacts and is sandwiched between etch mask 130 and routing line 132, routing line 132 and insulative base 140 are exposed, insulative base 140 continues to cover support 142, and support 142 provides mechanical support for insulative base 140 and conductive trace 152 that is particularly useful after most of metal base 120 is removed by the etch.

Figure 9A:
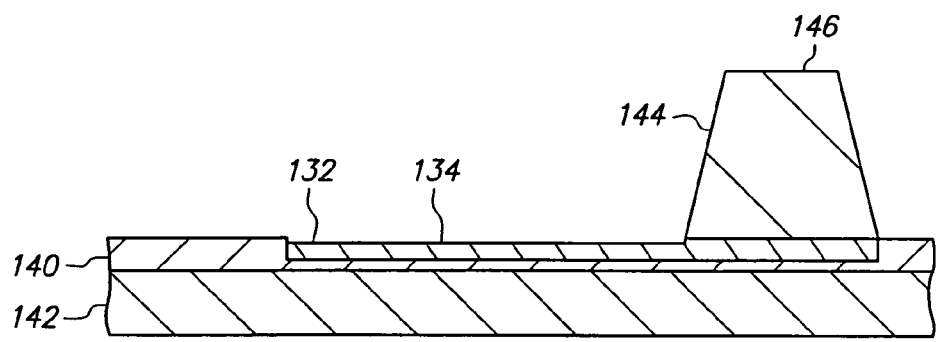
Figure 9B:
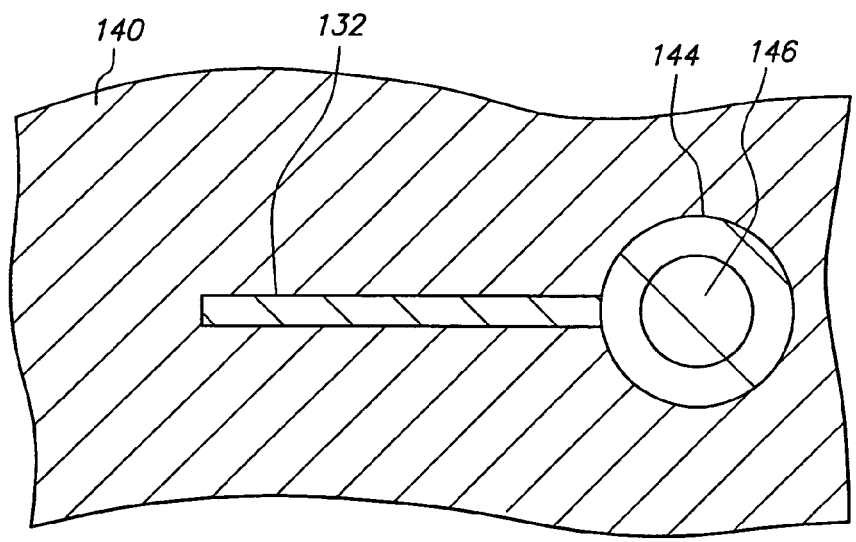
Figure 9C:
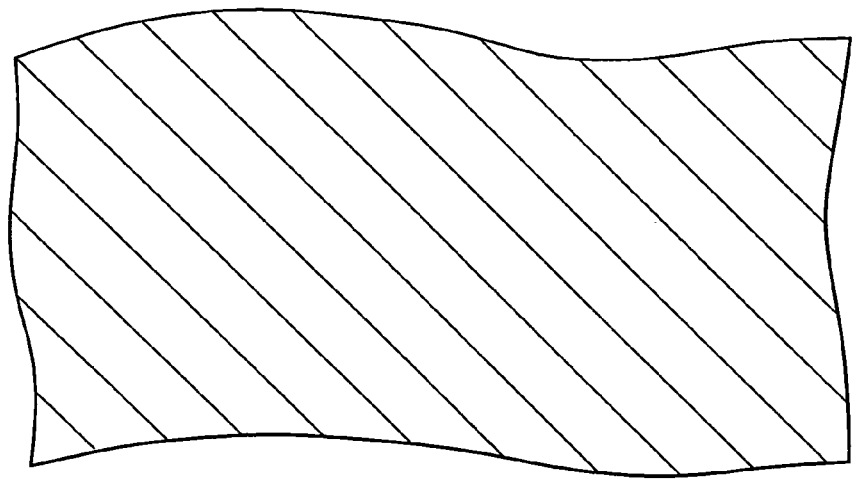

FIGS. 9A, 9B and 9C are cross-sectional, top and bottom views, respectively, of the structure after etch mask 130 is removed.

Etch mask 130, which at this stage consists of a nickel layer, is removed by wet chemical etching using a nickel etching solution, such as a dilute mixture of nitric and hydrochloric acid, that is highly selective of nickel with respect to polyimide. The wet chemical etch also removes the exposed portion of the nickel layer of routing line 132 (that extends upwardly beyond the copper layer of routing line 132 and laterally from pillar 144), and elongated region 134 of routing line 132 becomes slightly thinner. However, no appreciable amount of insulative base 140 is removed.

Since etch mask 130 is extremely thin relative to pillar 144, and the structure is removed from the nickel etching solution soon after etch mask 130 is stripped, it is not critical that the nickel etching solution be highly selective of nickel with respect to copper. In fact, the nickel etching solution is also selective of copper. As a result, the nickel etching solution also removes a slight amount of the exposed copper surfaces. However, the nickel etching solution is not applied long enough to appreciably affect the copper features.

The nickel etching solution has no significant impact on routing line 132 or pillar 144. In addition, insulative base 140 protects support 142 from the nickel etching solution. The optimal etch time for exposing etch mask 130 to the wet chemical etch in order to remove etch mask 130 without significantly impacting routing line 132 or pillar 144 can be established through trial and error.

The nickel etching solution converts routing line 132 from a flat, planar lead to an essentially flat, planar lead due to the slight recess previously occupied by a portion of the nickel layer that extended laterally from pillar 144. In addition, the nickel etching solution exposes surface 146 of pillar 144.

Figure 10A:
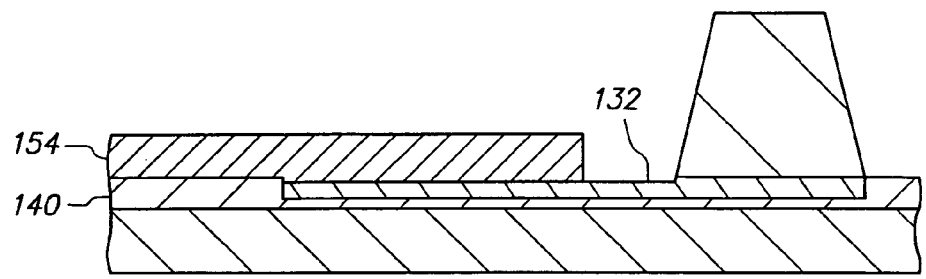
Figure 10B:
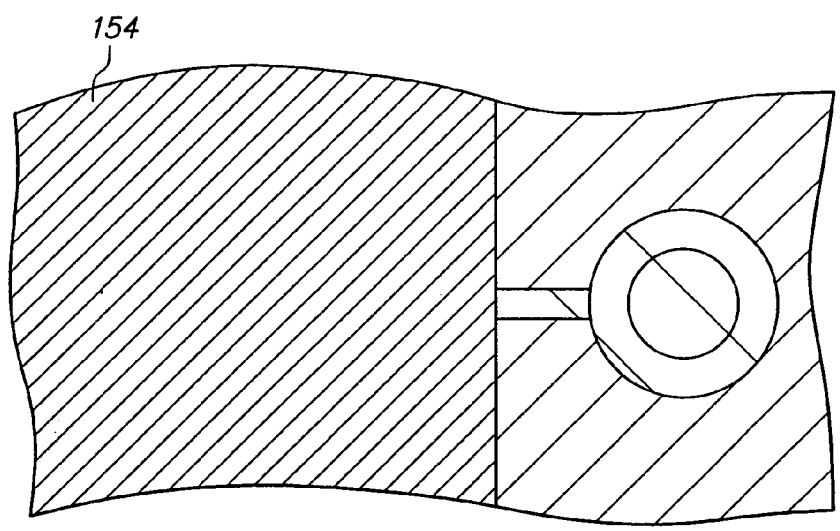
Figure 10C:
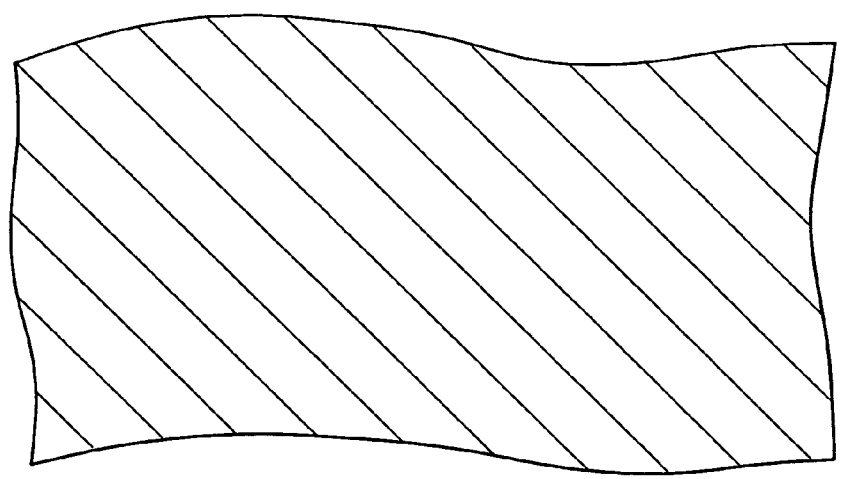

FIGS. 10A, 10B and 10C are cross-sectional, top and bottom views, respectively, of adhesive 154 formed on routing line 132 and insulative base 140.

Adhesive 154 may include an organic surface protectant such as HK 2000 which is promptly applied to the structure after etch mask 130 is removed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is dispensed over selected portions of routing line 132 and insulative base 140. The liquid resin is compliant enough at room temperature to conform to virtually any shape. Therefore, the liquid resin enters the recess in routing line 132.

Figure 11A:
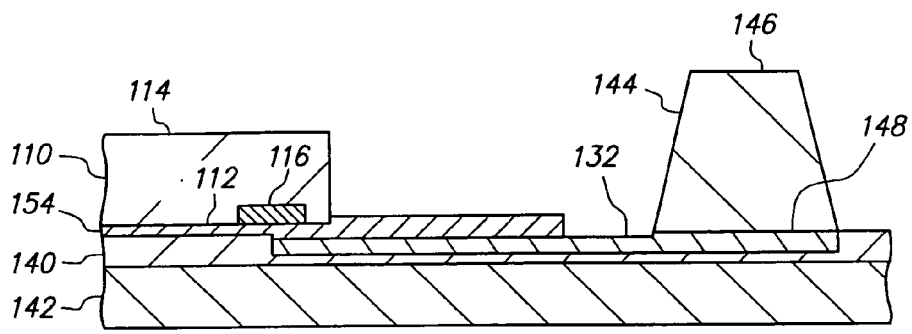
Figure 11B:
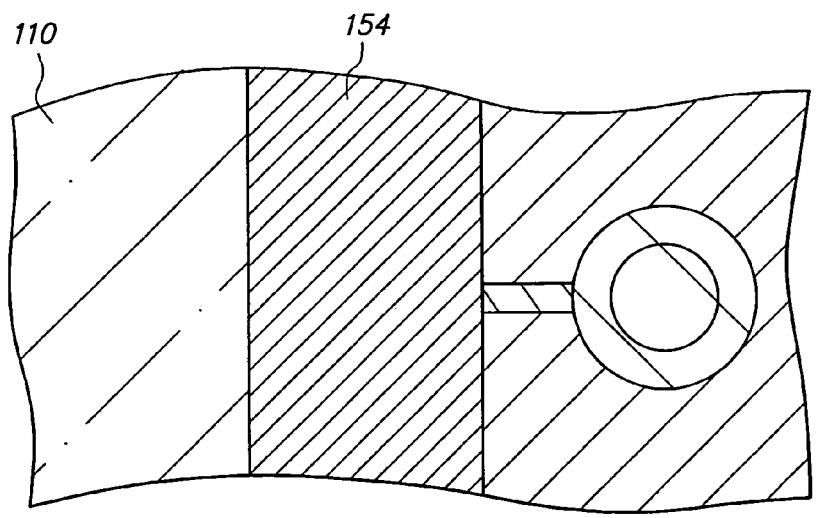
Figure 11C:
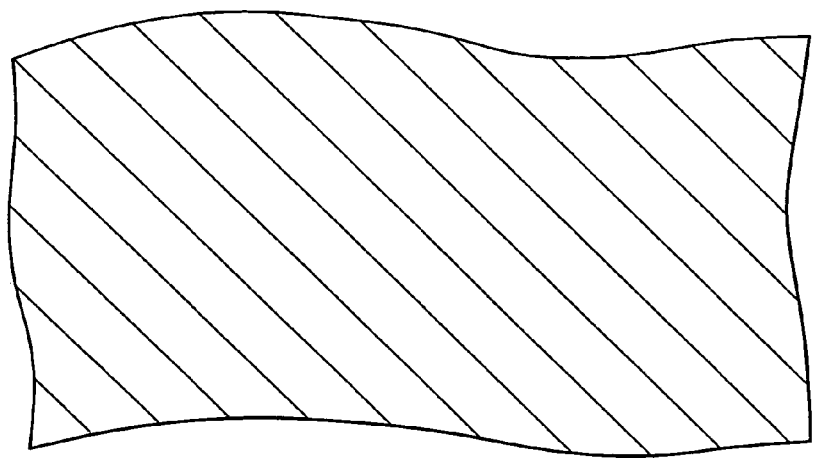

FIGS. 11A, 11B and 11C are cross-sectional, top and bottom views, respectively, of chip 110 mechanically attached to routing line 132, insulative base 140, support 142 and pillar 144 by adhesive 154.

Adhesive 154 extends between and contacts chip 110 and routing line 132, and likewise, adhesive 154 extends between and contacts chip 110 and insulative base 140. Surface 112 of chip 110 faces towards routing line 132 and insulative base 140 and is covered by adhesive 154, and surface 114 of chip 110 faces away from routing line 132 and insulative base 140 and is exposed. Chip 110 and routing line 132 do not contact one another, and chip 110 and insulative base 140 do not contact one another.

Adhesive 154 is sandwiched between chip 110 and routing line 132 and between chip 110 and insulative base 140 using relatively low pressure from a pick-up head that places chip 110 on adhesive 154, holds chip 110 against adhesive 154 for 5 seconds and then releases chip 110. The pick-up head is heated to a relatively low temperature such as 150° C., and adhesive 154 receives heat from the pick-up head transferred through chip 110. As a result, adhesive 154 proximate to chip 110 is partially polymerized (B stage) and forms a gel but is not fully cured, and adhesive 154 that is partially polymerized provides a loose mechanical bond between chip 110 and routing line 132 and between chip 110 and insulative base 140.

Chip 110 and support 142 are positioned relative to one another so that chip 110 is disposed within the periphery of adhesive 154, pad 116 is disposed above and overlaps and is electrically isolated from routing line 132, and adhesive 154 contacts and is sandwiched between pad 116 and routing line 132. Chip 110 and support 142 can be aligned using an automated pattern recognition system.

Thereafter, the structure is placed in an oven and adhesive 154 is fully cured (C stage) at relatively low temperature in the range of 200 to 250° C. to form a solid adhesive insulative thermosetting polyimide layer that mechanically attaches chip 110 to routing line 132 and insulative base 140. Adhesive 154 is 5 microns thick between pad 116 and routing line 132.

At this stage, routing line 132 extends within and outside the periphery of chip 110, extends laterally from pillar 144 towards chip 110 and extends downwardly beyond chip 110 and pillar 144, pillar 144 is disposed outside the periphery of chip 110, extends across the thickness of chip 110 (between surfaces 112 and 114), extends upwardly beyond chip 110 and extends downwardly beyond chip 110, adhesive 154 extends downwardly beyond chip 110, insulative base 140 extends downwardly beyond chip 110, routing line 132, pillar 144 and adhesive 154, and support 142 extends downwardly beyond insulative base 140. In addition, surface 114 of chip 110 and surface 146 of pillar 144 face upwardly, and surface 112 of chip 110 and surface 148 of pillar 144 face downwardly.

Figure 11D:
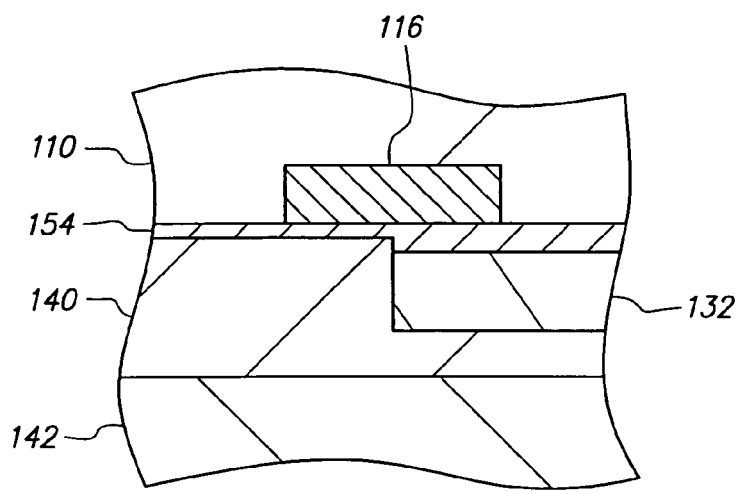
FIGS. 11D, 11E and 11F are enlarged cross-sectional, bottom and cross-sectional views, respectively, of the routing line and the pad in FIG. 11A.
Figure 11E:
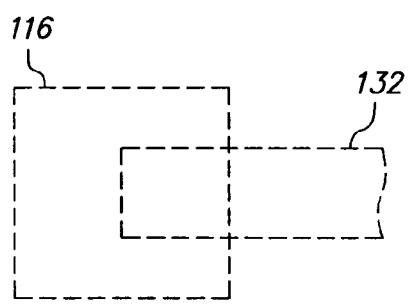
Figure 11F:
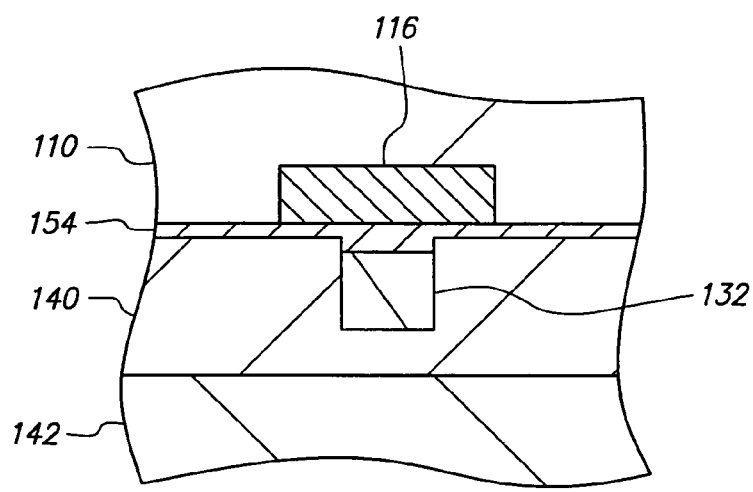

FIGS. 11D, 11E and 11F are enlarged cross-sectional, bottom and cross-sectional views, respectively, of pad 116 and routing line 132. FIG. 11F is oriented orthogonally with respect to FIG. 11D. As is seen, routing line 132 is proximate to pad 116 and a distal end of routing line 132 is within the periphery of pad 116. Routing line 132 extends across the center and one peripheral edge of pad 116 (but not the other three peripheral edges of pad 116), and peripheral sidewalls of routing line 132 extend within the periphery of pad 116. Since pad 116 and routing line 132 are not visible from the bottom view due to insulative base 140, they are shown in phantom in FIG. 11E.

Figure 12A:
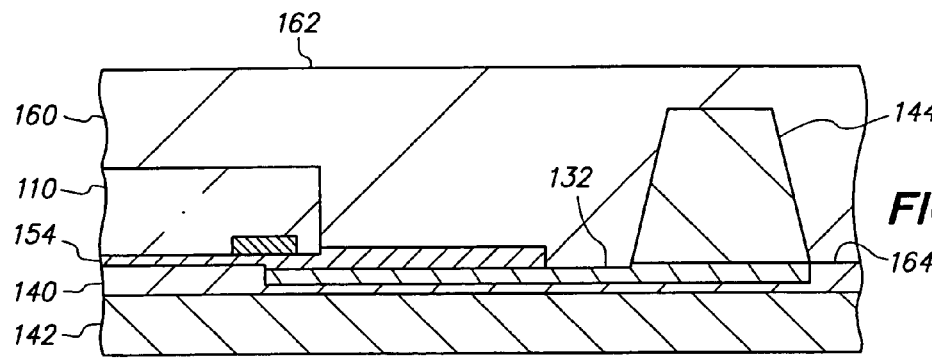
Figure 12B:
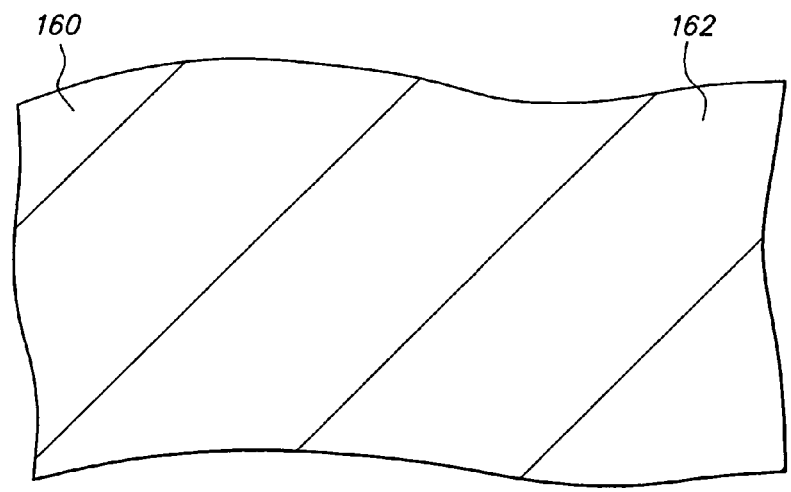
Figure 12C:
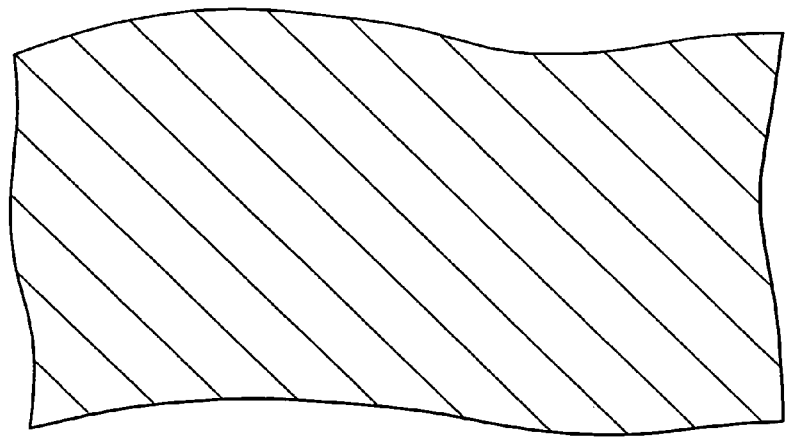

FIGS. 12A, 12B and 12C are cross-sectional, top and bottom views, respectively, of encapsulant 160 formed on chip 110, routing line 132, insulative base 140, pillar 144 and adhesive 154.

Encapsulant 160 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with support 142. However, the upper mold section is spaced from pillar 144 by 100 microns. As a result, the molding compound contacts the exposed portions of the chip 110, routing line 132, insulative base 140, pillar 144 and adhesive 154 in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 160 contacts chip 110, routing line 132, insulative base 140, pillar 144 and adhesive 154, is spaced from support 142, and covers chip 110, routing line 132, insulative base 140, support 142, pillar 144 and adhesive 154. More particularly, is encapsulant 160 contacts surface 114 and the outer edges of chip 110, surface 146 and tapered sidewalls 150 of pillar 144, and the exposed upwardly facing surface portions of routing line 132, insulative base 140 and adhesive 154. However, encapsulant 160 is spaced from surface 112 of chip 110 (due to adhesive 154) and support 142 (due to insulative base 140).

Encapsulant 160 is a solid adherent compressible protective layer that provides environmental protection such as moisture resistance and particle protection for chip 110 as well as mechanical support for conductive trace 152 outside the periphery of chip 110. Chip 110 and pillar 144 are embedded in encapsulant 160.

Encapsulant 160 includes opposing surfaces 162 and 164. Surface 162 faces upwardly, and surface 164 faces downwardly. Encapsulant 160 extends upwardly beyond chip 110, routing line 132, insulative base 140, support 142, pillar 144 and adhesive 154, and is 100 microns thick beyond surface 146 of pillar 144.

Figure 13A:
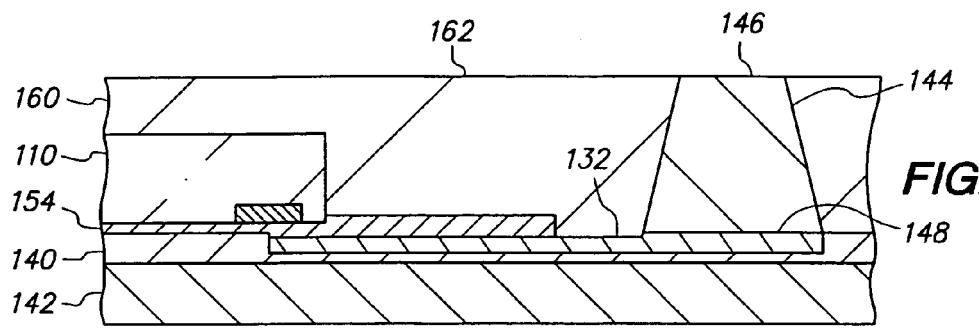
Figure 13B:
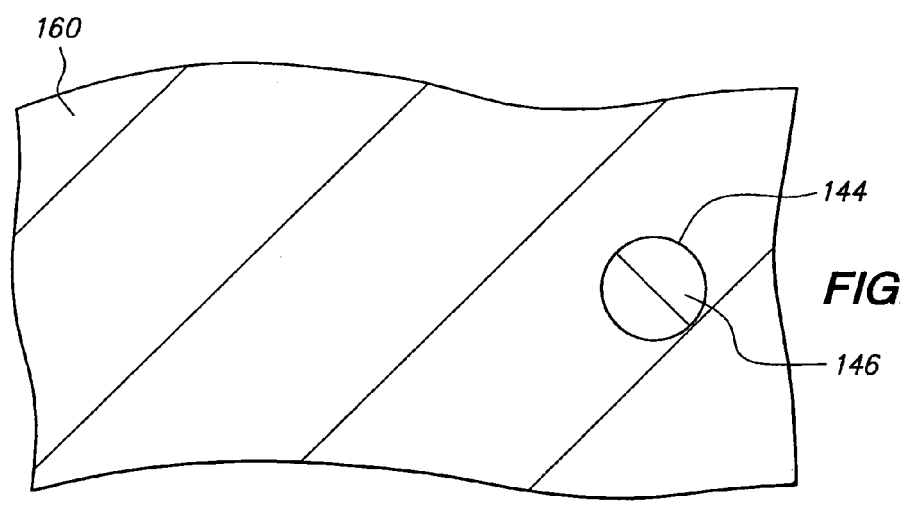
Figure 13C:
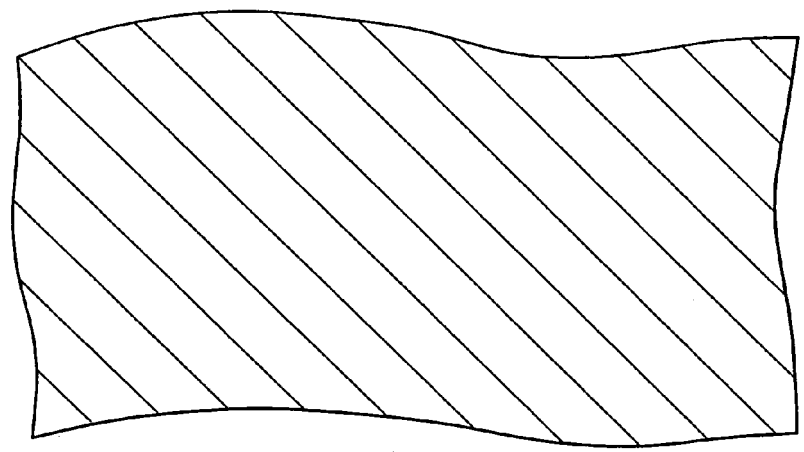

FIGS. 13A, 13B and 13C are cross-sectional, top and bottom views, respectively, of the structure after an upper portion of encapsulant 160 is removed.

The upper portion of encapsulant 160 is removed by grinding. In particular, a rotating diamond sand wheel and distilled water are applied to surface 162 of encapsulant 160. Initially, the diamond sand wheel grinds only encapsulant 160. As the grinding continues, encapsulant 160 becomes thinner as surface 162 migrates downwardly. Eventually the diamond sand wheel contacts pillar 144, and as a result, begins to grind pillar 144 as well. As the grinding continues, pillar 144 and encapsulant 160 become thinner as surfaces 146 and 162 migrate downwardly. The grinding continues until pillar 144 and encapsulant 160 have the desired thickness, and then halts before it reaches chip 110, routing line 132, insulative base 140, support 142 or adhesive 154. Thereafter, the structure is rinsed in distilled water to remove contaminants.

Pillar 144 and encapsulant 160 extend upwardly beyond chip 110 by 50 microns after the grinding operation. Thus, the grinding removes a 50 micron thick upper portion of pillar 144 and a 150 micron thick upper portion of encapsulant 160. As a result, the height of pillar 144 decreases to 200 microns (250–50), the diameter of surface 146 increases to 340 microns (300+(500–300)(50/250)), and the surface area of surface 146 increases to 46 percent as large as the surface area of surface 148, that is, 54 percent smaller than the surface area of surface 148 ((196,250–90,750)/196,250).

At this stage, chip 110 and pillar 144 remain embedded in encapsulant 160. Surface 146 of pillar 144 and surface 162 of encapsulant 160 are laterally aligned with one another and exposed. Thus, an exposed planarized horizontal surface that faces upwardly includes surfaces 146 and 162. Pillar 144 and encapsulant 160 continue to extend upwardly beyond chip 110, routing line 132, insulative base 140, support 142 and adhesive 154, and encapsulant 160 continues to cover chip 110. Furthermore, pillar 144 extends through surface 162 of encapsulant 160, and encapsulant 160 no longer contacts or covers surface 146 of pillar 144.

Figure 14A:
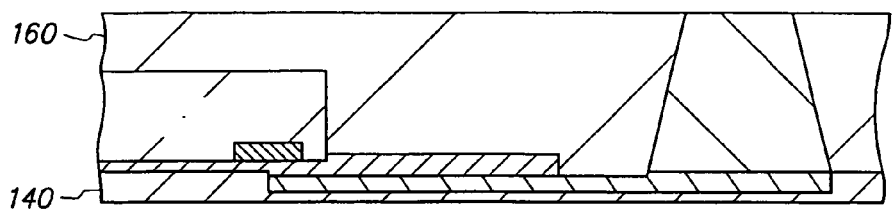
Figure 14B:
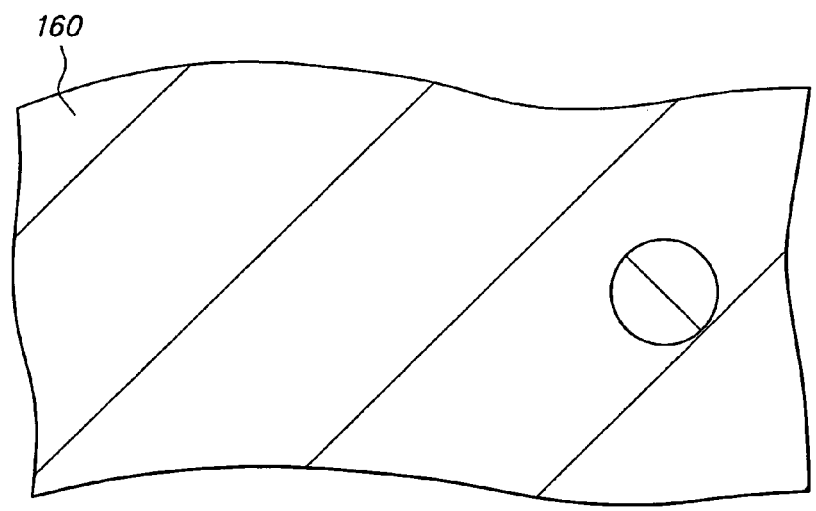
Figure 14C:
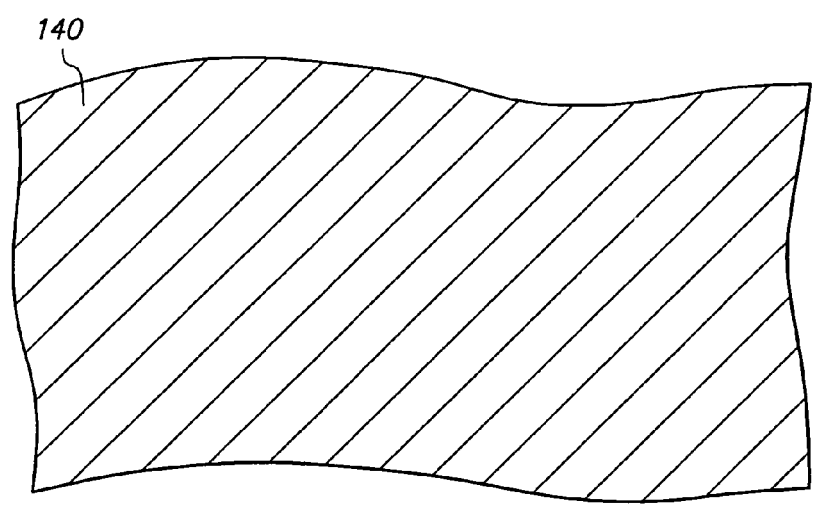

FIGS. 14A, 14B and 14C are cross-sectional, top and bottom views, respectively, of the structure after support 142 is removed.

A "back-side" wet chemical etch is applied to support 142. For instance, the wet chemical etch can be sprayed on support 142, or a protective mask can be deposited on surface 146 of pillar 144 and then the structure can be dipped in the wet chemical etch. The wet chemical etch is highly selective of copper with respect to polyimide, and therefore, highly selective of support 142 with respect to insulative base 140. Therefore, no appreciable amount of insulative base 140 is removed. Furthermore, insulative base 140 protects routing line 132 and pillar 144 from the etch.

The wet chemical etch exposes insulative base 140. A suitable wet chemical etch can be provided by a solution containing alkaline ammonia.

At this stage, encapsulant 160 provides mechanical support for insulative base 140 and conductive trace 152 that is particularly useful after support 142 is removed.

Figure 15A:
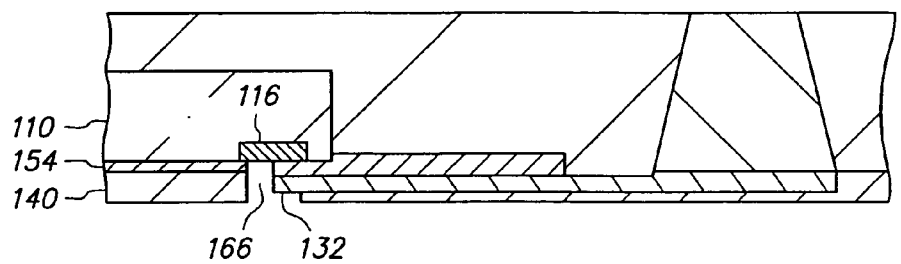
Figure 15B:
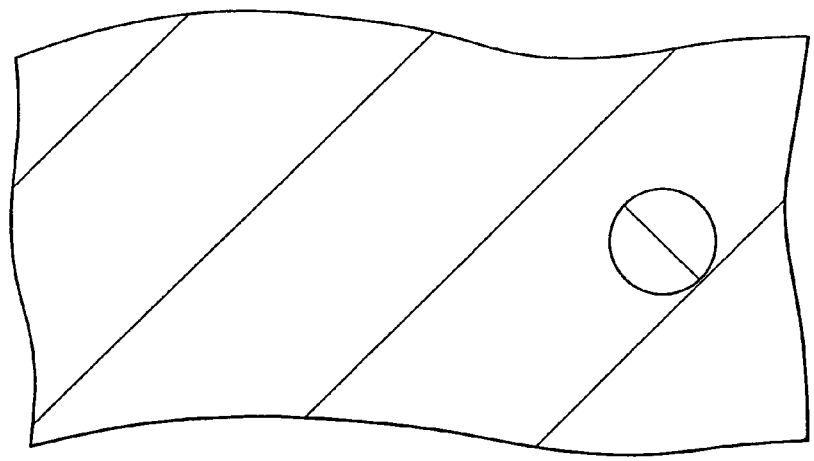
Figure 15C:
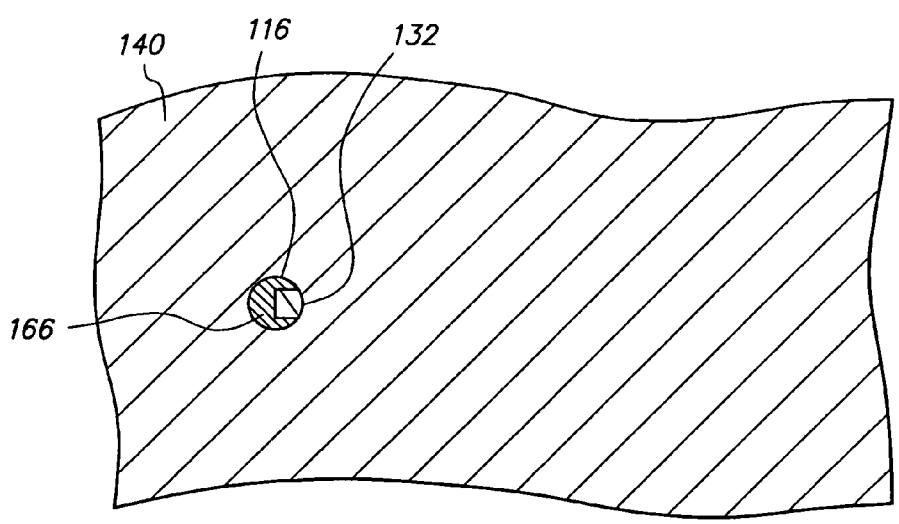

FIGS. 15A, 15B and 15C are cross-sectional, top and bottom views, respectively, of through-hole 166 that extends through insulative base 140 and adhesive 154 and exposes pad 116 and routing line 132.

Through-hole 166 is formed through insulative base 140 and adhesive 154 by applying a suitable etch that is highly selective of insulative base 140 and adhesive 154 with respect to pad 116 and routing line 132. In this instance, a selective TEA $CO_2$ laser etch is applied. The laser is directed at and vertically aligned with and centered relative to pad 116. The laser has a spot size of 70 microns, and pad 116 has a length and width of 100 microns. As a result, the laser strikes pad 116, portions of routing line 132, insulative base 140 and adhesive 154 that extend within the periphery of pad 116, a portion of insulative base 140 that extends within the periphery of routing line 132, and ablates insulative base 140 and adhesive 154.

The laser drills through and removes portions of insulative base 140 and adhesive 154. However, portions of insulative base 140 and adhesive 154 that extend across the peripheral edges of pad 116 are outside the scope of the laser and remain intact. Likewise, routing line 132 shields a portion of adhesive 154 from the laser etch, and a portion of adhesive 154 sandwiched between pad 116 and routing line 132 remains intact. The laser etch is anisotropic, and therefore little or none of adhesive 154 sandwiched between pad 116 and routing line 132 is undercut or removed.

Thereafter, a brief cleaning step can be applied to remove oxides and debris that may be present on the exposed portions of pad 116 and routing line 132. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pad 116 and routing line 132 without damaging the structure.

Through-hole 166 is formed in and extends vertically through insulative base 140 and adhesive 154, is disposed within the periphery of chip 110, is vertically aligned with and exposes pad 116, exposes elongated region 134 of routing line 132, is spaced from enlarged circular region 136 of routing line 132 and has a diameter of 70 microns. Through-hole 166 is formed without damaging pad 116, passivation layer 118 or routing line 132 and does not extend into chip 110.

Through-hole 166 may slightly undercut adhesive 154 between pad 116 and routing line 132 and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored.

Figure 15D:
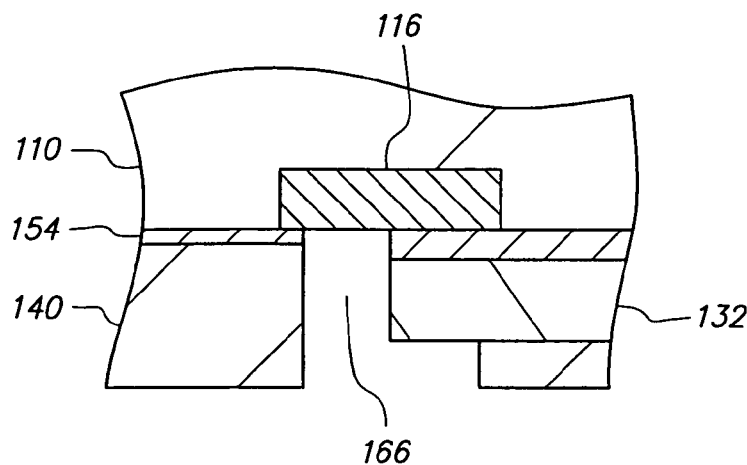
FIGS. 15D, 15E and 15F are enlarged cross-sectional, bottom and cross-sectional views, respectively, of the through-hole in FIG. 15A.
Figure 15E:
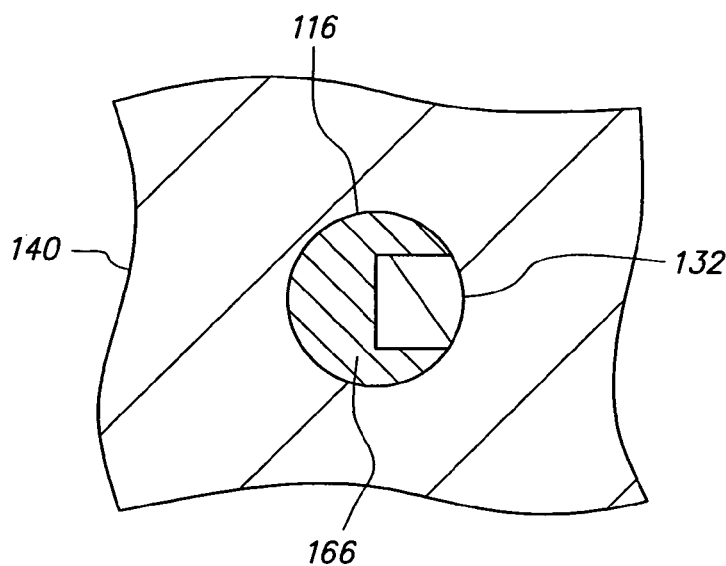
Figure 15F:
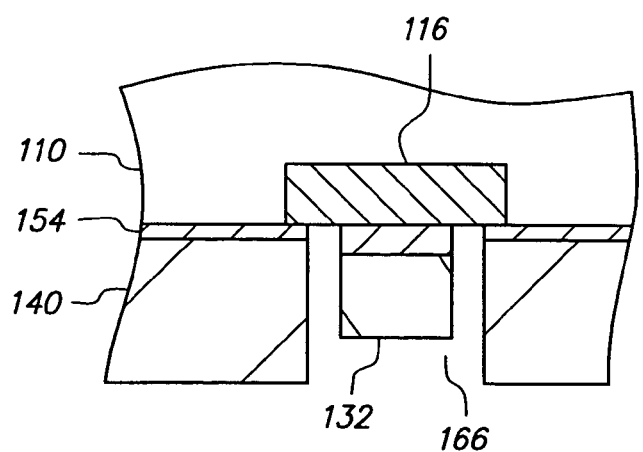

FIGS. 15D, 15E and 15F are enlarged cross-sectional, bottom and cross-sectional views, respectively, of through-hole 166. FIG. 15F is oriented orthogonally with respect to FIG. 15D. As is seen, through-hole 166 extends through insulative base 140 and adhesive 154 to pad 116 and exposes the downwardly facing surface and elongated peripheral sidewalls of routing line 132, and adhesive 154 remains in contact with and sandwiched between pad 116 and routing line 132.

Figure 16A:
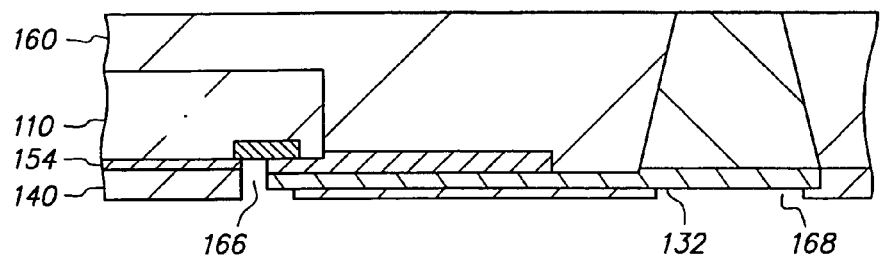
Figure 16B:
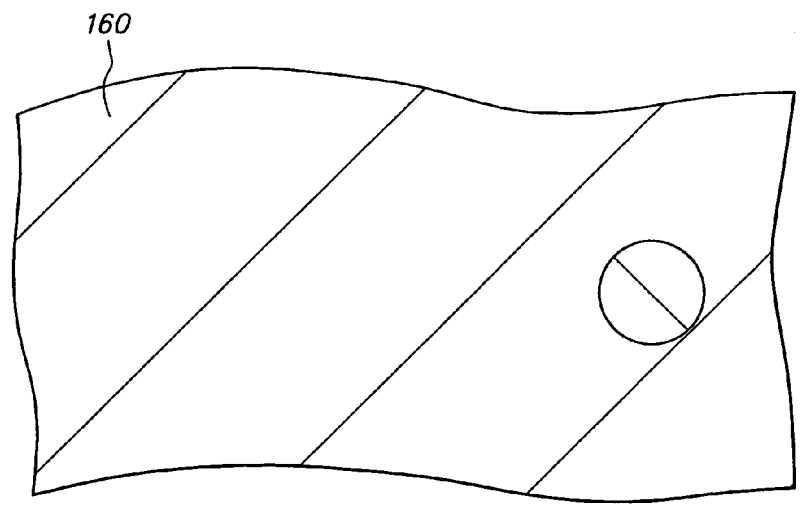
Figure 16C:
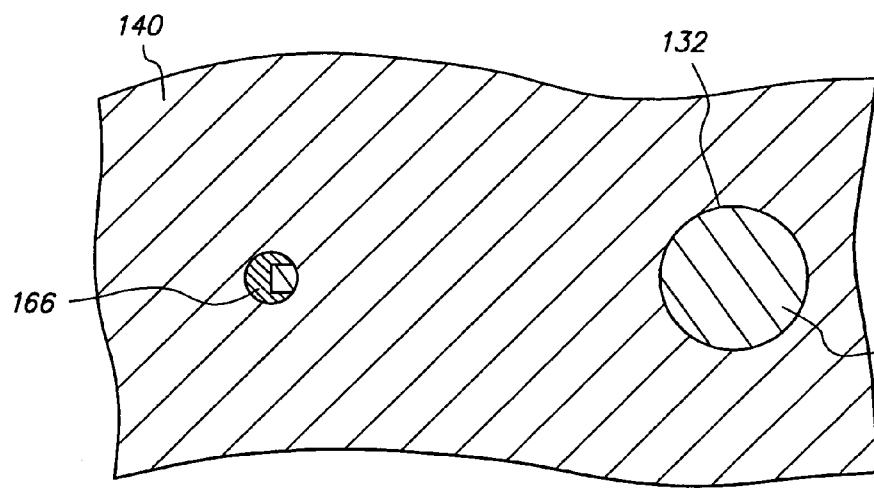

FIGS. 16A, 16B and 16C are cross-sectional, top and bottom views, respectively, of through-hole 168 that extends through insulative base 140 and exposes routing line 132.

Through-hole 168 is formed through insulative base 140 by applying a suitable etch that is highly selective of insulative base 140 with respect to routing line 132. In this instance, a selective TEA $CO_2$ laser etch is applied using multiple laser direct writes. The laser is directed at enlarged circular region 136 of routing line 132. The laser has a spot size of 150 microns, and enlarged circular region 136 has a diameter of 500 microns. Furthermore, the laser direct writes are offset relative to one another yet overlap so that the laser scans a central portion of enlarged circular region 136 with a diameter of 400 microns. In this manner, the laser direct writes in combination are vertically aligned with and centered relative to enlarged circular region 136. As a result, the laser strikes routing line 132, a portion of insulative base 140 that extends within the periphery of routing line 132, and ablates insulative base 140.

The laser drills through and removes a portion of insulative base 140. However, a portion of insulative base 140 that extends across the peripheral edges of enlarged circular region 136 is outside the scope of the laser and remains intact.

Thereafter, a brief cleaning step can be applied to remove oxides and debris that may be present on the exposed portion of routing line 132. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of routing line 132 without damaging the structure. Likewise, the cleaning step can clean the exposed portions of pad 116 and routing line 132 in through-hole 166 as well as the exposed portion of routing line 132 in through-hole 168, in which case the previous cleaning step (after forming through-hole 166 and before forming through-hole 168) can be omitted.

Through-hole 168 is formed in and extends vertically through insulative base 140, is disposed outside the periphery of chip 110, is vertically aligned with and exposes enlarged circular region 136 of routing line 132, is spaced from elongated region 134 of routing line 132, adhesive 154 and through-hole 166 and has a diameter of 400 microns. Through-hole 168 is formed without damaging routing line 132 or pillar 144 and does not extend into encapsulant 160.

Through-hole 168 may have a diameter that is slightly larger than 400 microns due to the beam angle of the laser, the thermal effects of the laser, and/or the isotropic nature of an oxygen plasma or wet chemical cleaning step. For convenience of explanation, this slight enlargement is ignored.

Figure 17A:
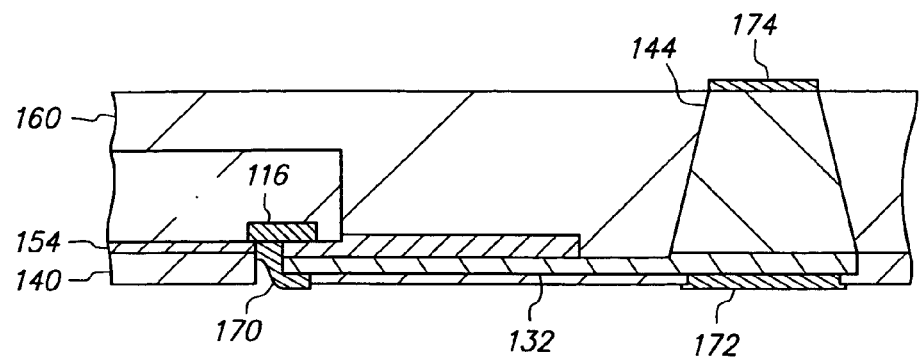
Figure 17B:
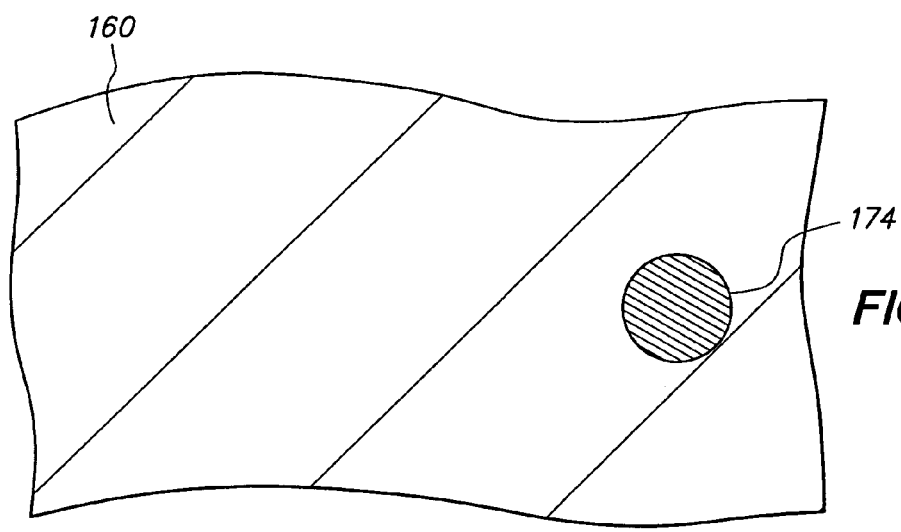
Figure 17C:
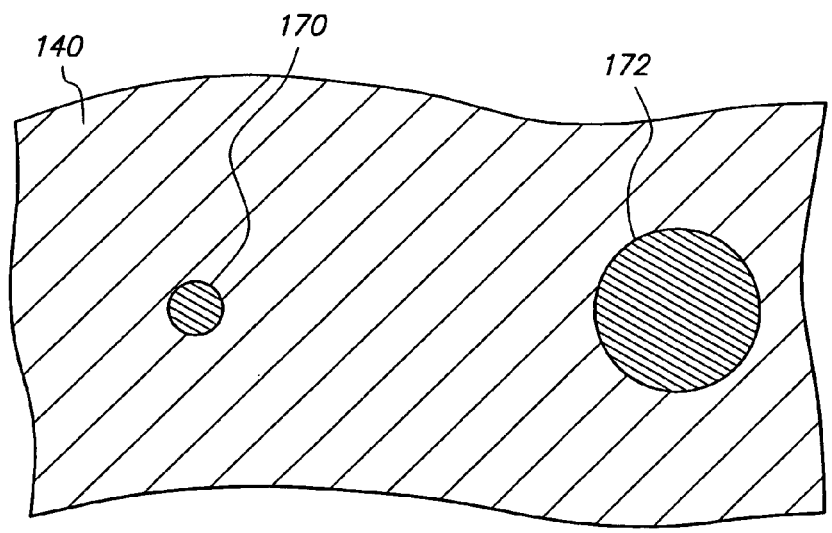

FIGS. 17A, 17B and 17C are cross-sectional, top and bottom views, respectively, of connection joint 170 formed on pad 116 and routing line 132, terminal 172 formed on routing line 132 and terminal 174 formed on pillar 144.

Connection joint 170 and terminals 172 and 174 are electrolessly plated on the exposed portions of pad 116 and routing line 132, routing line 132 and pillar 144, respectively. More particularly, connection joint 170 is plated on pad 116 and elongated region 134 of routing line 132 in through-hole 166, terminal 172 is plated on enlarged circular region 136 of routing line 132 in through-hole 168, and terminal 174 is plated on surface 146 of pillar 144 during an electroless plating operation.

Connection joint 170 is composed of a nickel layer electrolessly plated on pad 116 and routing line 132 and a gold layer electrolessly plated on the nickel layer, terminal 172 is composed of a nickel layer electrolessly plated on routing line 132 and a gold layer electrolessly plated on the nickel layer, and terminal 174 is composed of a nickel layer electrolessly plated on pillar 144 and a gold layer electrolessly plated on the nickel layer. In connection joint 170, the nickel layer contacts and is sandwiched between pad 116 and the gold layer and between routing line 132 and the gold layer, and the gold layer is spaced and separated from pad 116 and routing line 132 and exposed. In terminal 172, the nickel layer contacts and is sandwiched between routing line 132 and the gold layer, and the gold layer is spaced and separated from routing line 132 and exposed. In terminal 174, the nickel layer contacts and is sandwiched between pillar 144 and the gold layer, and the gold layer is spaced and separated from pillar 144 and exposed. For convenience of illustration, the nickel and gold layers are shown as a single layer.

The structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Pad 116 includes an exposed nickel surface layer and therefore is catalytic to electroless nickel. Furthermore, insulative base 140, adhesive 154 and encapsulant 160 are not catalytic to electroless nickel and therefore a plating mask is not necessary. As a result, connection joint 170 begins to plate on pad 116. However, connection joint 170 does not initially deposit on routing line 132, terminal 172 does not initially deposit on routing line 132 and terminal 174 does not initially deposit on pillar 144 since routing line 132 exposed by through-hole 166 is copper, routing line 132 exposed by through-hole 168 is copper and pillar 144 exposed by encapsulant 160 is copper. In other words, the exposed portions of conductive trace 152 are copper which is not catalytic to electroless nickel.

As the electroless nickel plating operation continues, connection joint 170 continues to plate on pad 116 and expand vertically in through-hole 166 towards routing line 132. Eventually connection joint 170 contacts routing line 132 in through-hole 166 and changes the electrochemical potential of routing line 132 by a small amount such as 0.2 volts. Likewise, since pillar 144 is electrically connected to routing line 132, the electrochemical potential of pillar 144 also changes by a small amount such as 0.2 volts. As a result, routing line 132 and pillar 144 become catalytic to electroless nickel, connection joint 170 begins to plate on routing line 132 as well, terminal 172 begins to plate on routing line 132 and terminal 174 begins to plate on pillar 144.

The electroless nickel plating operation continues until connection joint 170 is about 15 microns thick. Connection joint 170 is slightly thicker than terminals 172 and 174 due to the head-start during the electroless plating operation. At this point, connection joint 170 and terminals 172 and 174 are primarily nickel and contain about 4 to 9 weight percentage phosphorus.

Thereafter, the assembly is removed from the electroless nickel plating solution and briefly submerged in an electroless gold plating solution such as is MacDermid PLANAR™ at 70° C. Connection joint 170 and terminals 172 and 174 include exposed nickel surface layers and therefore are catalytic to electroless gold. Furthermore, insulative base 140, adhesive 154 and encapsulant 160 are not catalytic to electroless gold and therefore a plating mask is not necessary. As a result, the gold deposits on the nickel surface layers. The gold electroless plating operation continues until the gold surface layers are about 0.5 microns thick. Thereafter, the structure is removed from the electroless gold plating solution and rinsed in distilled water.

In this manner, connection joint 170 and terminals 172 and 174 are simultaneously formed during a single electroless plating operation.

Connection joint 170 contacts and electrically connects pad 116 and routing line 132 in through-hole 166 and extends downwardly beyond chip 110 and routing line 132. Connection joint 170 contacts and covers portions of pad 116 and routing line 132 that were previously exposed by through-hole 166. Thus, connection joint 170 provides a robust, permanent electrical connection between pad 116 and routing line 132. Connection joint 170 includes a buried nickel layer and a gold surface layer. The buried nickel layer provides the primary mechanical and electrical connection between pad 116 and routing line 132, and the gold surface layer is a relatively unimportant byproduct of the electroless plating operation. Connection joint 170 is the only electrical conductor external to chip 110 that contacts pad 116, adhesive 154 and connection joint 170 are the only materials external to chip 110 that contact pad 116, and adhesive 154 and connection joint 170 are the only materials that contact both pad 116 and routing line 132.

Terminal 172 contacts and is electrically connected to routing line 132 in through-hole 168 and extends downwardly beyond routing line 132 and insulative base 140. Terminal 172 contacts and covers the portion of routing line 132 that was previously exposed by through-hole 168. Thus, terminal 172 provides a robust, permanent electrical connection to routing line 132 that protrudes downwardly from routing line 132 and is exposed. Terminal 172 includes a buried nickel layer and a gold surface layer. The buried nickel layer provides the primary mechanical and electrical connection to routing line 132, and the gold surface layer provides a wettable surface to facilitate solder reflow. Terminal 172 has a cylindrical shape with a diameter of 400 microns that expands slightly outside through-hole 168.

Terminal 174 contacts and is electrically connected to pillar 144 and extends upwardly beyond pillar 144 and encapsulant 160. Terminal 174 contacts and covers surface 146 of pillar 144. Thus, terminal 174 provides a robust, permanent electrical connection to pillar 144 that protrudes upwardly from pillar 144 and is exposed. Terminal 174 includes a buried nickel layer and a gold surface layer. The buried nickel layer provides the primary mechanical and electrical connection to pillar 144, and the gold surface layer provides a wettable surface to facilitate solder reflow. Terminal 174 has a cylindrical shape with a diameter of 350 microns.

At this stage, conductive trace 152 includes routing line 132, pillar 144 and terminals 172 and 174 and is electrically connected to pad 116 by connection joint 170. Connection joint 170 and terminals 172 and 174 are spaced and separated from one another, and terminals 172 and 174 are vertically aligned with one another.

Figure 17D:
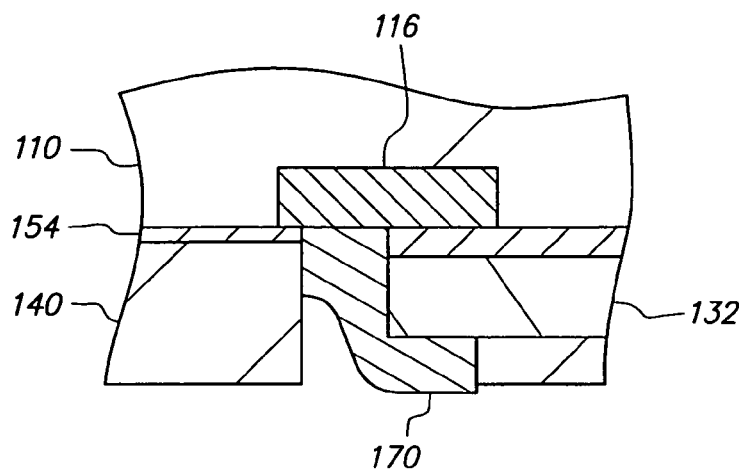
FIGS. 17D, 17E and 17F are enlarged cross-sectional, bottom and cross-sectional views, respectively, of the connection joint in FIG. 17A.
Figure 17E:
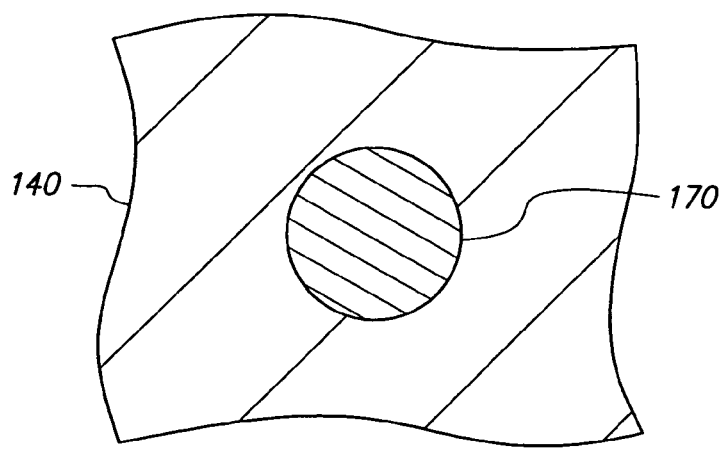
Figure 17F:
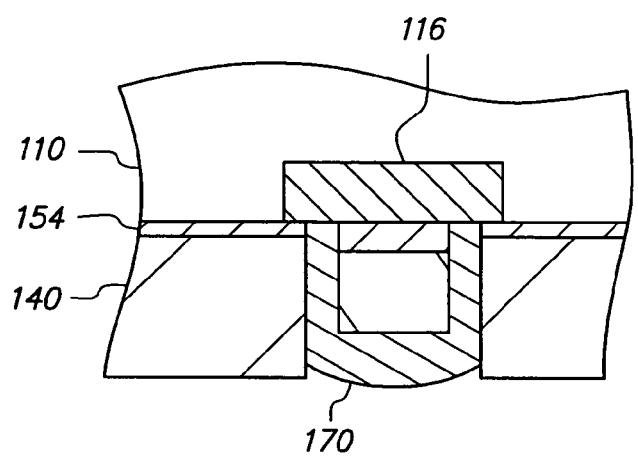

FIGS. 17D, 17E and 17F are enlarged cross-sectional, bottom and cross-sectional views, respectively, of connection joint 170. FIG. 17F is oriented orthogonally with respect to FIG. 17D. As is seen, connection joint 170 extends into through-hole 166 and contacts and electrically connects pad 116 and routing line 132. Furthermore, connection joint 170 contacts the downwardly facing surface and elongated peripheral sidewalls of routing line 132, and adhesive 154 remains in contact with and sandwiched between pad 116 and routing line 132.

Figure 18A:
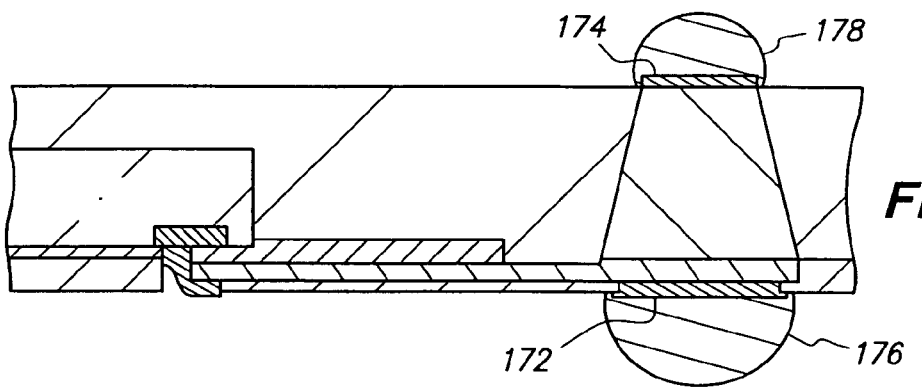
Figure 18B:
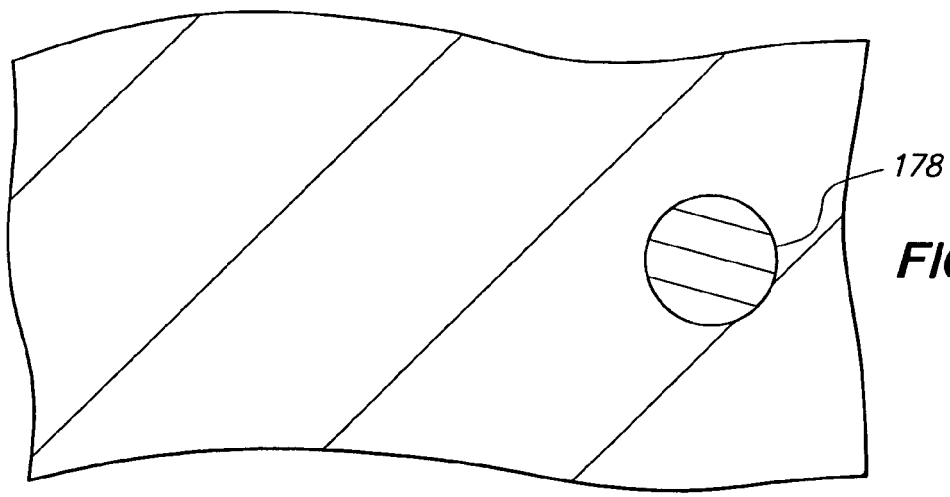
Figure 18C:
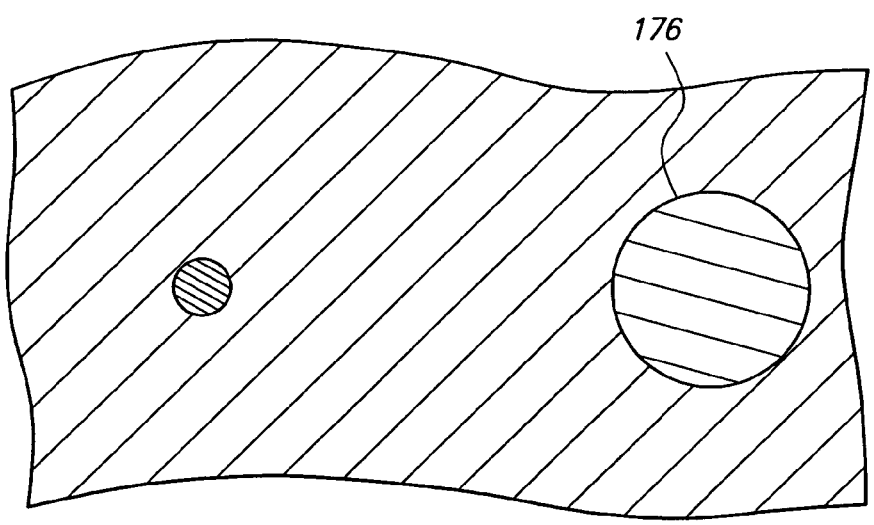

FIGS. 18A, 18B and 18C are cross-sectional, top and bottom views, respectively, of solder balls 176 and 178 formed on terminals 172 and 174, respectively.

Solder balls 176 and 178 are initially tin-lead balls with spherical shapes. The tin-lead balls are dipped in flux to provide solder balls 176 and 178 with flux surface coatings that surround the tin-lead balls. Thereafter, the structure is inverted so that terminal 172 faces upwardly, and solder ball 176 is deposited on terminal 172. Solder ball 176 weakly adheres to terminal 172 due to the flux surface coating of solder ball 176. Thereafter, the structure is inverted again so that terminal 174 faces upwardly, and solder ball 178 is deposited on terminal 174. Solder ball 176 still weakly adheres to terminal 172 due to the flux surface coating of solder ball 176, and solder ball 178 weakly adheres to terminal 174 due to the flux surface coating of solder ball 178.

Thereafter, heat is applied to reflow solder balls 176 and 178. Terminals 172 and 174 contain gold surface layers that provide wettable surfaces for solder reflow. As a result, solder balls 176 and 178 wet terminals 172 and 174, respectively. The heat is then removed and solder balls 176 and 178 cool and solidify, contact a larger surface area of and remain proximate to terminals 172 and 174, respectively.

Solder ball 176 contacts and is electrically connected to terminal 172 and extends downwardly beyond terminal 172. Thus, solder ball 176 provides a reflowable electrical connection to terminal 172 that protrudes downwardly from terminal 172 and is exposed. Solder ball 176 has a hemispherical shape with a diameter slightly larger than 400 microns.

Solder ball 178 contacts and is electrically connected to terminal 174 and extends upwardly beyond terminal 174. Thus, solder ball 178 provides a reflowable electrical connection to terminal 174 that protrudes upwardly from terminal 174 and is exposed. Solder ball 178 has a hemispherical shape with a diameter slightly larger than 350 microns.

At this stage, conductive trace 152 includes routing line 132, pillar 144, terminals 172 and 174 and solder balls 176 and 178. Solder balls 176 and 178 are spaced and separated from one another and vertically aligned with one another.

Figure 19A:
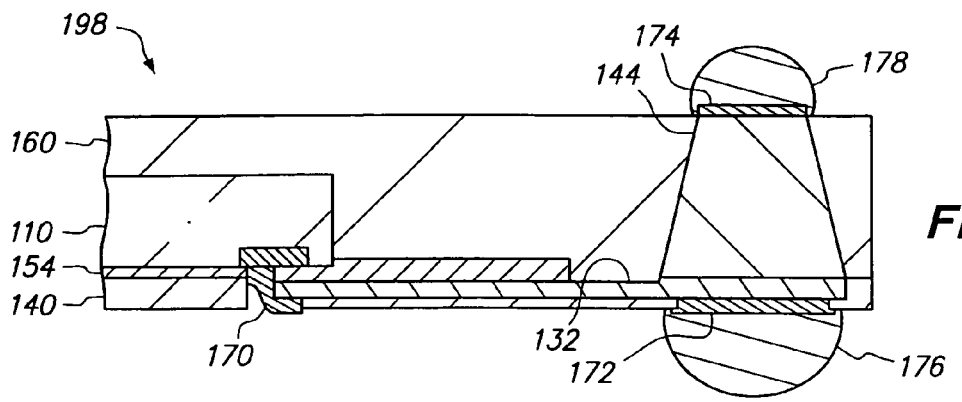
Figure 19B:
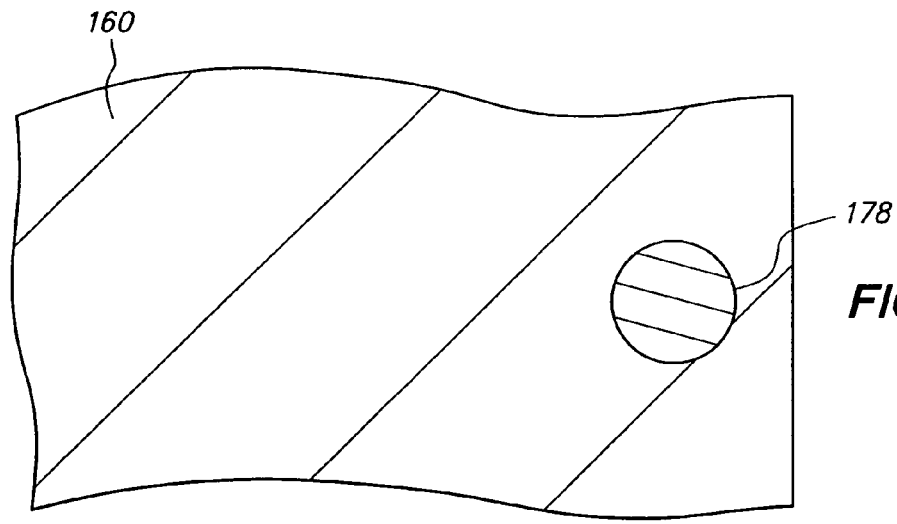
Figure 19C:
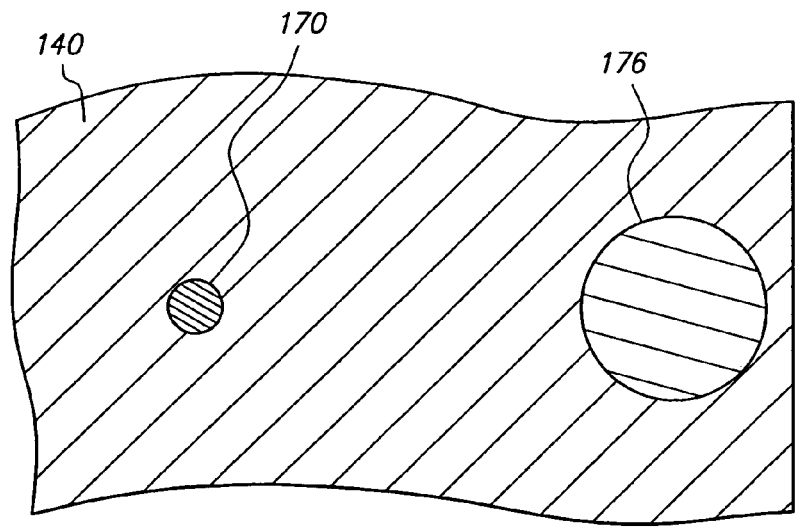

FIGS. 19A, 19B and 19C are cross-sectional, top and bottom views, respectively, of the structure after cutting insulative base 140 and encapsulant 160 with an excise blade to singulate the assembly from other assemblies.

At this stage, the manufacture of semiconductor chip assembly 198 that includes chip 110, routing line 132, insulative base 140, pillar 144, adhesive 154, encapsulant 160, connection joint 170, terminals 172 and 174 and solder balls 176 and 178 can be considered complete.

Routing line 132 is mechanically coupled to chip 110 by adhesive 154, and is electrically coupled to chip 110 by connection joint 170. Routing line 132 extends beyond an outer edge of chip 110 and provides horizontal fan-out routing between pad 116 and external circuitry, and pillar 144 extends across the thickness of chip 110 and provides vertical routing between pad 116 and external circuitry. Insulative base 140 and encapsulant 160 provide mechanical support and environmental protection for the assembly.

The semiconductor chip assembly includes other conductive traces embedded in insulative base 140 and encapsulant 160, and only a single conductive trace 152 is shown for convenience of illustration. The conductive traces each include a respective routing line, pillar, terminal pair and solder ball pair. The conductive traces are each electrically connected to a respective pad on chip 110 by a respective connection joint. The conductive traces each extend beyond an outer edge of chip 110 and extend across the thickness of chip 110 to provide horizontal fan-out routing and vertical routing for their respective pads. Furthermore, the conductive traces each include upwardly and downwardly protruding solder balls to facilitate a three-dimensional stacked arrangement.

Chip 110 is designed with the pads electrically isolated from one another. However, the corresponding routing lines are initially electroplated on metal base 120 and electrically connected to one another by metal base 120. Thereafter, once metal base 120 is etched to form the pillars, the routing lines are electrically isolated from one another by insulative base 140, and subsequently adhesive 154 and encapsulant 160. Therefore, the pads remain electrically isolated from one another.

Advantageously, there is no plating bus or related circuitry that need be disconnected or severed from the conductive traces after the pillars are formed.

Figure 20A:
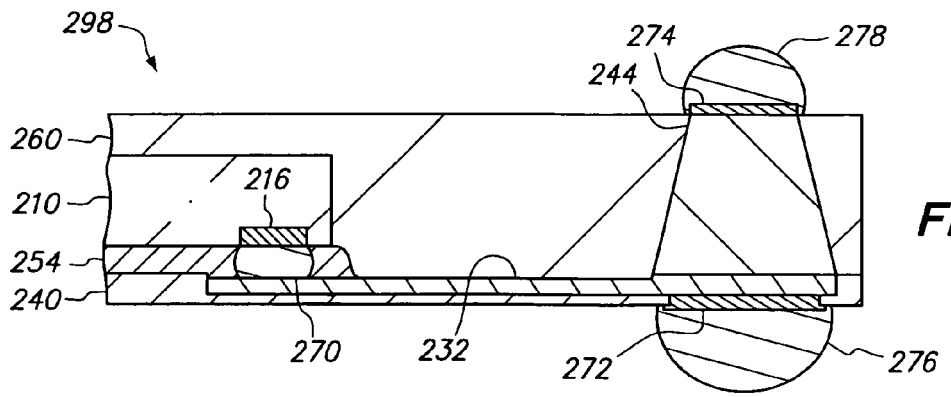
FIGS. 20A, 20B and 20C are cross-sectional, top and bottom views, respectively, of a semiconductor chip assembly in accordance with a second embodiment of the present invention.
Figure 20B:
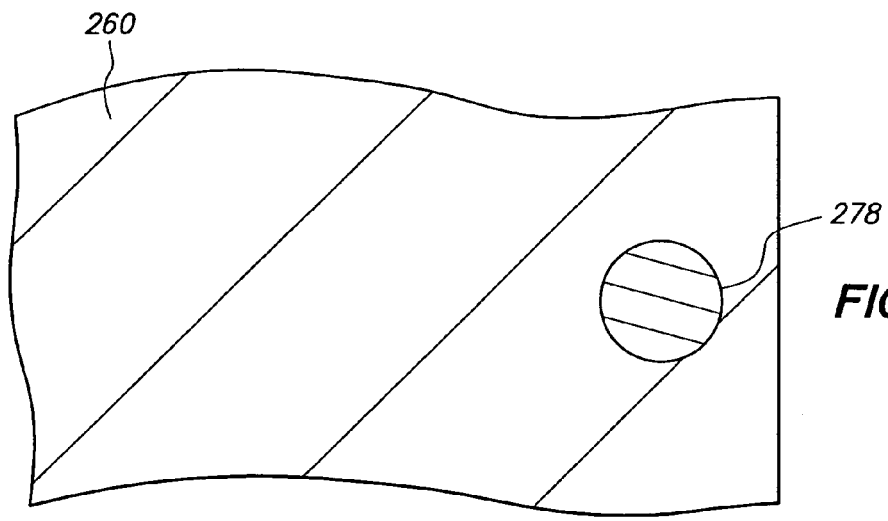
Figure 20C:
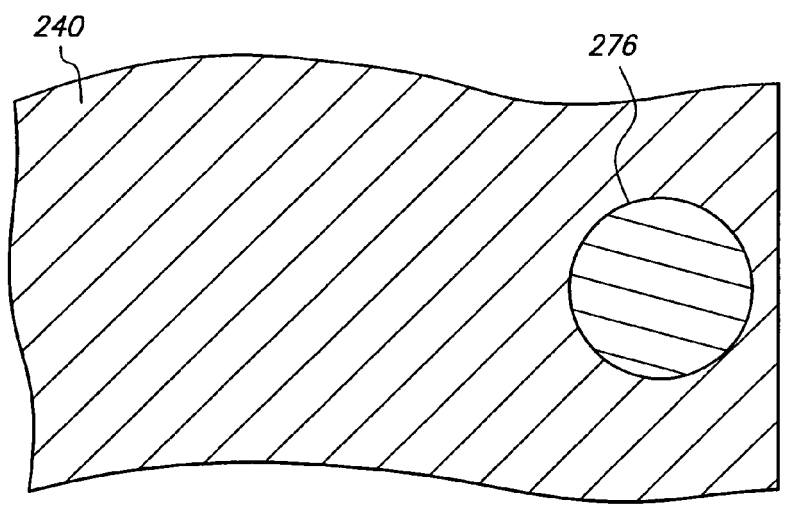

FIGS. 20A, 20B and 20C are cross-sectional, top and bottom views, respectively, of a semiconductor chip assembly in accordance with a second embodiment of the present invention. In the second embodiment, the chip is flip-chip bonded. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 232 corresponds to routing line 132, etc.

Connection joint 270 is initially a solder bump deposited on pad 216. The solder bump has a hemispherical shape and a diameter of 100 microns. Routing line 232 extends laterally from pillar 244 a slightly larger distance than routing line 132 extends laterally from pillar 144. Chip 210 is positioned such that connection joint 270 contacts and is sandwiched between pad 216 and routing line 232, and routing line 232 extends laterally across pad 216. Thereafter, heat is applied to reflow connection joint 270, the heat is removed and connection joint 270 cools and solidifies into a hardened solder joint that mechanically attaches and electrically connects pad 216 and routing line 232. Furthermore, connection joint 270 exhibits localized wetting and does not collapse, and chip 210 remains spaced and separated from routing line 232 and insulative base 240.

Thereafter, adhesive 254 is dispensed into and underfills the open gap between chip 210 and routing line 232 and between chip 210 and insulative base 240, and then adhesive 254 is cured. As a result, adhesive 254 contacts and is sandwiched between chip 210 and routing line 232 and between chip 210 and insulative base 240, contacts connection joint 270 and is spaced and separated from pad 216. Thus, adhesive 254 is significantly thicker than and has a significantly smaller surface area than adhesive 154 but a slightly larger surface area than chip 210. A suitable underfill adhesive is Namics U8443.

Thereafter, encapsulant 260 is formed. Thus, adhesive 254 and encapsulant 260 are formed after connection joint 270.

The through-hole (corresponding to through-hole 166) that extends through the insulative base and the adhesive within the periphery of the chip is omitted. Thus, terminals 272 and 274 are formed during a plating operation that chip 210 is not exposed to.

Semiconductor chip assembly 298 includes chip 210, routing line 232, insulative base 240, pillar 244, adhesive 254, encapsulant 260, connection joint 270, terminals 272 and 274 and solder balls 276 and 278.

Figure 21A:
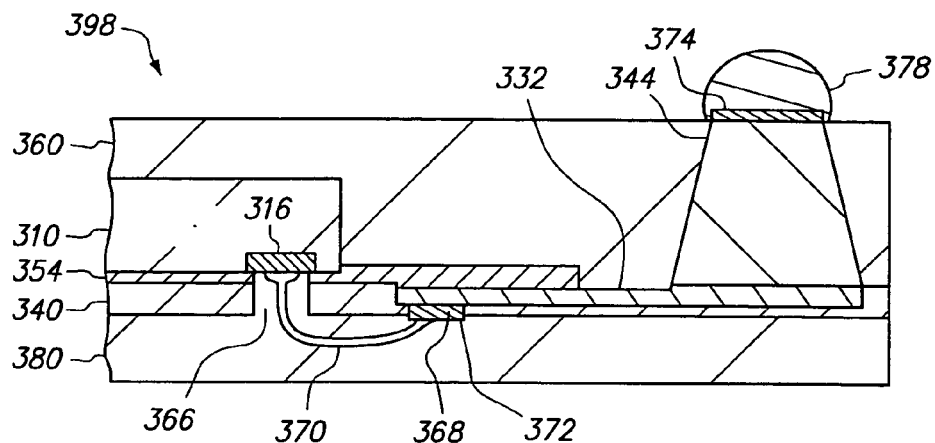
FIGS. 21A, 21B and 21C are cross-sectional, top and bottom views, respectively, of a semiconductor chip assembly in accordance with a third embodiment of the present invention.
Figure 21B:
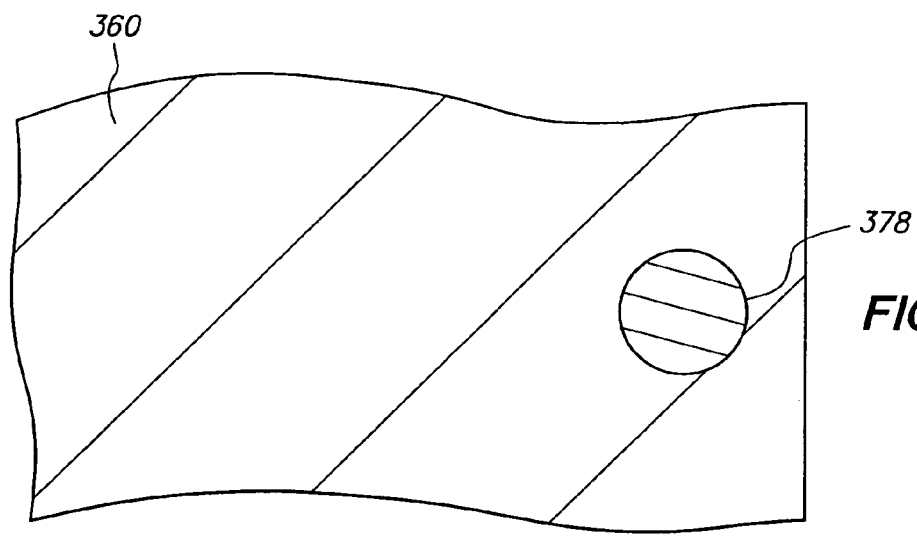
Figure 21C:
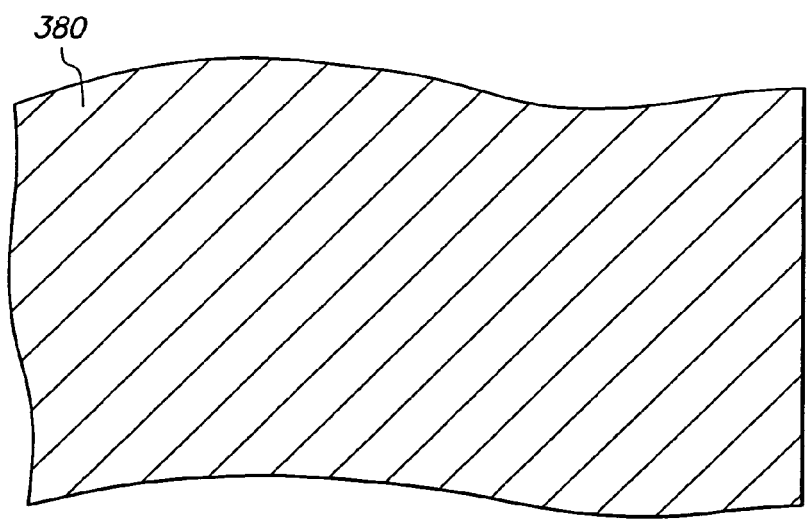

FIGS. 21A, 21B and 21C are cross-sectional, top and bottom views, respectively, of a semiconductor chip assembly in accordance with a third embodiment of the present invention. In the third embodiment, the connection joint is a wire bond. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 332 corresponds to routing line 132, etc.

Routing line 332 extends laterally from pillar 344 a significantly smaller distance than routing line 132 extends laterally from pillar 144. Furthermore, routing line 332 includes an elongated region (corresponding to elongated region 134) that is 100 microns wide and thus 50 microns wider than elongated region 134.

Chip 310 is positioned such that routing line 332 is disposed outside the periphery of chip 310.

Through-hole 368 and terminals 372 and 374 are formed before through-hole 366. Thus, terminals 372 and 374 are formed during a plating operation that chip 310 is not exposed to.

Through-hole 368 is positioned laterally between chip 310 and pillar 344 near the distal end of routing line 332 and has a diameter of 70 microns. As a result, terminal 372 is positioned laterally between chip 310 and pillar 344 near the distal end of routing line 332, is not vertically aligned with terminal 374 and has a diameter of 70 microns that expands slightly outside through-hole 368.

After the support (corresponding to support 142) is removed, the structure is dipped in an activator solution such as dilute palladium chloride of approximately 0.1 grams of palladium chloride and 5 cubic centimeters of hydrochloric acid per liter of water to render routing line 332 and pillar 344 catalytic to electroless nickel, then the structure is rinsed in distilled water to remove the palladium from insulative base 340 and encapsulant 360, then terminals 372 and 374 are formed, and then through-hole 366 is formed.

Connection joint 370 is a wire bond composed of gold that is ball bonded to pad 316 and then wedge bonded to terminal 372. Thus, connection joint 370 is electrically connected to pad 316 in through-hole 366 and routing line 332 in through-hole 368. Terminal 372 provides a gold surface layer that better accommodates the wedge bond than the copper layer of routing line 332. Thus, terminal 372 enhances the electrical connection between routing line 332 and connection joint 370. Furthermore, connection joint 370 extends downwardly beyond terminal 372 by 125 microns.

Thereafter, encapsulant 380 is formed on the back-side of the structure. Encapsulant 380 contacts and covers insulative base 340 and connection joint 370 and extends vertically beyond connection joint 370 by 50 microns. Encapsulant 380 is initially an epoxy in paste form that includes an epoxy resin, a curing agent and an accelerator. The epoxy paste is deposited over the back-side of the structure using stencil printing, then the epoxy paste is cured or hardened at a relatively low temperature in the range of 100 to 250° C. to form a solid adherent insulator that protects connection joint 370.

Thereafter, solder ball 378 is formed on terminal 374, however the solder ball (corresponding to solder ball 176) formed on terminal 372 is omitted.

Thereafter, insulative base 340 and encapsulants 360 and 380 are cut with an excise blade to singulate the assembly from other assemblies.

Semiconductor chip assembly 398 includes chip 310, routing line 332, insulative base 340, pillar 344, adhesive 354, encapsulant 360, connection joint 370, terminals 372 and 374, solder ball 378 and encapsulant 380.

Figure 22A:
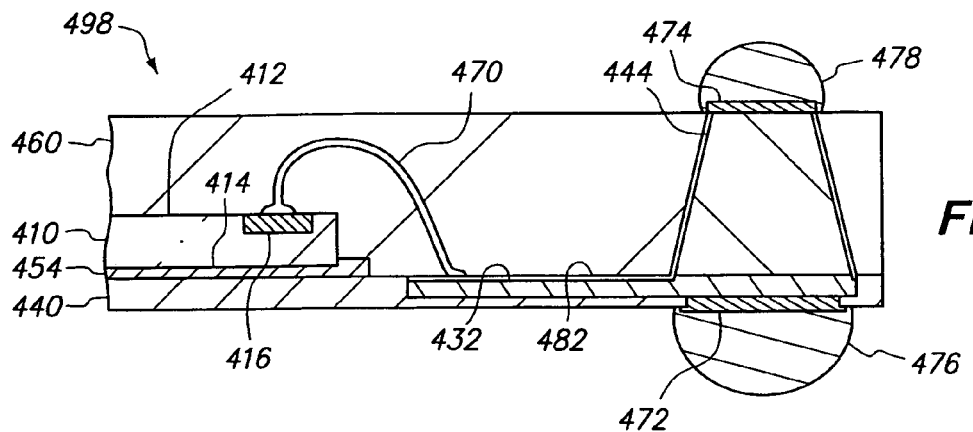
FIGS. 22A, 22B and 22C are cross-sectional, top and bottom views, respectively, of a semiconductor chip assembly in accordance with a fourth embodiment of the present invention.
Figure 22B:
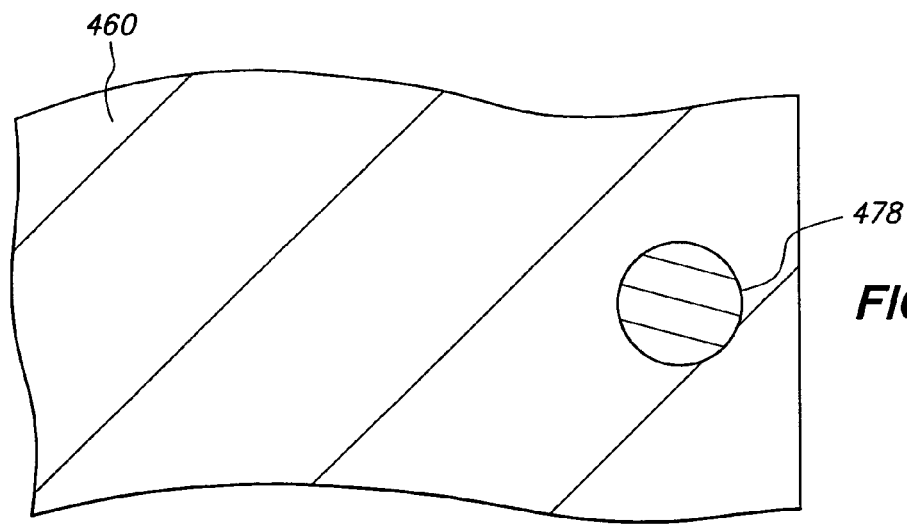
Figure 22C:
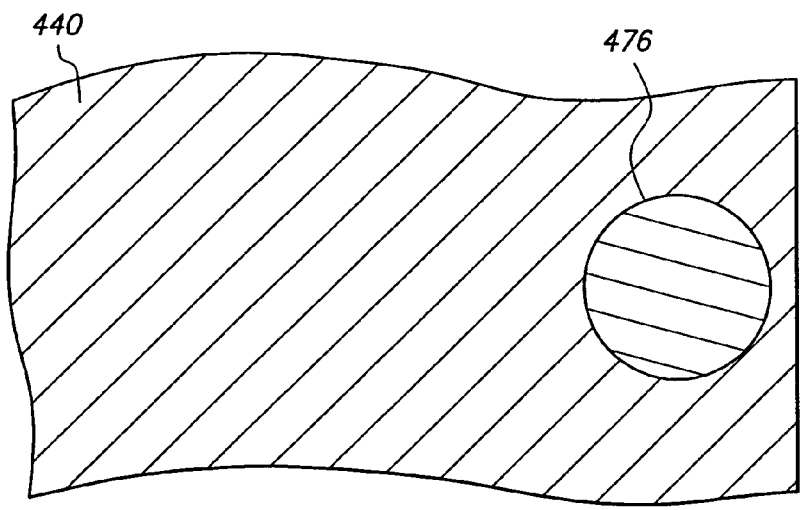

FIGS. 22A, 22B and 22C are cross-sectional, top and bottom views, respectively, of a semiconductor chip assembly in accordance with a fourth embodiment of the present invention. In the fourth embodiment, the connection joint is a wire bond. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 432 corresponds to routing line 132, etc.

Chip 410 has a thickness of 100 microns and thus is 50 microns thinner than chip 110. Pillar 444 has a thickness of 300 microns and thus is 50 microns thicker than pillar 144. Routing line 432 extends laterally from pillar 444 a significantly smaller distance than routing line 132 extends laterally from pillar 144.

After the etch mask (corresponding to etch mask 130) is removed, and before adhesive 454 is deposited on insulative base 440, a protective mask is deposited on the support (corresponding to support 142), then the structure is dipped in an activator solution such as dilute palladium chloride of approximately 0.1 grams of palladium chloride and 5 cubic centimeters of hydrochloric acid per liter of water to render routing line 432 and pillar 444 catalytic to electroless nickel, then the structure is rinsed in distilled water to remove the palladium from insulative base 440, then metallic coating 482 is electrolessly plated on routing line 432 and pillar 444, and then the protective mask is removed. Metallic coating 482 is composed of a buried nickel layer that is 4 microns thick and a gold surface layer that is 1 micron thick. For convenience of illustration, the nickel and gold layers are shown as a single layer.

Adhesive 454 is deposited on insulative base 440 and does not contact or overlap routing line 432 or metallic coating 482. Thus, adhesive 454 has a significantly smaller surface area than adhesive 154 but a slightly larger surface area than chip 410.

Chip 410 is positioned such that surface 412 faces upwardly, surface 414 faces downwardly and routing line 432 is disposed outside the periphery of chip 410. Pillar 444 extends upwardly beyond chip 410 by 200 microns (100+50+50).

Connection joint 470 is a wire bond composed of gold that is ball bonded to pad 416 and then wedge bonded to metallic coating 482 near the distal end of routing line 432. Metallic coating 482 provides a gold surface layer that better accommodates the wedge bond than the copper layer of routing line 432. Thus, metallic coating 482 enhances the electrical connection between routing line 432 and connection joint 470. Furthermore, connection joint 470 extends upwardly beyond chip 410 and routing line 432. Connection joint 470 extends upwardly beyond chip 410 by 125 microns.

Encapsulant 460 contacts connection joint 470 and extends upwardly beyond is pillar 444 by 100 microns, and then portions of pillar 444 and encapsulant 460 are removed such that pillar 444 and encapsulant 460 extend upwardly beyond connection joint 470 by 25 microns. Thus, encapsulant 460 is formed after connection joint 470.

The through-hole (corresponding to through-hole 166) that extends through the insulative base and the adhesive within the periphery of the chip is omitted. Thus, terminals 472 and 474 are formed during a plating operation that chip 410 is not exposed to.

After through-hole 468 is formed, the structure is dipped in an activator solution such as dilute palladium chloride of approximately 0.1 grams of palladium chloride and 5 cubic centimeters of hydrochloric acid per liter of water to render routing line 432 and pillar 444 catalytic to electroless nickel, then the structure is rinsed in distilled water to remove the palladium from insulative base 440 and encapsulant 460, and then terminals 472 and 474 are formed.

Semiconductor chip assembly 498 includes chip 410, routing line 432, insulative base 440, pillar 444, adhesive 454, encapsulant 460, connection joint 470, terminals 472 and 474, solder balls 476 and 478 and metallic coating 482.

Figure 23A:
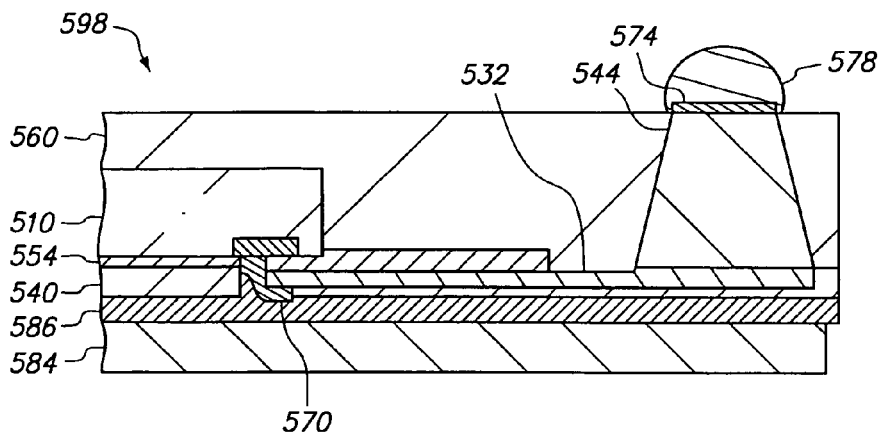
FIGS. 23A, 23B and 23C are cross-sectional, top and bottom views, respectively, of a semiconductor chip assembly in accordance with a fifth embodiment of the present invention.
Figure 23B:
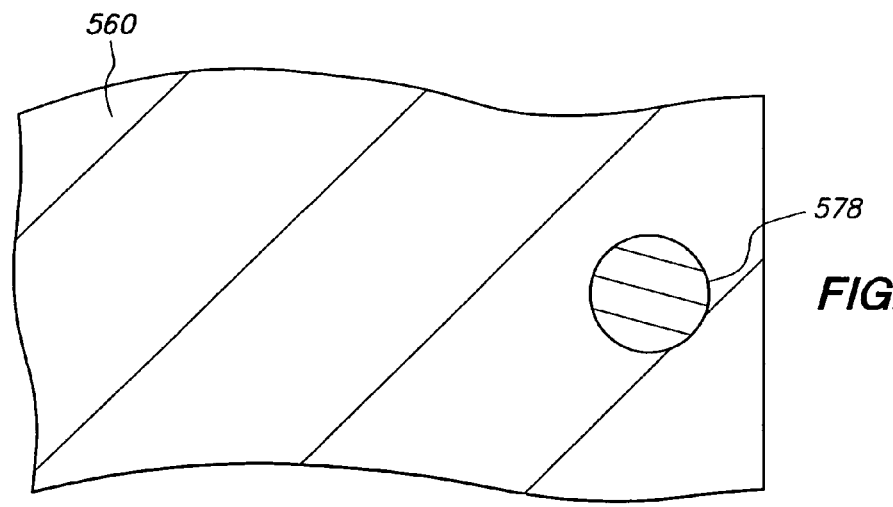
Figure 23C:
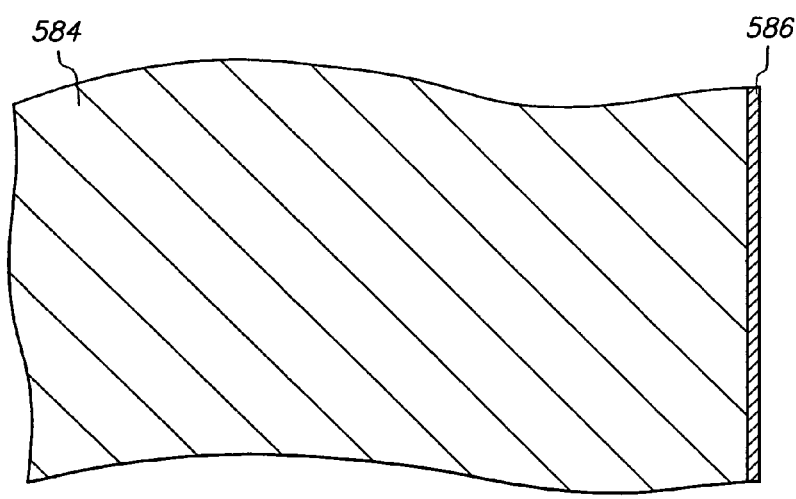

FIGS. 23A, 23B and 23C are cross-sectional, top and bottom views, respectively, of a semiconductor chip assembly in accordance with a fifth embodiment of the present invention. In the fifth embodiment, the assembly includes a heat sink. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 532 corresponds to routing line 132, etc.

The through-hole (corresponding to through-hole 168) that extends through the insulative base outside the periphery of the chip is omitted. Thus, the terminal (corresponding to terminal 172) that extends downwardly beyond the routing line outside the periphery of the chip is also omitted, and the solder ball (corresponding to solder ball 176) that extends downwardly beyond the routing line is also omitted.

After solder ball 578 is formed on terminal 574, heat sink 584 is mechanically attached to insulative base 540 by adhesive 586. Heat sink 584 is a copper plate with a thickness of 150 microns covered by a nickel coating with a thickness of 2 microns to reduce corrosion. For convenience of illustration, the copper plate and the nickel coating are shown as a single layer. Adhesive 586 is an insulative adhesive with high thermal conductivity such as Hysol QMI 536HT with a thickness of 25 microns between insulative base 540 and heat sink 584. Adhesive 586 contacts and is sandwiched between insulative base 540 and heat sink 584, and extends downwardly beyond insulative base 540. Heat sink 586 is spaced and separated from, electrically isolated from and overlapped by chip 510, routing line 532, insulative base 540, pillar 544 and connection joint 570, and extends downwardly beyond adhesive 586.

Thereafter, insulative base 540, encapsulant 560 and adhesive 586 are cut with an excise blade to singulate the assembly from other assemblies.

Semiconductor chip assembly 598 includes chip 510, routing line 532, insulative base 540, pillar 544, adhesive 554, encapsulant 560, connection joint 570, terminal 574, solder ball 578, heat sink 584 and adhesive 586.

Figure 24A:
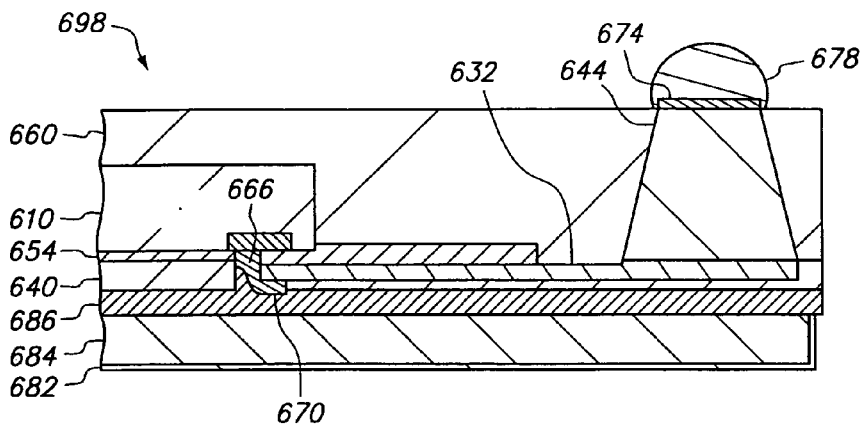
FIGS. 24A, 24B and 24C are cross-sectional, top and bottom views, respectively, of a semiconductor chip assembly in accordance with a sixth embodiment of the present invention.
Figure 24B:
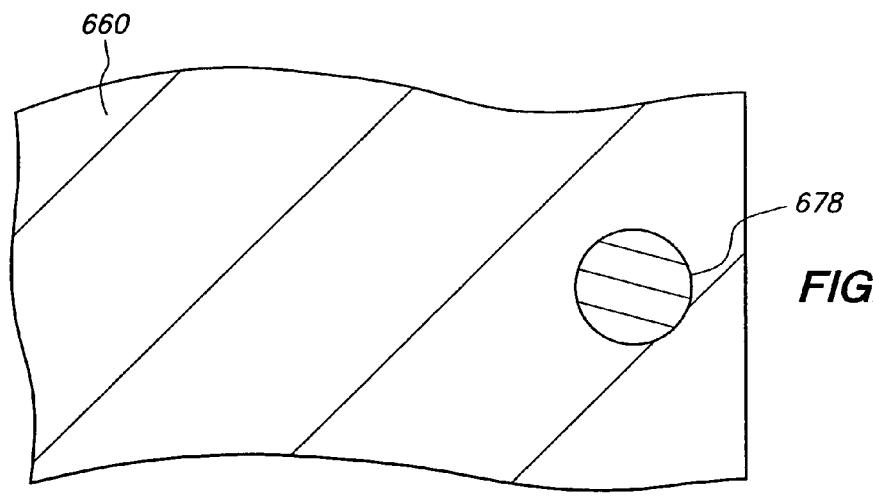
Figure 24C:
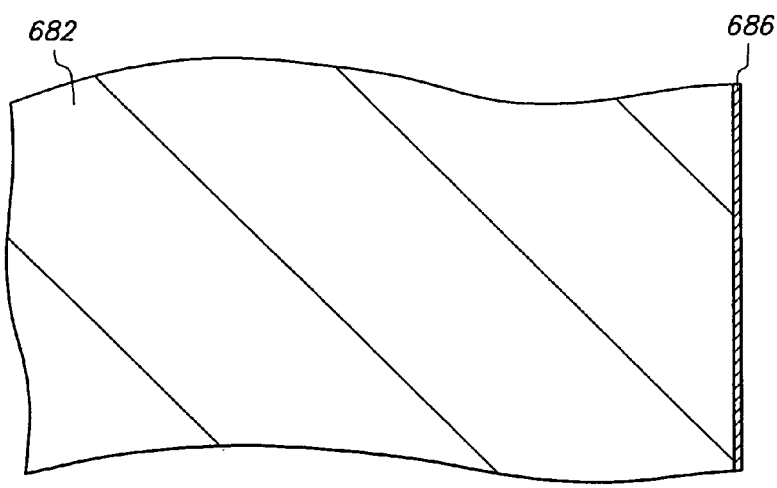

FIGS. 24A, 24B and 24C are cross-sectional, top and bottom views, respectively, of a semiconductor chip assembly in accordance with a sixth embodiment of the present invention. In the sixth embodiment, the assembly includes a heat sink. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, routing line 632 corresponds to routing line 132, etc.

The through-hole (corresponding to through-hole 168) that extends through the insulative base outside the periphery of the chip is omitted. Thus, the terminal (corresponding to terminal 172) that extends downwardly beyond the routing line outside the periphery of the chip is also omitted, and the solder ball (corresponding to solder ball 176) that extends downwardly beyond the routing line is also omitted.

After encapsulant 660 is formed, and before the upper portion of encapsulant 660 is removed to expose pillar 644, the support (corresponding to support 142) is removed, then through-hole 666 is formed, then connection joint 670 is formed, and then heat sink 684 (similar to heat sink 584 without the nickel coating) is mechanically attached to insulative base 640 by adhesive 686 (similar to adhesive 586).

Thereafter, the upper portion of encapsulant 660 is removed to expose pillar 644, then the structure is dipped in an activator solution such as dilute palladium chloride of approximately 0.1 grams of palladium chloride and 5 cubic centimeters of hydrochloric acid per liter of water to render pillar 644 and heat sink 684 catalytic to electroless nickel, then the structure is rinsed in distilled water to remove the palladium from encapsulant 660, and then terminal 674 and metallic coating 682 (similar to metallic coating 482) are electrolessly plated on pillar 644 and heat sink 684, respectively. Terminal 674 and metallic coating 682 are each composed of a buried nickel layer that is 4 microns thick and a gold surface layer that is 1 micron thick. For convenience of illustration, the nickel and gold layers are shown as a single layer.

Thereafter, solder ball 678 is formed on terminal 674, and then insulative base 640, encapsulant 660 and adhesive 686 are cut with an excise blade to singulate the assembly from other assemblies.

Semiconductor chip assembly 698 includes chip 610, routing line 632, insulative base 640, pillar 644, adhesive 654, encapsulant 660, connection joint 670, terminal 674, solder ball 678, metallic coating 682, heat sink 684 and adhesive 686.

Figure 25A:
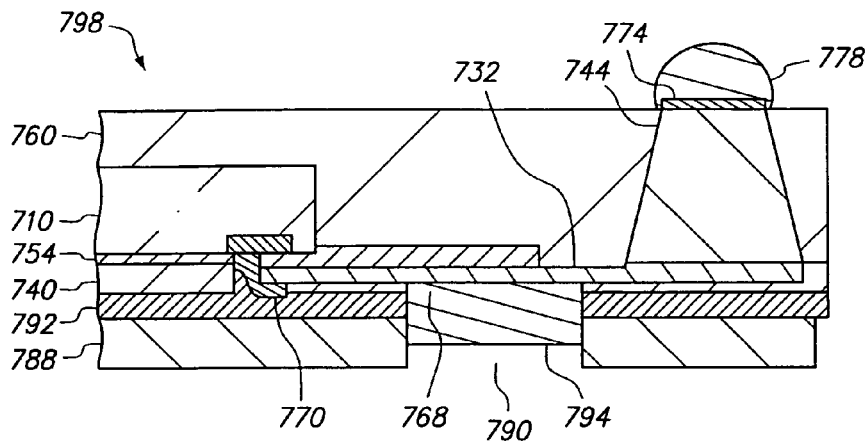
FIGS. 25A, 25B and 25C are cross-sectional, top and bottom views, respectively, of a semiconductor chip assembly in accordance with a seventh embodiment of the present invention.
Figure 25B:
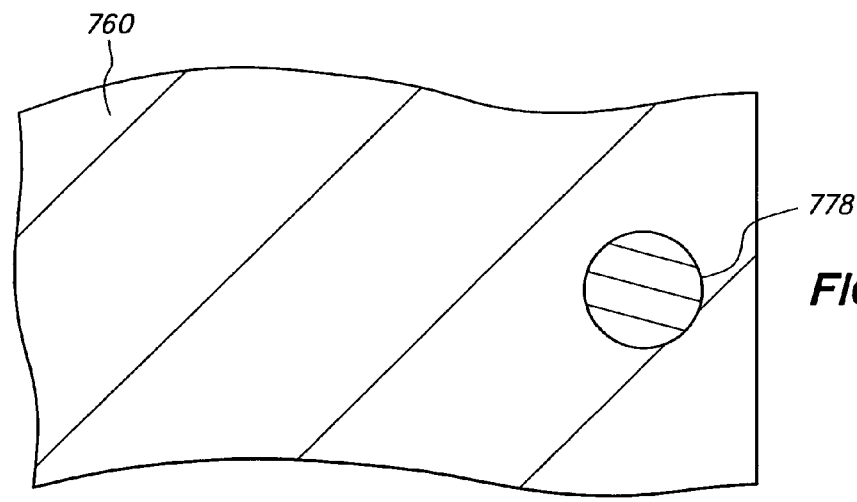
Figure 25C:
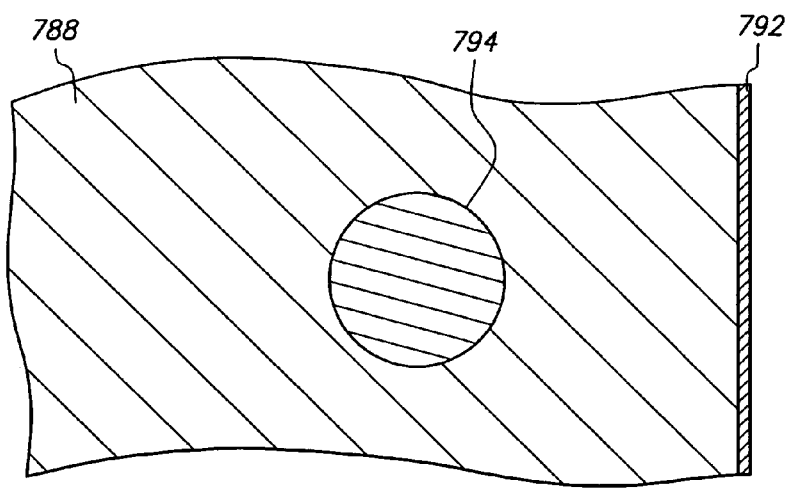

FIGS. 25A, 25B and 25C are cross-sectional, top and bottom views, respectively, of a semiconductor chip assembly in accordance with a seventh embodiment of the present invention. In the seventh embodiment, the assembly includes a ground plane. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 732 corresponds to routing line 132, etc.

Routing line 732 includes a second enlarged circular region positioned laterally between chip 710 and pillar 744.

Through-hole 768 is formed after connection joint 770. Thus, the terminal (corresponding to terminal 172) that extends downwardly beyond the routing line outside the periphery of the chip is omitted, and the solder ball (corresponding to solder ball 176) that extends downwardly beyond the routing line is omitted.

After connection joint 770 and terminal 774 are formed, and before solder ball 778 is formed on terminal 774, ground plane 788 is mechanically attached to insulative base 740 by adhesive 792. Ground plane 788 is a copper plate with a thickness of 150 microns that contains opening 790. Adhesive 792 is an insulative adhesive with high thermal conductivity such as Hysol QMI 536HT and a thickness of 25 microns between insulative base 740 and ground plane 788. Adhesive 792 contacts and is sandwiched between insulative base 740 and ground plane 788, and extends downwardly beyond insulative base 740. Ground plane 788 is spaced and separated from and overlapped by chip 710, routing line 732, insulative base 740, pillar 744 and connection joint 770, and extends downwardly beyond adhesive 792. Furthermore, opening 790 is vertically aligned with and centered relative to the second enlarged circular region of routing line 732.

Thereafter, through-hole 768 is formed through insulative base 740 and adhesive 792 and exposes the second enlarged circular region of routing line 732. Through-hole 768 is formed in essentially the same manner as through-hole 168. Namely, the laser drills through and removes portions of insulative base 740 and adhesive 792 within the surface area of opening 790, thereby effecting a pattern transfer of opening 790 through insulative base 740 and adhesive 792 to routing line 732. A brief cleaning step can then be applied to remove oxides and debris that may be present on the exposed portion of routing line 732.

Thereafter, solder paste is deposited into through-hole 768, solder ball 778 is deposited on terminal 774, and then the solder paste and solder ball 778 are heated and reflowed. The solder paste cools and solidifies into a hardened solder joint that provides interconnect 794 that contacts and electrically connects routing line 732 and ground plane 788 in through-hole 768 and opening 790.

Thereafter, insulative base 740, encapsulant 760 and adhesive 792 are cut with an excise blade to singulate the assembly from other assemblies.

Semiconductor chip assembly 798 includes chip 710, routing line 732, insulative base 740, pillar 744, adhesive 754, encapsulant 760, connection joint 770, terminal 774, solder ball 778, ground plane 788, adhesive 792 and interconnect 794.

Figure 26A:
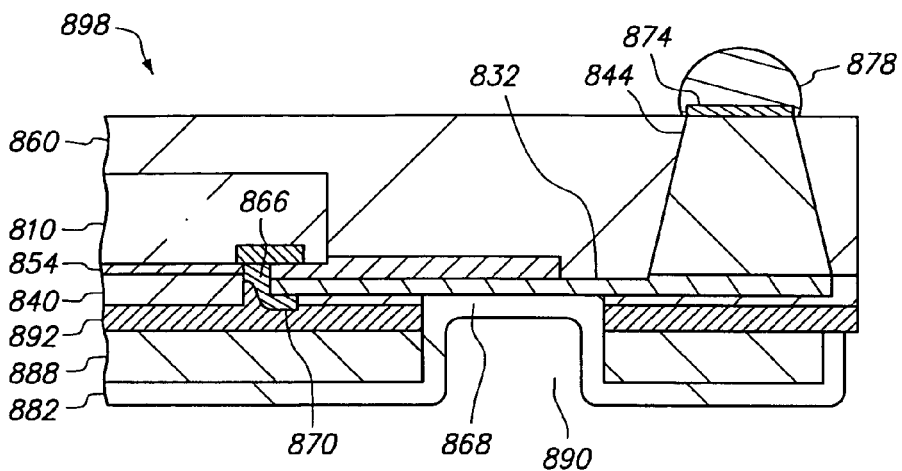
FIGS. 26A, 26B and 26C are cross-sectional, top and bottom views, respectively, of a semiconductor chip assembly in accordance with an eighth embodiment of the present invention.
Figure 26B:
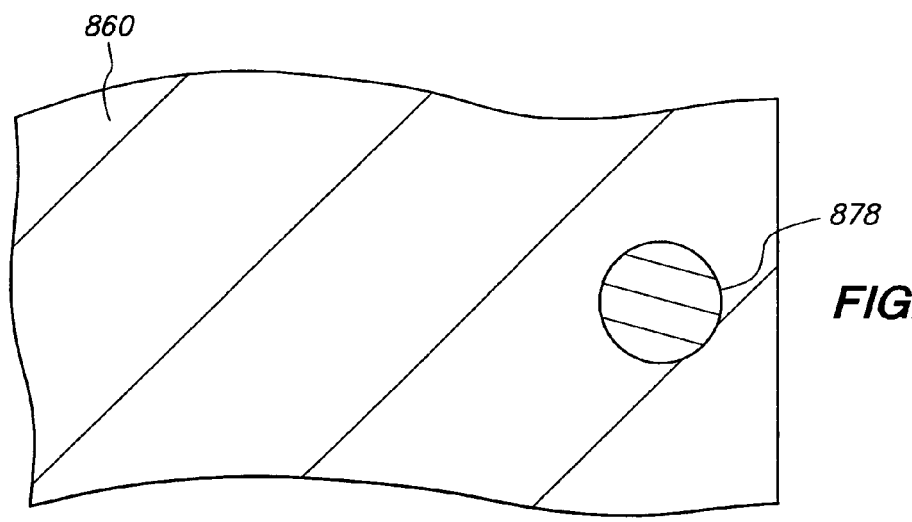
Figure 26C:
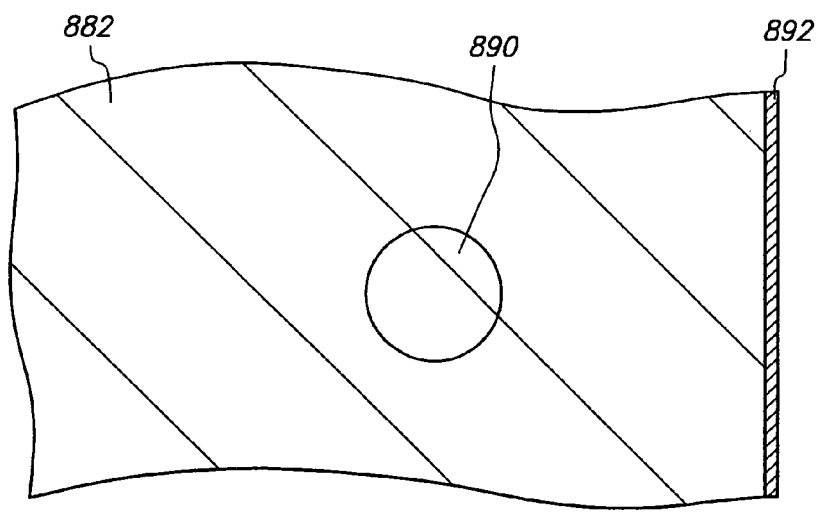

FIGS. 26A, 26B and 26C are cross-sectional, top and bottom views, respectively, of a semiconductor chip assembly in accordance with an eighth embodiment of the present invention. In the eighth embodiment, the assembly includes a ground plane. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 832 corresponds to routing line 132, etc.

Routing line 832 includes a second enlarged circular region positioned laterally between chip 810 and pillar 844.

Through-hole 868 is formed after connection joint 870. Thus, the terminal (corresponding to terminal 172) that extends downwardly beyond the routing line outside the periphery of the chip is omitted, and the solder ball (corresponding to solder ball 176) that extends downwardly beyond the routing line is omitted.

After encapsulant 860 is formed, and before the upper portion of encapsulant 860 is removed to expose pillar 844, the support (corresponding to support 142) is removed, then through-hole 866 is formed, then connection joint 870 is formed, then ground plane 888 (similar to ground plane 788) is mechanically attached to insulative base 840 by adhesive 892 (similar to adhesive 792), and then through-hole 868 (similar to through-hole 768) is formed through insulative base 840 and adhesive 892.

Thereafter, the upper portion of encapsulant 860 is removed to expose pillar 844, then the structure is dipped in an activator solution such as dilute palladium chloride of approximately 0.1 grams of palladium chloride and 5 cubic centimeters of hydrochloric acid per liter of water to render routing line 832, pillar 844 and ground plane 888 catalytic to electroless nickel, then the structure is rinsed in distilled water to remove the palladium from encapsulant 860, and then terminal 874 is electrolessly plated on pillar 844, and metallic coating 882 (similar to metallic coating 482) is electrolessly plated on routing line 832 and ground plane 892. Terminal 874 and metallic coating 882 are each composed of a buried nickel layer that is 35 microns thick and a gold surface layer that is 1 micron thick. For convenience of illustration, the nickel and gold layers are shown as a single layer. Furthermore, metallic coating 882 contacts and electrically connects routing line 832 and ground plane 888 in through-hole 868 and opening 890.

Thereafter, solder ball 878 is formed on terminal 874, and then insulative base 840, encapsulant 860 and adhesive 892 are cut with an excise blade to singulate the assembly from other assemblies.

Semiconductor chip assembly 898 includes chip 810, routing line 832, insulative base 840, pillar 844, adhesive 854, encapsulant 860, connection joint 870, terminal 874, solder ball 878, metallic coating 882, ground plane 888 and adhesive 892.

Figure 27A:
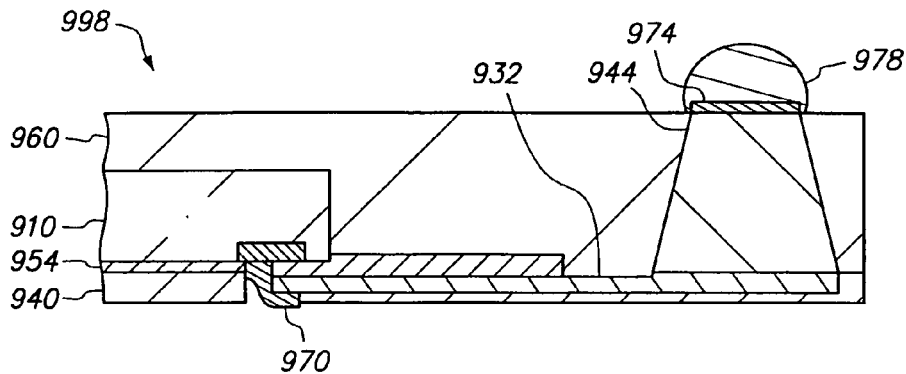
FIGS. 27A, 27B and 27C are cross-sectional, top and bottom views, respectively, of a semiconductor chip assembly in accordance with a ninth embodiment of the present invention.
Figure 27B:
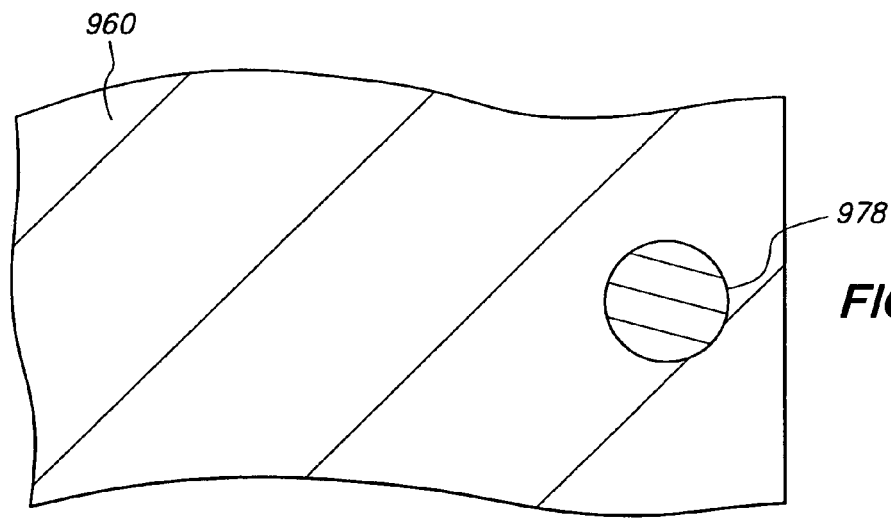
Figure 27C:
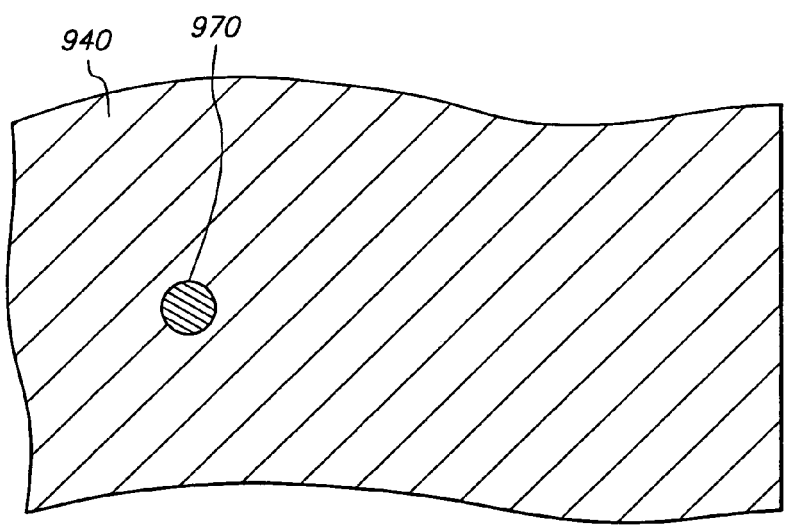

FIGS. 27A, 27B and 27C are cross-sectional, top and bottom views, respectively, of a semiconductor chip assembly in accordance with a ninth embodiment of the present invention. In the ninth embodiment, the downwardly extending terminal and solder ball are omitted. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 932 corresponds to routing line 132, etc.

The through-hole (corresponding to through-hole 168) that extends through the insulative base outside the periphery of the chip is omitted. Thus, the terminal (corresponding to terminal 172) that extends downwardly beyond the routing line outside the periphery of the chip is also omitted, and the solder ball (corresponding to solder ball 176) that extends downwardly beyond the routing line is also omitted.

Semiconductor chip assembly 998 includes chip 910, routing line 932, insulative base 940, pillar 944, adhesive 954, encapsulant 960, connection joint 970, terminal 974 and solder ball 978.

Figure 28A:
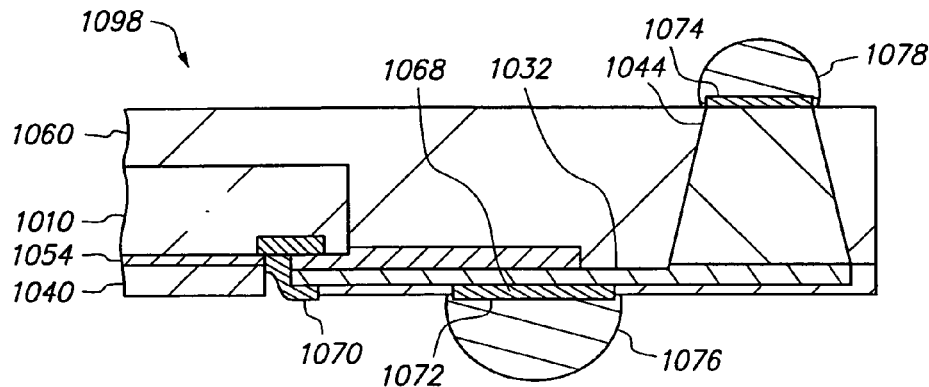
FIGS. 28A, 28B and 28C are cross-sectional, top and bottom views, respectively, of a semiconductor chip assembly in accordance with a tenth embodiment of the present invention.
Figure 28B:
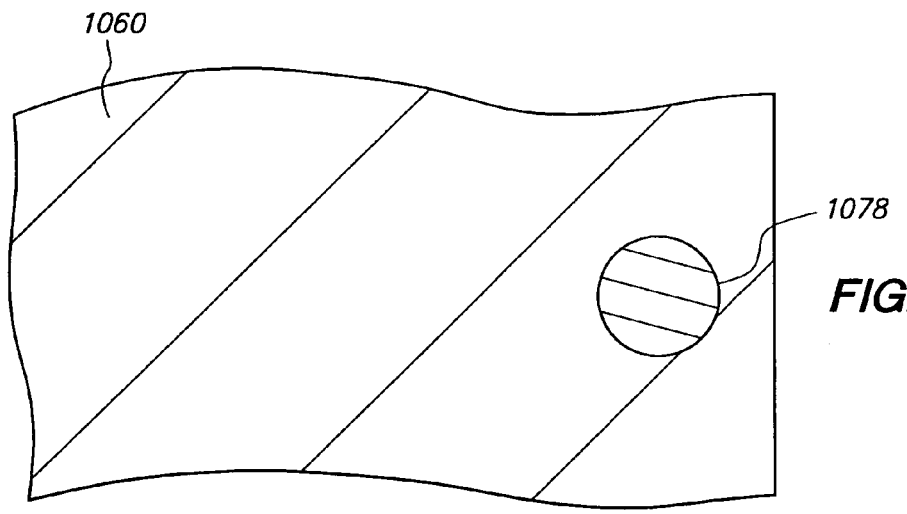
Figure 28C:
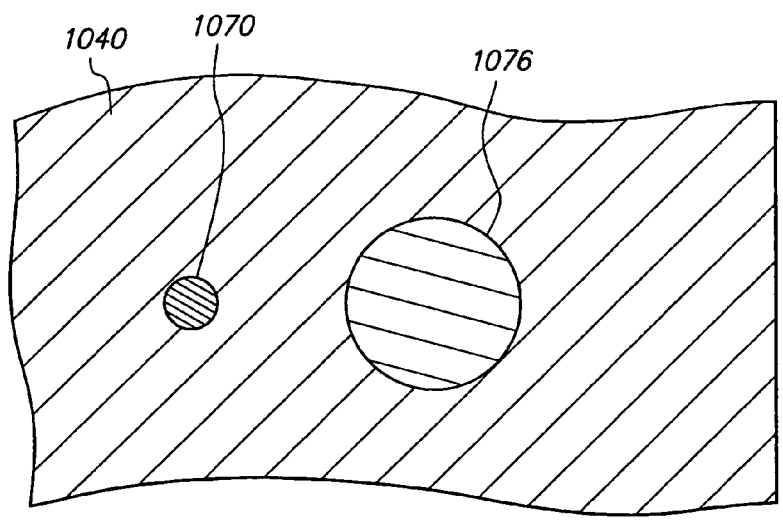

FIGS. 28A, 28B and 28C are cross-sectional, top and bottom views, respectively, of a semiconductor chip assembly in accordance with a tenth embodiment of the present invention. In the tenth embodiment, the terminals and are not vertically aligned with one another. For purposes of brevity, any description in the first embodiment is incorporated herein insofar as the same is applicable, and the same description need not be repeated. Likewise, elements of the tenth embodiment similar to those in the first embodiment have corresponding reference numerals indexed at ten-hundred rather than one-hundred. For instance, chip 1010 corresponds to chip 110, routing line 1032 corresponds to routing line 132, etc.

Routing line 1032 includes a second enlarged circular region positioned laterally between chip 1010 and pillar 1044, and through-hole 1068 is vertically aligned with and centered relative to the second enlarged circular region. As a result, terminal 1072 and solder ball 1076 are positioned laterally between chip 1010 and pillar 1044, and therefore, laterally offset from and not vertically aligned with terminal 1074 and solder ball 1078.

Semiconductor chip assembly 1098 includes chip 1010, routing line 1032, insulative base 1040, pillar 1044, adhesive 1054, encapsulant 1060, connection joint 1070, terminals 1072 and 1074 and solder balls 1076 and 1078.

Figure 29A:
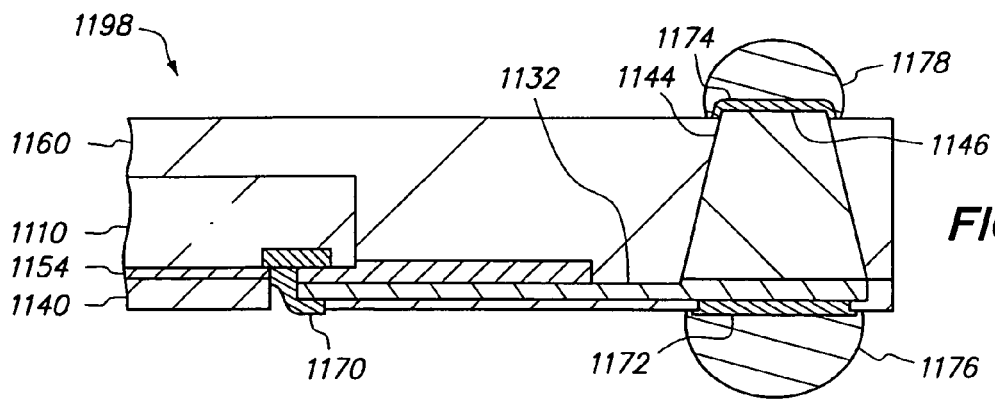
FIGS. 29A, 29B and 29C are cross-sectional, top and bottom views, respectively, of a semiconductor chip assembly in accordance with an eleventh embodiment of the present invention.
Figure 29B:
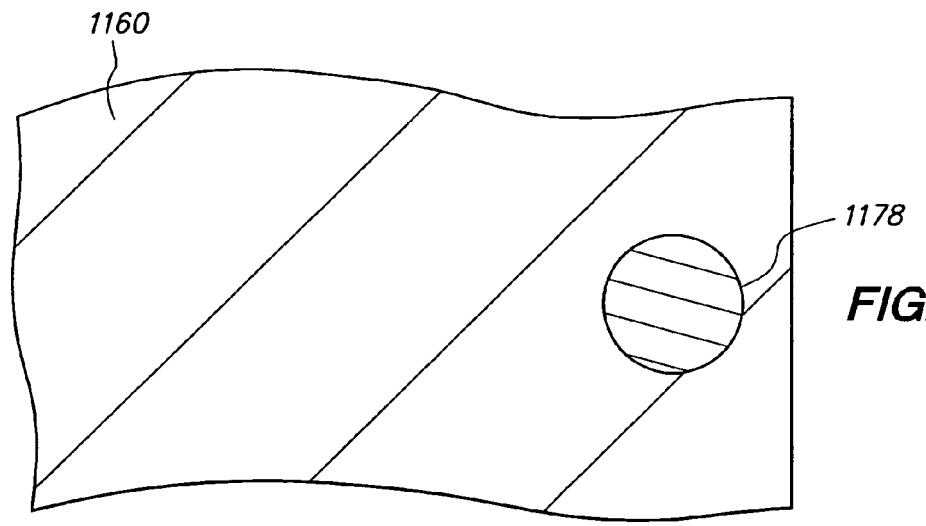
Figure 29C:
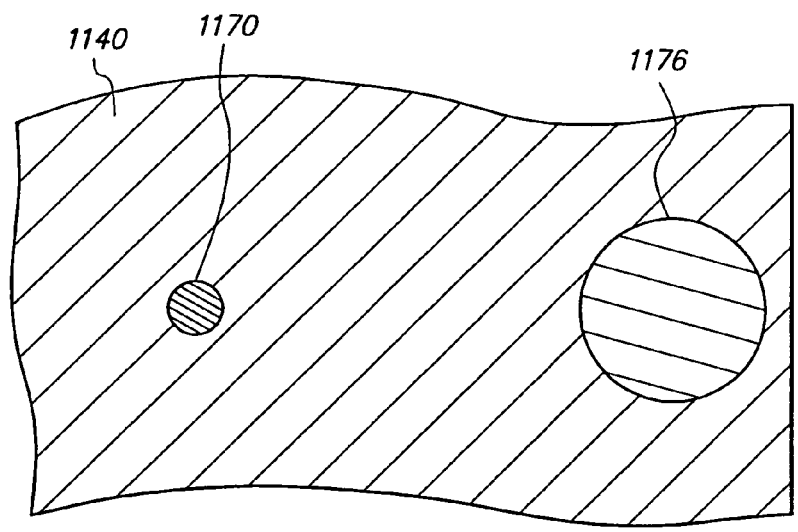

FIGS. 29A, 29B and 29C are cross-sectional, top and bottom views, respectively, of a semiconductor chip assembly in accordance with an eleventh embodiment of the present invention. In the eleventh embodiment, the encapsulant is formed to not cover the pillar. For purposes of brevity, any description in the first embodiment is incorporated herein insofar as the same is applicable, and the same description need not be repeated. Likewise, elements of the eleventh embodiment similar to those in the first embodiment have corresponding reference numerals indexed at eleven-hundred rather than one-hundred. For instance, chip 1110 corresponds to chip 110, routing line 1132 corresponds to routing line 132, etc.

Encapsulant 1160 is deposited on chip 1110, insulative base 1140, pillar 1144 and adhesive 1154 by transfer molding. However, encapsulant 1160 does not cover pillar 1144. Instead, surface 1146 of pillar 1144 is exposed. This is accomplished by providing the upper mold section with a recess and inserting an upper portion of pillar 1144 that includes surface 1146 of pillar 1144 into the recess while a lower portion of pillar 1144 is outside the recess such that a small gap (less than 20 microns) arises between the upper mold portion and the upper portion of pillar 1144 in the recess. The gap is large enough to prevent the upper mold section from striking pillar 1144 despite minor registration and alignment inaccuracies, and pillar 1144 remains spaced and separated from the upper mold section. However, the recess is generally shaped like and only slightly larger than the upper portion of pillar 1144, and the upper mold section contours to and shrouds the upper portion of pillar 1144. The molding compound does not flow through the small gap during transfer molding. As a result, encapsulant 1160 does not contact or cover the upper portion of pillar 1144. Furthermore, pillar 1144 extends upwardly beyond encapsulant 1160.

The upper portion of encapsulant 1160 is not removed since surface 1146 of pillar 1144 is never covered by encapsulant 1160.

Semiconductor chip assembly 1198 includes chip 1110, routing line 1132, insulative base 1140, pillar 1144, adhesive 1154, encapsulant 1160, connection joint 1170, terminals 1172 and 1174 and solder balls 1176 and 1178.

Figure 30A:
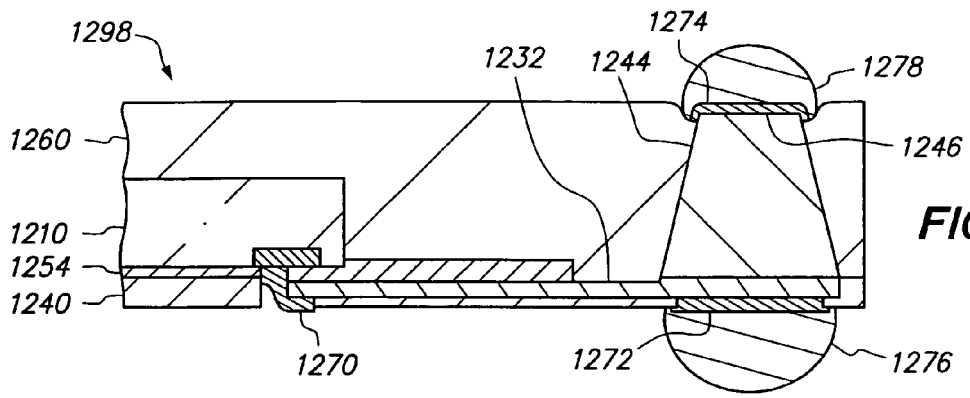
FIGS. 30A, 30B and 30C are cross-sectional, top and bottom views, respectively, of a semiconductor chip assembly in accordance with a twelfth embodiment of the present invention.
Figure 30B:
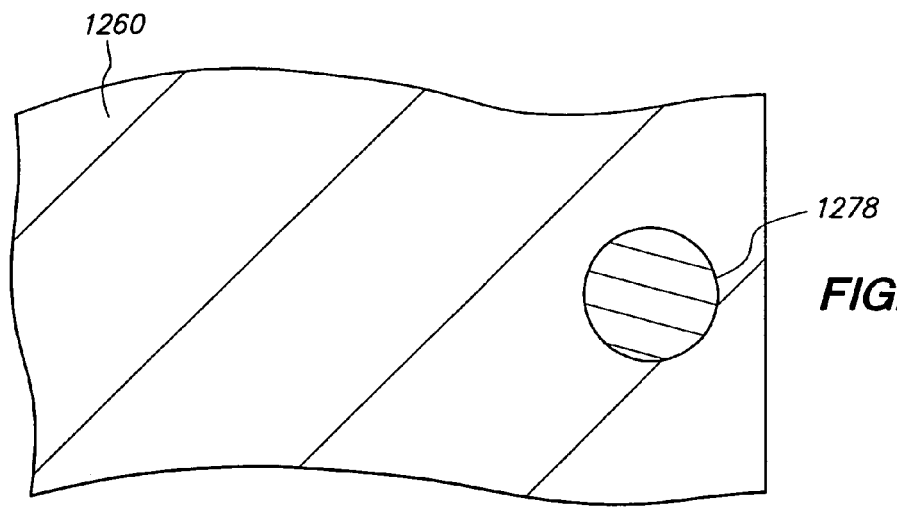
Figure 30C:
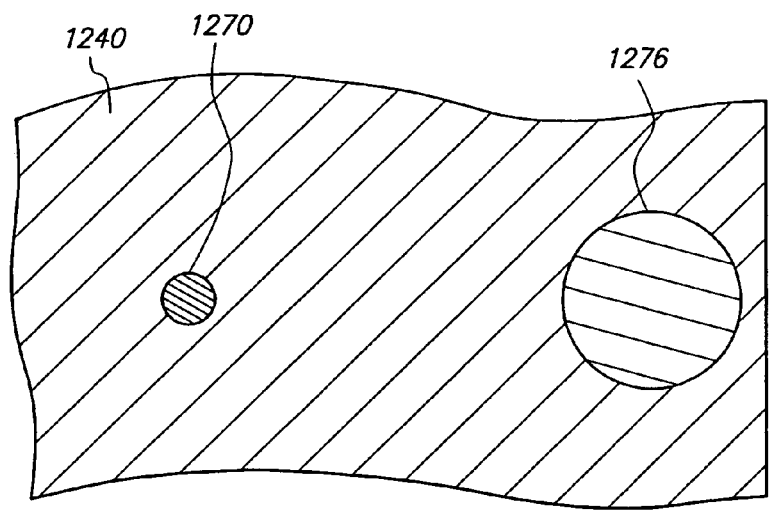

FIGS. 30A, 30B and 30C are cross-sectional, top and bottom views, respectively, of a semiconductor chip assembly in accordance with a twelfth embodiment of the present invention. In the twelfth embodiment, the encapsulant is formed to not cover the pillar. For purposes of brevity, any description in the first embodiment is incorporated herein insofar as the same is applicable, and the same description need not be repeated. Likewise, elements of the twelfth embodiment similar to those in the first embodiment have corresponding reference numerals indexed at twelve-hundred rather than one-hundred. For instance, chip 1210 corresponds to chip 110, routing line 1232 corresponds to routing line 132, etc.

Encapsulant 1260 is deposited on chip 1210, insulative base 1240, pillar 1244 and adhesive 1254 by transfer molding. However, encapsulant 1260 does not cover pillar 1244. Instead, surface 1246 of pillar 1244 is exposed. This is accomplished by positioning surface 1246 of pillar 1244 in close proximity to the upper mold section such that a small gap (less than 20 microns) arises between the upper mold section and surface 1246 of pillar 1244. The gap is large enough to prevent the upper mold section from striking pillar 1244 despite minor registration and alignment inaccuracies, and pillar 1244 remains spaced and separated from the upper mold section. The molding compound does not flow through the small gap during transfer molding. As a result, encapsulant 1260 does not contact or cover surface 1246 of pillar 1244. Furthermore, encapsulant 1260 extends upwardly beyond pillar 1244.

The upper portion of encapsulant 1260 is not removed since surface 1246 of pillar 1244 is never covered by encapsulant 1260.

Semiconductor chip assembly 1298 includes chip 1210, routing line 1232, insulative base 1240, pillar 1244, adhesive 1254, encapsulant 1260, connection joint 1270, terminals 1272 and 1274 and solder balls 1276 and 1278.

Figure 31A:
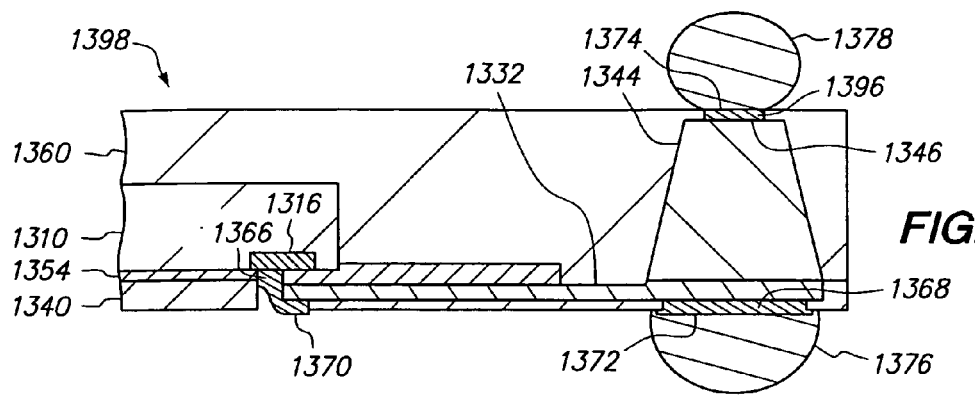
FIGS. 31A, 31B and 31C are cross-sectional, top and bottom views, respectively, of a semiconductor chip assembly in accordance with a thirteenth embodiment of the present invention.
Figure 31B:
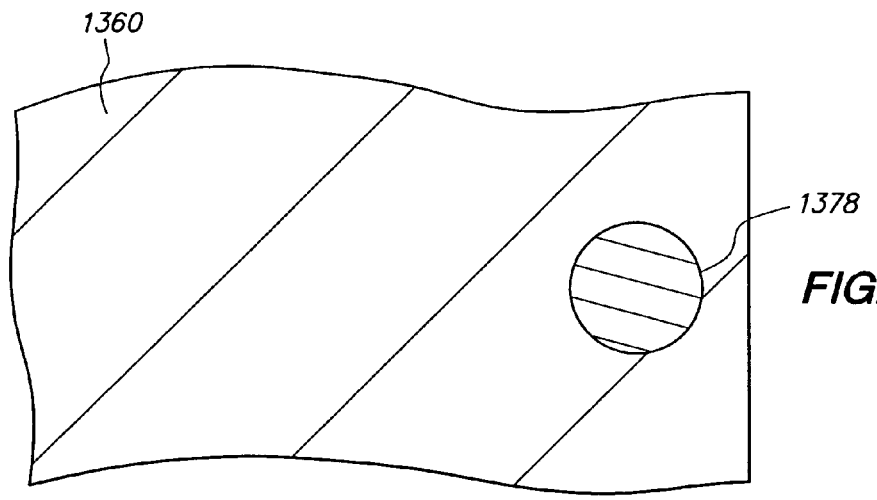
Figure 31C:
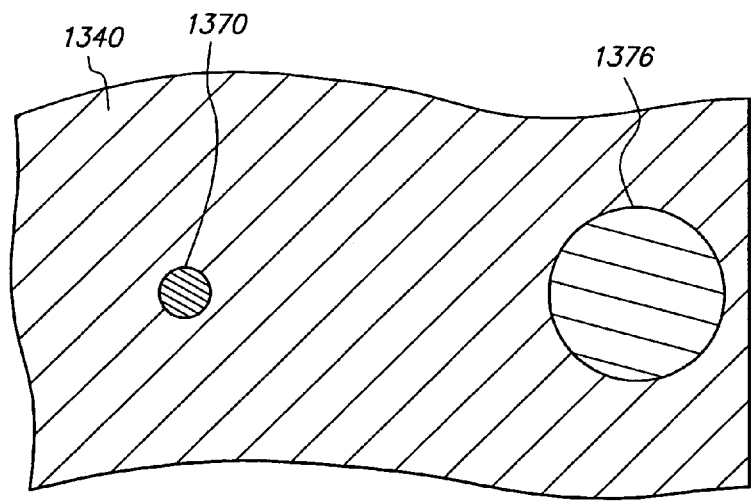

FIGS. 31A, 31B and 31C are cross-sectional, top and bottom views, respectively, of a semiconductor chip assembly in accordance with a thirteenth embodiment of the present invention. In the thirteen embodiment, the encapsulant is selectively etched to expose the pillar. For purposes of brevity, any description in the first embodiment is incorporated herein insofar as the same is applicable, and the same description need not be repeated. Likewise, elements of the thirteenth embodiment similar to those in the first embodiment have corresponding reference numerals indexed at thirteen-hundred rather than one-hundred. For instance, chip 1310 corresponds to chip 110, routing line 1332 corresponds to routing line 132, etc.

Encapsulant 1360 is initially an epoxy in paste form that includes an epoxy resin, a curing agent and an accelerator. The epoxy paste is deposited over the structure using stencil printing, then the epoxy paste is cured or hardened at a relatively low temperature in the range of 100 to 250° C. to form a solid adherent insulator. Encapsulant 1360 extends vertically beyond pillar 1344 by 20 microns. Furthermore, encapsulant 1360 is more susceptible to laser ablation than encapsulant 160 since encapsulant 1360 is composed of epoxy without a filler whereas encapsulant 160 is composed of molding compound with a filler.

Thereafter, instead of removing the upper portion of encapsulant 1360 by grinding, a portion of encapsulant 1360 is selectively removed to form opening 1396 that exposes surface 1346 of pillar 1344.

Opening 1396 is formed by applying a suitable etch that is highly selective of encapsulant 1360 with respect to pillar 1344. In this instance, a selective TEA $CO_2$ laser etch is applied using multiple laser direct writes. The laser is directed at surface 1346 of pillar 1344. The laser has a spot size of 150 microns, and surface 1346 has a diameter of 300 microns. Furthermore, the laser direct writes are offset relative to one another yet overlap so that the laser scans a central portion of surface 1346 with a diameter of 200 microns. In this manner, the laser direct writes in combination are vertically aligned with and centered relative to surface 1346. As a result, the laser strikes pillar 1344, a portion of encapsulant 1360 that covers pillar 1344, and ablates encapsulant 1360.

The laser drills through and removes a portion of encapsulant 1360. However, a portion of encapsulant 1360 that extends across the peripheral edges of surface 1346 is outside the scope of the laser and remains intact. Thus, encapsulant 1360 continues to contact but no longer covers surface 1346.

Thereafter, a brief cleaning step can be applied to remove oxides and debris that may be present on the exposed portion of pillar 1344. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of pillar 1344 without damaging the structure. Likewise, the cleaning step can clean the exposed portions of pad 1316 and routing line 1332 in through-hole 1366 and the exposed portion of routing line 1332 in through-hole 1368 as well as the exposed portion of pillar 1344 in opening 1396 in which case separate cleaning steps for pad 1316 and routing line 1332 after through-holes 1366 and 1368 are formed can be omitted.

Opening 1396 is formed in and extends vertically into but not through encapsulant 1360, is disposed outside the periphery of chip 1310, is vertically aligned with and exposes surface 1346 of pillar 1344, is spaced from routing line 1332, adhesive 1354 and through-holes 1366 and 1368 and has a diameter of 200 microns.

Opening 1396 is formed without damaging or extending into pillar 1344. Opening 1396 may have a diameter that is slightly larger than 200 microns due to the beam angle of the laser, the thermal effects of the laser, and/or the isotropic nature of an oxygen plasma or wet chemical cleaning step. For convenience of explanation, this slight enlargement is ignored.

Thereafter, connection joint 1370 and terminals 1372 and 1374 are formed. Although terminal 1374 extends upwardly beyond pillar 1344, terminal 1374 is disposed in opening 1396. Thus, encapsulant 1360 extends upwardly beyond terminal 1374.

Thereafter, solder balls 1376 and 1378 are formed on terminals 1372 and 1374, respectively. Solder ball 1378 extends within and outside opening 1396 and extends upwardly beyond encapsulant 1360.

Semiconductor chip assembly 1398 includes chip 1310, routing line 1332, insulative base 1340, pillar 1344, adhesive 1354, encapsulant 1360, connection joint 1370, terminals 1372 and 1374 and solder balls 1376 and 1378.

Figure 32A:
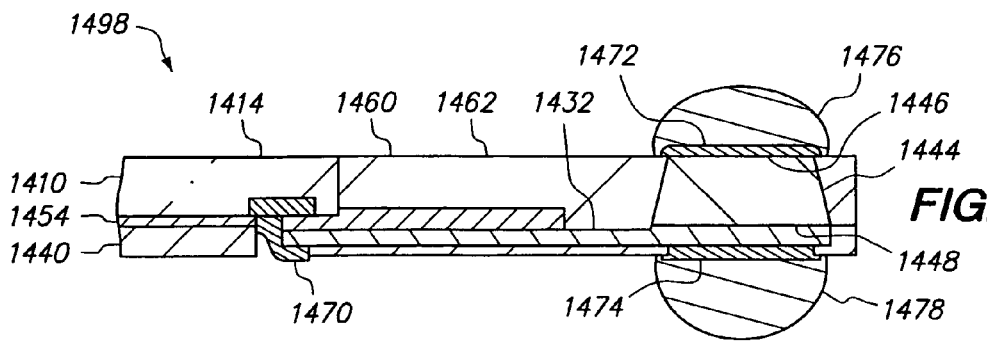
FIGS. 32A, 32B and 32C are cross-sectional, top and bottom views, respectively, of a semiconductor chip assembly in accordance with a fourteenth embodiment of the present invention.
Figure 32B:
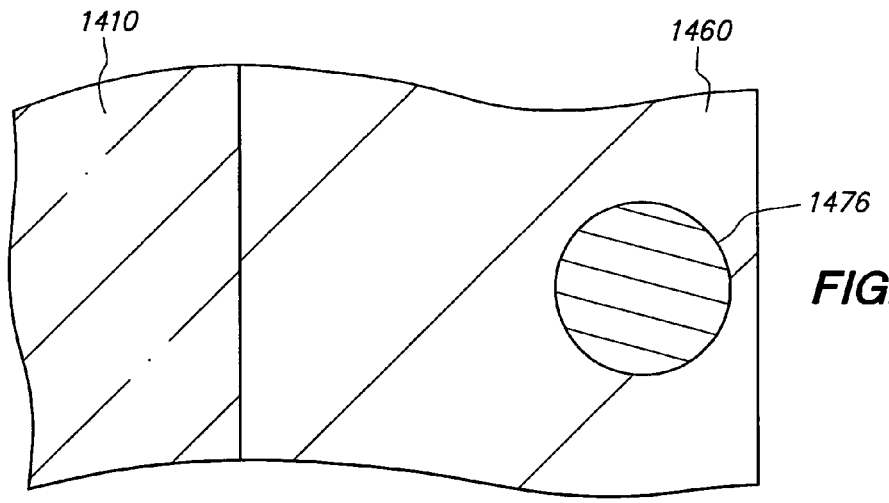
Figure 32C:
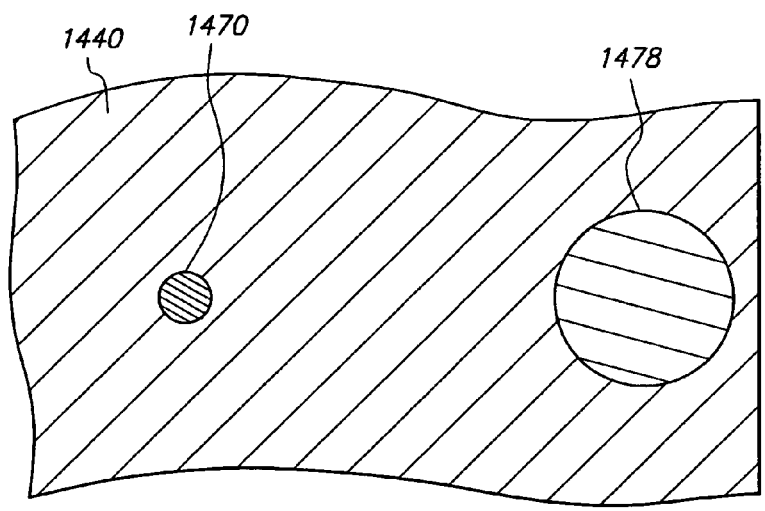

FIGS. 32A, 32B and 32C are cross-sectional, top and bottom views, respectively, of a semiconductor chip assembly in accordance with a fourteenth embodiment of the present invention. In the fourteen embodiment, the chip is exposed. For purposes of brevity, any description in the first embodiment is incorporated herein insofar as the same is applicable, and the same description need not be repeated. Likewise, elements of the fourteenth embodiment similar to those in the first embodiment have corresponding reference numerals indexed at fourteen-hundred rather than one-hundred. For instance, chip 1410 corresponds to chip 110, routing line 1432 corresponds to routing line 132, etc.

The grinding is applied longer than in the first embodiment and removes portions of chip 1410, pillar 1444 and encapsulant 1460. Initially, the diamond sand wheel grinds only encapsulant 1460. As the grinding continues, encapsulant 1460 becomes thinner as surface 1462 migrates downwardly. Eventually the diamond sand wheel contacts pillar 1444, and as a result, begins to grind pillar 1444 as well. As the grinding continues, pillar 1444 and encapsulant 1460 become thinner as surfaces 1446 and 1462 migrate downwardly. However, the grinding does not halt before it reaches chip 1410. Instead, the grinding continues and eventually the diamond sand wheel contacts chip 1410, and as a result, begins to grind chip 1410 as well. As the grinding continues, chip 1410, pillar 1444 and encapsulant 1460 become thinner as surfaces 1414,1446 and 1462 migrate downwardly. The grinding continues until chip 1410, pillar 1444 and encapsulant 1460 have the desired thickness, and then halts before it reaches active circuitry in chip 1410, routing line 1432, insulative base 1440 or adhesive 1454. Thereafter, the structure is rinsed in distilled water to remove contaminants.

The grinding removes a 50 micron thick upper portion of chip 1410 (at the back-side of the inverted chip 1410), a 150 micron thick upper portion of pillar 1444 and a 250 micron thick upper portion of encapsulant 1460. As a result, the height of pillar 1444 decreases to 100 microns (250–150), the diameter of surface 1446 increases to 420 microns (300+(500–300)(150/250)), and the surface area of surface 1446 increases to 71 percent as large as the surface area of surface 1448, that is, 29 percent smaller than the surface area of surface 1448 ((196,250–138,475)/196,250).

Chip 1410 and pillar 1444 remain embedded in encapsulant 1460. Surface 1414 of chip 1410, surface 1446 of pillar 1444 and surface 1462 of encapsulant 1460 are laterally aligned with one another and exposed. Thus, an exposed planarized horizontal surface that faces upwardly includes surfaces 1414,1446 and 1462. Furthermore, chip 1410 and pillar 1444 extend through surface 1462 of encapsulant 1460, and encapsulant 1460 no longer contacts or covers surface 1414 of chip 1410 or surface 1446 of pillar 1444.

Semiconductor chip assembly 1498 includes chip 1410, routing line 1432, insulative base 1440, pillar 1444, adhesive 1454, encapsulant 1460, connection joint 1470, terminals 1472 and 1474 and solder balls 1476 and 1478.

The semiconductor chip assemblies described above are merely exemplary. Numerous other embodiments are contemplated. For instance, the support, the terminals and/or the solder balls can be omitted. In addition, the embodiments described above can generally be combined with one another. For instance, the heat sinks in the fifth and sixth embodiments and the ground planes in the seventh and eighth embodiments can be used in the first, second, third and fourth embodiments. Likewise, the conductive trace with a single terminal and solder ball in the ninth embodiment and the laterally offset terminals in the tenth embodiment can be used in the first, second, third and fourth embodiments. Likewise, the encapsulants in the eleventh, twelfth and thirteenth embodiments can used in the first, second, third and fourth embodiments, and the encapsulant in the fourteenth embodiment can be used in the first, second and third embodiments. However, the encapsulant in the fourteenth embodiment cannot be used in the fourth embodiment since the chip's active surface should not be grinded. The embodiments described above can be mixed-and-matched with one another and with other embodiments depending on design and reliability considerations.

The metal base can be various metals such as copper, copper alloys, nickel, iron-nickel alloys, aluminum, and so on, and can be a single layer or multiple layers.

The etch mask can be a wide variety of materials including copper, gold, nickel, palladium, tin, solder, photoresist and epoxy, can be formed by a wide variety of processes including electroplating, electroless plating, printing, reflowing and curing, and can have a wide variety of shapes and sizes. The etch mask can be deposited on the metal base before, during or after the routing line is deposited on the metal base, can be disposed on a planar top surface of the metal base or a recess in the metal base, and if disposed in a recess need not necessarily fill the recess. Furthermore, the etch mask can remain permanently attached to the pillar or be removed after the pillar is formed.

The etch mask is undercut by a wet chemical etch that forms the pillar but can subsequently be confined to the tip of the pillar, for instance by dislodging a portion of the etch mask outside the tip of the pillar by mechanical brushing, sand blasting, air blowing or water rinsing, or by reflowing a solder etch mask when the pillar does not provide a wettable surface. Alternatively, a solder etch mask can be reflowed to conformally coat the entire pillar and contact the insulative base, for instance by depositing flux on the pillar so that the pillar provides a wettable surface before the solder reflow operation.

Figure 33:
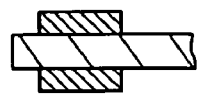
FIGS. 33–37 are bottom plan views of routing line variations in accordance with the present invention.
Figure 34:
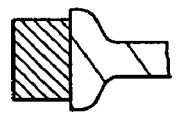
Figure 35:
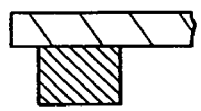
Figure 36:
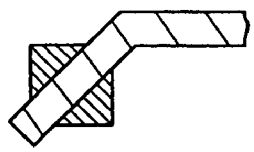
Figure 37:
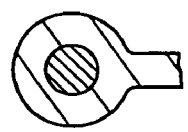

The routing line can have various shapes and sizes. The routing line can extend across various portions of the pad, such as one peripheral edge and the center of the pad (FIG. 11E), two opposing peripheral edges and the center of the pad (FIG. 33), three peripheral edges but not the center of the pad (FIGS. 34 and 35), two corners and the center of the pad (FIG. 36) or four peripheral edges but not the center of the pad (FIG. 37).

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in as well as fan-out.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and form the pillar without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds.

The conductive trace can function as a signal, power or ground layer depending on the purpose of the associated chip pad.

The pad can have numerous shapes including a flat rectangular shape and a bumped shape. For instance, a bump-shaped pad may extend into the through-hole. The pad can either be partially or completely exposed prior to forming the connection joint. The pad can have a length and width that are larger than, equal to, or smaller than the diameter of the through-hole. Preferably, a substantial portion of the pad is directly above the through-hole. If desired, the pad can be treated to accommodate the connection joint.

Numerous adhesives can be applied to mechanically attach the chip to the routing line and the pillar. For instance, the adhesive can be applied as a paste, a laminated layer, or a liquid applied by screen-printing, spin-on, or spray-on. The adhesive can be a single layer that is applied to the insulative base and then contacted to the chip or a single layer that is applied to the chip and then contacted to the insulative base. Similarly, the adhesive can be multiple layers with a first layer applied to the insulative base, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The through-hole that exposes the pad can be formed either before or after mechanically attaching the chip to the routing line and the pillar. For instance, the adhesive can be applied as a liquid or paste (A stage) over the insulative base and the routing line, the adhesive can be partially cured (B stage), an etch can form the through-hole in the insulative base and the adhesive, the partially cured adhesive can be brought into contact with the chip, and then the adhesive can be fully cured (C stage). Alternatively, the liquid or paste adhesive can be sandwiched between the chip and the insulative base and the routing line, the adhesive can be fully cured thereby mechanically fastening the chip to the routing line and the pillar, and then an etch can form the through-hole in the insulative base and the adhesive.

The through-holes can be formed using laser ablation (including laser direct write without a mask and projection laser ablation with a mask) or plasma etching. Similarly, the through-holes can be formed by a combination of laser ablation and plasma etching. See, for instance, U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference. In addition, the through-holes can be formed simultaneously or in sequence.

The through-holes can have a circular, ovular, square, rectangular or other shape (as viewed from the bottom surface of the insulative base). The through-hole within the periphery of the chip can be aligned with and expose a single pad or multiple pads and may expose one or more peripheral edges of the pad or just a central portion of the pad spaced from the peripheral edges of the pad. Likewise, the through-hole outside the periphery of the chip can be aligned with and expose a single routing line or multiple routing lines and may expose one or more peripheral edges of the routing line or just a central portion of the routing line spaced from the peripheral edges of the routing line. Furthermore, the through-holes can have a wide variety of shapes and slopes including vertical sidewalls, tapered sidewalls, continuous sidewalls and stepped sidewalls.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W.L. Gore & Associates of Eau Claire, Wis. are suitable.

The insulative base can be deposited in numerous manners, including printing and transfer molding. Furthermore, the insulative base can be deposited on and contact the metal base and the routing line without contacting the support, then contact the support as the metal base and the routing line are mounted on the support and then be fully cured, or alternatively, the insulative base can be deposited on and contact the support without contacting the metal base or the routing line, then contact the metal base and the routing line as the metal base and the routing line are mounted on the support and then be fully cured.

The encapsulant can be deposited using a wide variety of techniques including printing and transfer molding. For instance, the encapsulant can be printed on the chip and the pillar as an epoxy paste and then cured or hardened to form a solid adherent protective layer. The encapsulant can be any of the adhesives mentioned above. Moreover, the encapsulant need not necessarily contact the chip or the pillar. For instance, a glob-top coating can be deposited on the chip after mechanically attaching the chip to the routing line and the pillar, and then the encapsulant can be formed on the glob-top coating. Likewise, a metallic coating can be deposited on the pillar, and then the encapsulant can be formed on the metallic coating.

The encapsulant can have its upper portion removed using a wide variety of techniques including grinding (including mechanical polishing and chemical-mechanical polishing), blanket laser ablation and blanket plasma etching. Likewise, the encapsulant can have a selected portion above the pillar removed using a wide variety of techniques including selective laser ablation and selective plasma etching.

The encapsulant can be laterally aligned with the chip and the pillar along an upwardly facing surface by grinding the encapsulant without grinding the chip or the pillar, then grinding the encapsulant and the pillar without grinding the chip, and then grinding the encapsulant, the chip and the pillar (if the pillar extends upwardly beyond the chip before the grinding occurs), or alternatively, by grinding the encapsulant without grinding the chip or the pillar, then grinding the encapsulant and the chip without grinding the pillar, and then grinding the encapsulant, the chip and the pillar (if the chip extends upwardly beyond the pillar before the grinding occurs).

The support can be removed at numerous times after the encapsulant is formed. For instance, the support can be removed before or after removing the upper portion of the encapsulant to expose the pillar. In addition, the support can be removed in numerous manners. For instance, a metal support can be etched off the insulative base and a plastic support can be peeled-off the insulative base. Alternatively, the support can remain a permanent part of the structure.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. Application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

The connection joint and the terminals can be formed simultaneously or in sequence. The connection joint and the terminals can be formed in sequence in numerous manners. For example, the connection joint can be formed during a first plating operation before exposing the routing line or the pillar outside the periphery of the chip, and then the terminals can be formed during a second plating operation after exposing the routing line and the pillar outside the periphery of the chip. As another example, the connection joint can be formed without a plating operation, and then the terminals can be formed during a plating operation. Alternatively, the connection joint and the terminals can be formed simultaneously after mechanically attaching the chip to the routing line and the pillar. The phrase "simultaneously formed" as used in this context means that the connection joint and the terminals are formed during the same deposition operation, such as a plating operation, and although the connection joint and the terminals need not necessarily begin to deposit at the same time, the connection joint and the terminals eventually deposit concurrently during the deposition operation.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

Various cleaning steps, such as a brief oxygen plasma cleaning step, or a brief wet chemical cleaning step using a solution containing potassium permanganate, can be applied to the structure at various stages, such as after forming the through-holes and before forming the connection joint and the terminals to clean the routing line and the pad.

The "upward" and "downward" vertical directions do not depend on the orientation of the assembly, as will be readily apparent to those skilled in the art. For instance, the pillar tapers inwardly and extends vertically beyond the routing line in the "upward" direction, and the insulative base extends vertically beyond the chip in the "downward" direction, regardless of whether the assembly is inverted and/or mounted on a printed circuit board. Likewise, the routing line extends "laterally" from the pillar towards the chip regardless of whether the assembly is inverted, rotated or slated. Thus, the "upward" and "downward" directions are opposite one another and orthogonal to the "lateral" direction, and the "laterally aligned" surfaces are coplanar with one another in a lateral plane orthogonal to the upward and downward directions. Moreover, the pillar is shown above the routing line, the chip is shown above the routing line and the insulative base, and the encapsulant is shown above the support with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly that includes a single chip can be manufactured individually. Alternatively, numerous assemblies can be simultaneously batch manufactured on a single support with a single insulative base and a single encapsulant and then separated from one another. For example, routing lines for multiple assemblies can be simultaneously electroplated on the metal base, then the insulative base and the support can be attached to the metal base and the routing lines, then the metal base can be etched to form the pillars, then separate spaced adhesives for the respective assemblies can be selectively disposed on the insulative base, then the chips can be disposed on the corresponding adhesives, then the adhesives can be simultaneously fully cured, then the encapsulant can be deposited and then grinded, then the support can be removed, then the through-holes can be formed, then the connection joints and the terminals can be simultaneously plated, then the solder balls can be deposited and simultaneously reflowed on the terminals, and then the insulative base and the encapsulant can be cut, thereby separating the individual single chip-substrate assemblies.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

Advantageously, the semiconductor chip assembly of the present invention is reliable and inexpensive. The insulative base and the encapsulant can protect the chip from handling damage, provide a known dielectric barrier for the conductive trace and protect the assembly from contaminants and unwanted solder reflow during the next level assembly. The encapsulant can provide mechanical support for the conductive trace after the support is removed. The mode of the connection can shift from the initial mechanical coupling to metallurgical coupling to assure sufficient metallurgical bond strength. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. The tapered pillar is particularly well-suited for reducing thermal mismatch related stress in the next level assembly and yields enhanced reliability for the next level assembly that exceeds that of conventional BGA packages. Furthermore, the tapered pillar can extend across the chip thickness and the conductive trace can extend across the assembly thickness to provide vertical routing that facilitates a three-dimensional stacked arrangement. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of making a semiconductor chip assembly, comprising:

providing a metal base with first and second opposing surfaces; then forming an etch mask on the first surface of the metal base;

forming a routing line on the second surface of the metal base; then etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip;

forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; and forming a connection joint that electrically connects the routing line and the pad, wherein a conductive trace that includes the routing line and the pillar is electrically connected to the pad and extends through the first surface of the encapsulant.

2. The method of claim 1, wherein forming the routing line includes selectively depositing the routing line on the metal base.

3. The method of claim 1, wherein forming the routing line includes:

providing a plating mask on the metal base, wherein the plating mask includes an opening that exposes a portion of the metal base; and then electroplating the routing line on the exposed portion of the metal base through the opening in the plating mask.

4. The method of claim 1, wherein forming the etch mask and the routing line includes simultaneously depositing the etch mask and the routing line on the metal base.

5. The method of claim 1, wherein forming the etch mask and the routing line includes:
   providing a first plating mask on the metal base, wherein the first plating mask includes an opening that exposes a first portion of the metal base;
   providing a second plating mask on the metal base, wherein the second plating mask includes an opening that exposes a second portion of the metal base; and then
   simultaneously electroplating the etch mask on the first exposed portion of the metal base through the opening in the first plating mask and the routing line on the second exposed portion of the metal base through the opening in the second plating mask.

6. The method of claim 1, wherein etching the metal base etches through the metal base.

7. The method of claim 1, wherein etching the metal base exposes the routing line.

8. The method of claim 1, wherein etching the metal base reduces contact area between the metal base and the routing line.

9. The method of claim 1, wherein etching the metal base electrically isolates the routing line from other routing lines formed on the metal base.

10. The method of claim 1, wherein forming the encapsulant includes depositing the encapsulant on the pillar such that the encapsulant covers the pillar.

11. The method of claim 1, wherein forming the encapsulant includes depositing the encapsulant on the pillar such that the first surface of the pillar is exposed.

12. The method of claim 1, including removing a portion of the encapsulant thereby exposing the pillar.

13. The method of claim 12, wherein removing the portion of the encapsulant exposes the first surface of the pillar and laterally aligns the first surfaces of the encapsulant and the pillar with one another.

14. The method of claim 1, including removing a portion of the encapsulant thereby exposing the chip.

15. The method of claim 14, wherein removing the portion of the encapsulant exposes the second surface of the chip and laterally aligns the first surface of the encapsulant and the second surface of the chip with one another.

16. The method of claim 1, wherein forming the connection joint includes electroplating the connection joint on the routing line and the pad.

17. The method of claim 1, wherein forming the connection joint includes electrolessly plating the connection joint on the routing line and the pad.

18. The method of claim 1, wherein forming the connection joint includes depositing a non-solidified material on the routing line and the pad and then hardening the non-solidified material.

19. The method of claim 1, wherein forming the connection joint includes providing a wire bond that extends vertically beyond the chip and the routing line in the second direction.

20. The method of claim 1, wherein forming the connection joint occurs before forming the encapsulant.

21. The method of claim 1, wherein forming the connection joint occurs after forming the encapsulant.

22. The method of claim 1, wherein the first surface of the chip faces in the first direction after mechanically attaching the chip to the routing line and the pillar.

23. The method of claim 1, wherein the first surface of the chip faces in the second direction after mechanically attaching the chip to the routing line and the pillar.

24. The method of claim 1, wherein the routing line extends vertically beyond the chip in the second direction after mechanically attaching the chip to the routing line and the pillar.

25. The method of claim 1, wherein the routing line extends vertically beyond the pillar in the second direction after mechanically attaching the chip to the routing line and the pillar.

26. The method of claim 1, wherein the routing line extends within and outside the periphery of the chip after mechanically attaching the chip to the routing line and the pillar.

27. The method of claim 1, wherein the routing line is disposed outside the periphery of the chip after mechanically attaching the chip to the routing line and the pillar.

28. The method of claim 1, wherein the first surface of the pillar extends vertically beyond the chip in the first direction after mechanically attaching the chip to the routing line and the pillar.

29. The method of claim 1, wherein the second surface of the pillar extends vertically beyond the chip in the second direction after mechanically attaching the chip to the routing line and the pillar.

30. The method of claim 1, wherein the metal base is a copper plate.

31. The method of claim 1, wherein the routing line is an essentially planar metal lead.

32. The method of claim 1, wherein the pillar has a conical shape.

33. The method of claim 1, wherein the pillar is narrowest its first surface.

34. The method of claim 1, wherein the pillar is widest at its second surface.

35. The method of claim 1, wherein the pillar has tapered sidewalls that extend between its first and second surfaces and slant inwardly towards its first surface.

36. The method of claim 1, wherein the pillar has a first surface area at its first surface and a second surface area at its second surface, and the first surface area is at least 20 percent smaller than the second surface area.

37. The method of claim 1, including forming an insulative base that contacts the metal base and the routing line before forming the pillar, wherein the insulative base extends vertically beyond the chip, the routing line and the pillar in the second direction after mechanically attaching the chip to the routing line and the pillar.

38. The method of claim 37, including forming a through-hole that extends through the insulative base and exposes the pad, and then forming the connection joint.

39. The method of claim 1, including mechanically attaching the metal base and the routing line to a support before forming the pillar, and removing the support after forming the encapsulant.

40. The method of claim 39, including removing the support before forming the connection joint.

41. The method of claim 1, including mechanically attaching the chip to the routing line and the pillar using an insulative adhesive before forming the encapsulant.

42. The method of claim 41, including forming a through-hole that extends through the adhesive and exposes the pad, and then forming the connection joint.

43. The method of claim 42, wherein the adhesive contacts and is sandwiched between the routing line and the pad, and the routing line and the pad are electrically isolated from one another after forming the through-hole and before forming the connection joint.

44. The method of claim 1, including simultaneously forming the connection joint and a first terminal that contacts the first surface of the pillar, extends vertically beyond the pillar in the first direction and is spaced from the connection joint during a plating operation.

45. The method of claim 1, including simultaneously forming the connection joint and a second terminal that contacts the routing line, extends vertically beyond the routing line in the second direction and is spaced from the connection joint during a plating operation.

46. The method of claim 1, including simultaneously forming the connection joint, a first terminal that contacts the first surface of the pillar, extends vertically beyond the pillar in the first direction and is spaced from the connection joint, and a second terminal that contacts the routing line, extends vertically beyond the routing line in the second direction and is spaced from the connection joint and the first terminal during a plating operation.

47. The method of claim 46, including forming a first solder ball on the first terminal and a second solder ball on the second terminal.

48. The method of claim 1, including mechanically attaching a heat sink to the chip, the routing line, the pillar, the encapsulant and the connection joint, wherein the heat sink is electrically isolated from the chip, overlapped by the chip and disposed vertically beyond the chip in the second direction.

49. The method of claim 1, including mechanically attaching a ground plane to the chip, the routing line, the pillar, the encapsulant and the connection joint, and then electrically connecting the ground plane to the routing line, wherein the ground plane is overlapped by the routing line and disposed vertically beyond the routing line in the second direction.

50. The method of claim 1, wherein the assembly is devoid of wire bonds and TAB leads.

51. A method of making a semiconductor chip assembly, comprising:
  providing a metal base with first and second opposing surfaces; then
  forming an etch mask on the first surface of the metal base;
  forming a routing line on the second surface of the metal base; then
  etching the metal base, thereby etching through the metal base and reducing contact area between the metal base and the routing line, wherein an unetched portion of the metal base defined by the etch mask forms a pillar that includes first and second opposing surfaces, the first surface of the pillar faces away from the routing line and contacts the etch mask, and the second surface of the pillar contacts the routing line; then
  mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip;
  forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; and
  forming a connection joint that electrically connects the routing line and the pad, wherein a conductive trace that includes the routing line and the pillar is electrically connected to the pad and extends through the first surface of the encapsulant.

52. The method of claim 51, wherein forming the etch mask and the routing line includes simultaneously electroplating the etch mask and the routing line on the metal base.

53. The method of claim 51, wherein forming the etch mask and the routing line includes:
  providing a first plating mask on the metal base, wherein the first plating mask includes an opening that exposes a first portion of the metal base;
  providing a second plating mask on the metal base, wherein the second plating mask includes an opening that exposes a second portion of the metal base; and then
  simultaneously electroplating the etch mask on the first exposed portion of the metal base through the opening in the first plating mask and the routing line on the second exposed portion of the metal base through the opening in the second plating mask.

54. The method of claim 53, wherein the first and second plating masks are photoresist.

55. The method of claim 51, wherein:
  the etch mask includes first and second metal layers, the first metal layer of the etch mask contacts the first surface of the metal base and has a different composition than the metal base, and the second metal layer of the etch mask contacts the first metal layer of the etch mask, has a different composition than the first metal layer of the etch mask and is spaced from the metal base; and
  the routing line includes first and second metal layers, the first metal layer of the routing line contacts the second surface of the metal base and has a different composition than the metal base, and the second metal layer of the routing line contacts the first metal layer of the routing line, has a different composition than the first metal layer of the routing line and is spaced from the metal base.

56. The method of claim 55, wherein the metal base and the second metal layers have similar compositions.

57. The method of claim 56, wherein the metal base and the second metal layers are copper, and the first metal layers are nickel.

58. The method of claim 56, wherein etching the metal base includes applying a wet chemical etch that is highly selective of the metal base and the second metal layers with respect to the first metal layers, thereby forming the pillar, removing the second metal layer of the etch mask and exposing the first metal layer of the routing line without removing the second metal layer of the routing line.

59. The method of claim 58, including applying a second wet chemical etch after forming the pillar that is selective of the first metal layers, thereby removing the etch mask, removing an exposed portion of the first metal layer of the routing line and exposing the first surface of the pillar.

60. The method of claim 59, wherein applying the second wet chemical etch occurs before mechanically attaching the chip to the routing line and the pillar.

61. A method of making a semiconductor chip assembly, comprising:
provide a metal base with first and second opposing surfaces; then
forming an etch mask on the first surface of the metal base;
forming a routing line on the second surface of the metal base; then
etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then
mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip;
forming an encapsulant that covers the chip, the routing line and the pillar and extends vertically beyond the chip, the routing line and the pillar in the first direction, wherein the encapsulant includes a first surface that faces in the first direction and a second surface that faces in the second direction, and the chip and the pillar are embedded in the encapsulant;
removing a portion of the encapsulant, thereby exposing the first surface of the pillar such that the chip and the pillar remain embedded in the encapsulant; and
forming a connection joint that electrically connects the routing line and the pad, wherein a conductive trace that includes the routing line and the pillar is electrically connected to the pad and extends through the first surface of the encapsulant.

62. The method of claim 61, wherein forming the encapsulant includes transfer molding the encapsulant.

63. The method of claim 61, wherein forming the encapsulant includes curing the encapsulant.

64. The method of claim 61, wherein removing the portion of the encapsulant includes applying a laser that ablates the encapsulant.

65. The method of claim 61, wherein removing the portion of the encapsulant includes applying a plasma that etches the encapsulant.

66. The method of claim 61, wherein removing the portion of the encapsulant includes grinding the encapsulant.

67. The method of claim 66, wherein removing the portion of the encapsulant includes grinding the encapsulant without grinding the pillar, and then grinding the encapsulant and the pillar, and excludes grinding the chip.

68. The method of claim 66, wherein removing the portion of the encapsulant includes grinding the encapsulant without grinding the pillar and without grinding the chip, and then grinding the encapsulant, the pillar and the chip.

69. The method of claim 68, wherein removing the portion of the encapsulant includes grinding the encapsulant without grinding the pillar and without grinding the chip, then grinding the encapsulant and the pillar without grinding the chip, and then grinding the encapsulant, the pillar and the chip.

70. The method of claim 68, wherein removing the portion of the encapsulant includes grinding the encapsulant without grinding the pillar and without grinding the chip, then grinding the encapsulant and the chip without grinding the pillar, and then grinding the encapsulant, the pillar and the chip.

71. A method of making a semiconductor chip assembly, comprising:
providing a metal base with first and second opposing surfaces; then
forming an etch mask on the first surface of the metal base;
forming a routing line on the second surface of the metal base;
mechanically attaching the metal base, the etch mask and the routing line to a support using an insulative base, wherein the insulative base contacts and is sandwiched between the metal base and the support, and between the routing line and the support; then
etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then
mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip overlaps the insulative base and the support and extends vertically beyond the routing line in the first direction, the pillar is disposed outside a periphery of the chip and extends vertically beyond the routing line in the first direction, the routing line extends laterally from the pillar towards the chip, the insulative base extends vertically beyond the chip, the routing line and the pillar in the second direction, and the support extends vertically beyond the insulative base in the second direction;
forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant;
removing the support after forming the encapsulant; and
forming a connection joint that electrically connects the routing line and the pad, wherein a conductive trace that includes the routing line and the pillar is electrically connected to the pad and extends through the first surface of the encapsulant.

72. The method of claim 71, wherein mechanically attaching the metal base, the etch mask and the routing line to the support includes contacting the insulative base to the metal base and the routing line, then contacting the insulative base to the support, and then curing the insulative base.

73. The method of claim 71, wherein mechanically attaching the metal base, the etch mask and the routing line to the support includes contacting the insulative base to the support, then contacting the insulative base to the metal base and the routing line, and then curing the insulative base.

74. The method of claim 71, wherein mechanically attaching the chip to the routing line and the pillar includes using an insulative adhesive that contacts and is sandwiched between the chip and the insulative base.

75. The method of claim 71, wherein mechanically attaching the chip to the routing line and the pillar occurs after removing the etch mask.

76. The method of claim 71, wherein mechanically attaching the chip to the routing line and the pillar occurs while forming the connection joint.

77. The method of claim 71, wherein removing the support includes etching the support.

78. The method of claim 71, wherein removing the support includes peeling-off the support.

79. The method of claim 71, wherein removing the support occurs before forming the connection joint.

80. The method of claim 71, wherein removing the support occurs after forming the connection joint.

81. A method of making a semiconductor chip assembly, comprising:

providing a metal base with first and second opposing surfaces; then forming an etch mask on the first surface of the metal base;

forming a routing line on the second surface of the metal base;

forming an insulative base that contacts the metal base and the routing line; then etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then mechanically attaching a semiconductor chip to the routing line and the pillar using an insulative adhesive that contacts and is sandwiched between the chip and the insulative base, wherein the chip includes first and second opposing surfaces, the first surface of the chip includes a conductive pad, the first surface of the pillar and the second surface of the chip face in a first direction, the first surface of the chip and the second surface of the pillar face in a second direction opposite the first direction, the chip extends vertically beyond the routing line in the first direction, the pillar is disposed outside a periphery of the chip and extends vertically beyond the routing line in the first direction, the routing line extends laterally from the pillar towards the chip, the adhesive extends vertically beyond the chip in the second direction, and the insulative base extends vertically beyond the adhesive in the second direction; then forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; then forming a through-hole that extends through the insulative base and the adhesive and exposes the pad; and then forming a connection joint that electrically connects the routing line and the pad, wherein a conductive trace that includes the routing line and the pillar is electrically connected to the pad and extends through the first surface of the encapsulant.

82. The method of claim 81, wherein forming the through-hole includes applying a laser that ablates the insulative base and the adhesive.

83. The method of claim 81, wherein forming the through-hole includes applying a plasma that etches the insulative base and the adhesive.

84. The method of claim 81, wherein forming the through-hole exposes the routing line, and the connection joint contacts the routing line in the through-hole.

85. The method of claim 84, wherein forming the connection joint includes electroplating the connection joint on the routing line and the pad.

86. The method of claim 84, wherein forming the connection joint includes electrolessly plating the connection joint on the routing line and the pad.

87. The method of claim 84, wherein forming the connection joint includes depositing solder paste on the routing line and the pad and then reflowing the solder paste.

88. The method of claim 84, wherein forming the connection joint includes depositing conductive adhesive on the routing line and the pad and then curing the conductive adhesive.

89. The method of claim 81, wherein forming the through-hole does not expose the routing line, and the connection joint does not contact the routing line in the through-hole.

90. The method of claim 89, wherein forming the connection joint includes providing a wire bond that extends into and is electrically connected to the pad in the through-hole, and extends out of and is electrically connected to the routing line outside the through-hole.

91. A method of making a semiconductor chip assembly, comprising:

providing a metal base with first and second opposing surfaces; then forming an etch mask on the first surface of the metal base;

forming a routing line on the second surface of the metal base; then etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip; then forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; and then forming a connection joint that contacts and electrically connects the routing line and the pad and a first terminal that contacts the first surface of the pillar, extends vertically beyond the pillar in the first direction and is spaced from the connection joint during a plating operation, wherein a conductive trace that includes the routing line, the pillar and the first terminal is electrically connected to the pad and extends through the first surface of the encapsulant.

92. The method of claim 91, wherein forming the connection joint and the first terminal includes simultaneously forming the connection joint and the first terminal during the plating operation.

93. The method of claim 91, wherein forming the connection joint and the first terminal includes forming a second terminal that contacts the routing line, extends vertically beyond the routing line in the second direction and is spaced from the connection joint and the first terminal during the plating operation.

94. The method of claim 93, wherein forming the connection joint and the first and second terminals includes simultaneously forming the connection joint and the first and second terminals during the plating operation.

95. The method of claim 93, wherein the first and second terminals are vertically aligned with one another.

96. The method of claim 93, wherein the first and second terminals are not vertically aligned with one another.

97. The method of claim 91, wherein the first surfaces of the pillar and the encapsulant are laterally aligned with one another, and the first terminal extends vertically beyond the encapsulant in the first direction.

98. The method of claim 93, wherein the second terminal extends vertically beyond the encapsulant in the second direction.

99. The method of claim 91, including forming a first solder ball on the first terminal.

100. The method of claim 93, including forming a first solder ball on the first terminal and a second solder ball on the second terminal.

101. A method of making a semiconductor chip assembly, comprising:
providing a metal base;
forming a routing line on the metal base;
etching the metal base, wherein an unetched portion of the metal base forms a pillar that includes first and second opposing surfaces, the first surface of the pillar faces away from the routing line and the second surface of the pillar contacts the routing line; then
mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip;
forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; and
forming a connection joint that electrically connects the routing line and the pad, wherein a conductive trace that includes the routing line and the pillar is electrically connected to the pad and extends through the first surface of the encapsulant.

102. The method of claim 101, wherein forming an etch mask and the routing line includes:
providing a first plating mask on the metal base, wherein the first plating mask includes an opening that exposes a first portion of the metal base;
providing a second plating mask on the metal base, wherein the second plating mask includes an opening that exposes a second portion of the metal base; and then
simultaneously electroplating the etch mask on the first exposed portion of the metal base through the opening in the first plating mask and the routing line on the second exposed portion of the metal base through the opening in the second plating mask.

103. The method of claim 101, wherein etching the metal base etches through the metal base, reduces contact area between the metal base and the routing line, exposes the routing line and electrically isolates the routing line from other routing lines formed on the metal base.

104. The method of claim 101, wherein mechanically attaching the chip to the routing line and the pillar provides that the routing line extends within and outside a periphery of the chip and is disposed vertically beyond the chip in the second direction.

105. The method of claim 101, wherein mechanically attaching the chip to the routing line and the pillar provides that the routing line is disposed outside the periphery of the chip and vertically beyond the chip in the second direction.

106. The method of claim 101, wherein mechanically attaching the chip to the routing line and the pillar provides that the first surface of the pillar extends vertically beyond the chip in the first direction.

107. The method of claim 101, wherein mechanically attaching the chip to the routing line and the pillar provides that the second surface of the pillar extends vertically beyond the chip in the second direction.

108. The method of claim 101, wherein forming the encapsulant includes depositing the encapsulant on and in contact with the chip and the pillar.

109. The method of claim 101, wherein forming the encapsulant includes depositing the encapsulant such that the encapsulant covers the first surface of the pillar, and after depositing the encapsulant, the method includes grinding the first surface of the encapsulant without grinding the pillar, and then grinding the first surfaces of the pillar and the encapsulant such that the first surfaces of the pillar and the encapsulant are laterally aligned with one another.

110. The method of claim 101, wherein forming the encapsulant includes depositing the encapsulant such that the encapsulant does not cover the first surface of the pillar.

111. The method of claim 101, wherein forming the connection joint occurs after forming the encapsulant.

112. The method of claim 101, wherein forming the connection joint occurs after forming the encapsulant and removing a portion of the encapsulant to expose the first surface of the pillar.

113. The method of claim 101, wherein forming the connection joint includes plating the connection joint on the routing line and the pad during a plating operation.

114. The method of claim 113, including forming a first terminal that contacts the first surface of the pillar, extends vertically beyond the pillar in the first direction and is spaced from the connection joint during the plating operation.

115. The method of claim 114, including forming a second terminal that contacts the routing line, extends vertically beyond the routing line in the second direction and is spaced from the connection joint and the first terminal during the plating operation.

116. The method of claim 101, wherein the routing line is an essentially flat planar lead, and the pillar has tapered sidewalls that extend between its first and second surfaces and extend inwardly towards its first surface.

117. The method of claim 101, including mechanically attaching a heat sink to the chip, the routing line, the pillar, the encapsulant and the connection joint, wherein the heat sink is electrically isolated from the chip, overlapped by the chip and disposed vertically beyond the chip in the second direction.

118. The method of claim 117, including forming a first terminal that contacts the first surface of the pillar, extends vertically beyond the pillar in the first direction and is spaced from the connection joint and a metallic coating that contacts the heat sink, extends vertically beyond the heat sink in the second direction and is spaced from the first terminal and the connection joint during a plating operation.

119. The method of claim 101, including mechanically attaching a ground plane to the chip, the routing line, the pillar, the encapsulant and the connection joint, and then electrically connecting the ground plane to the routing line, wherein the ground plane is overlapped by the routing line and disposed vertically beyond the routing line in the second direction.

120. The method of claim 119, including forming a first terminal that contacts the first surface of the pillar, extends vertically beyond the pillar in the first direction and is spaced from the connection joint and a metallic coating that contacts and electrically connects the routing line and the ground plane, extends vertically beyond the ground plane in the second direction and is spaced from the first terminal and the connection joint during a plating operation.

121. A method of making a semiconductor chip assembly, comprising the following steps in the sequence set forth:
providing a metal base, an etch mask and a routing line, wherein the metal base includes first and second opposing surfaces, the;
etch mask is formed on the first surface of the metal base and the routing line is formed on the second surface of the metal base;
mechanically attaching the metal base, the etch mask and the routing line to a support using an insulative base that extends between the metal base and the support, and between the routing line and the support;
etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line;
mechanically attaching a semiconductor chip to the routing line and the pillar using an adhesive that extends between the chip and the insulative base, wherein the chip includes first and second opposing surfaces, the first surface of the chip includes a conductive pad, the first surface of the pillar and the second surface of the chip face in a first direction, the first surface of the chip and the second surface of the pillar face in a second direction opposite the first direction, the chip, the routing line and the pillar overlap the insulative base and the support, the chip extends vertically beyond the routing line in the first direction, the pillar is disposed outside a periphery of the chip and extends vertically beyond the routing line and the first surface of the chip in the first direction, the routing line extends laterally from the pillar towards the chip and extends within and outside the periphery of the chip, the insulative base extends vertically beyond the chip, the routing line and the pillar in the second direction, and the support extends vertically beyond the insulative base in the second direction;
forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant;
removing the support;
forming a through-hole that extends through the insulative base and the adhesive and exposes the routing line and the pad; and
forming a connection joint that electrically connects the routing line and the pad in the through-hole, wherein a conductive trace that includes the routing line and the pillar is electrically connected to the pad and extends through the first surface of the encapsulant.

122. The method of claim 121, wherein forming the etch mask and the routing line includes:
providing a first plating mask on the metal base, wherein the first plating mask includes an opening that exposes a first portion of the metal base;
providing a second plating mask on the metal base, wherein the second plating mask includes an opening that exposes a second portion of the metal base; and then
simultaneously electroplating the etch mask on the first exposed portion of the metal base through the opening in the first plating mask and the routing line on the second exposed portion of the metal base through the opening in the second plating mask.

123. The method of claim 121, wherein etching the metal base etches through the metal base, reduces contact area between the metal base and the routing line, exposes the routing line and electrically isolates the routing line from other routing lines formed on the metal base.

124. The method of claim 121, wherein mechanically attaching the chip to the routing line and the pillar provides that the first surface of the pillar extends vertically beyond the chip in the first direction.

125. The method of claim 121, wherein mechanically attaching the chip to the routing line and the pillar provides that the second surface of the pillar extends vertically beyond the chip in the second direction.

126. The method of claim 121, wherein removing the support includes etching the support.

127. The method of claim 121, wherein removing the support includes peeling-off the support.

128. The method of claim 121, wherein forming the encapsulant includes depositing the encapsulant on and in contact with the chip, the pillar and the insulative base.

129. The method of claim 121, wherein forming the encapsulant includes depositing the encapsulant such that the encapsulant covers the first surface of the pillar, and after depositing the encapsulant, the method includes grinding the first surface of the encapsulant without grinding the pillar, and then grinding the first surfaces of the pillar and the encapsulant such that the first surfaces of the pillar and the encapsulant are laterally aligned with one another.

130. The method of claim 121, wherein forming the encapsulant includes depositing the encapsulant such that the encapsulant does not cover the first surface of the pillar.

131. The method of claim 121, wherein forming the through-hole includes applying a laser that ablates the insulative base and the adhesive.

132. The method of claim 121, wherein forming the through-hole includes applying a plasma that etches the insulative base and the adhesive.

133. The method of claim 121, wherein forming the connection joint includes plating the connection joint on the routing line and the pad during a plating operation.

134. The method of claim 133, including forming a first terminal that contacts the first surface of the pillar, extends vertically beyond the pillar in the first direction and is spaced from the connection joint during the plating operation.

135. The method of claim 134, including forming a second terminal that contacts the routing line, extends vertically beyond the routing line in the second direction and is spaced from the connection joint and the first terminal during the plating operation.

136. The method of claim 121, wherein the routing line is an essentially flat planar lead, and the pillar has tapered sidewalls that extend between its first and second surfaces and extend inwardly towards its first surface.

137. The method of claim 121, including mechanically attaching a heat sink to the insulative base after removing the support, wherein the heat sink is electrically isolated from the chip, overlapped by the chip and disposed vertically beyond the insulative base the second direction.

138. The method of claim 137, including forming a first terminal that contacts the first surface of the pillar, extends vertically beyond the pillar in the first direction and is spaced from the connection joint and a metallic coating that contacts the heat sink, extends vertically beyond the heat sink in the second direction and is spaced from the first terminal and the connection joint during a plating operation.

139. The method of claim 121, including mechanically attaching a ground plane to the insulative base after removing the support, and then electrically connecting the ground plane to the routing line, wherein the ground plane is overlapped by the routing line and disposed vertically beyond the insulative base in the second direction.

140. The method of claim 139, including forming a first terminal that contacts the first surface of the pillar, extends vertically beyond the pillar in the first direction and is spaced from the connection joint and a metallic coating that contacts and electrically connects the routing line and the ground plane, extends through the insulative base, extends vertically beyond the ground plane in the second direction and is spaced from the first terminal and the connection joint during a plating operation.

141. A method of making a semiconductor chip assembly, comprising the following steps in the sequence set forth:
providing a metal base, an etch mask and a routing line, wherein the metal base includes first and second opposing surfaces, the;
etch mask is formed on the first surface of the metal base and the routing line is formed on the second surface of the metal base;
mechanically attaching the metal base, the etch mask and the routing line to a support using an insulative base that extends between the metal base and the support, and between the routing line and the support;
etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line;
mechanically attaching a semiconductor chip to the routing line and the pillar, wherein the chip includes first and second opposing surfaces, the first surface of the chip includes a conductive pad, the first surface of the pillar and the second surface of the chip face in a first direction, the first surface of the chip and the second surface of the pillar face in a second direction opposite the first direction, the chip, the routing line and the pillar overlap the insulative base and the support, the chip extends vertically beyond the routing line in the first direction, the pillar is disposed outside a periphery of the chip and extends vertically beyond the routing line and the first surface of the chip in the first direction, the routing line extends laterally from the pillar towards the chip and extends within and outside a periphery of the chip, the insulative base extends vertically beyond the chip, the routing line and the pillar in the second direction, the support extends vertically beyond the insulative base in the second direction, and a connection joint electrically connects the routing line and the pad;
forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; and
removing the support, wherein a conductive trace that includes the routing line and the pillar is electrically connected to the pad and extends through the first surface of the encapsulant.

142. The method of claim 141, wherein forming the etch mask and the routing line includes:
providing a first plating mask on the metal base, wherein the first plating mask includes an opening that exposes a first portion of the metal base;
providing a second plating mask on the metal base, wherein the second plating mask includes an opening that exposes a second portion of the metal base; and then
simultaneously electroplating the etch mask on the first exposed portion of the metal base through the opening in the first plating mask and the routing line on the second exposed portion of the metal base through the opening in the second plating mask.

143. The method of claim 141, wherein etching the metal base etches through the metal base, reduces contact area between the metal base and the routing line, exposes the routing line and electrically isolates the routing line from other routing lines formed on the metal base.

144. The method of claim 141, wherein mechanically attaching the chip to the routing line and the pillar provides that the first surface of the pillar extends vertically beyond the chip in the first direction.

145. The method of claim 141, wherein mechanically attaching the chip to the routing line and the pillar provides that the second surface of the pillar extends vertically beyond the chip in the second direction.

146. The method of claim 141, wherein removing the support includes etching the support.

147. The method of claim 141, wherein removing the support includes peeling-off the support.

148. The method of claim 141, wherein forming the encapsulant includes depositing the encapsulant on and in contact with the chip, the pillar and the insulative base.

149. The method of claim 141, wherein forming the encapsulant includes depositing the encapsulant such that the encapsulant covers the first surface of the pillar, and after depositing the encapsulant, the method includes grinding the first surface of the encapsulant without grinding the pillar, and then grinding the first surfaces of the pillar and the encapsulant such that the first surfaces of the pillar and the encapsulant are laterally aligned with one another.

150. The method of claim 141, wherein forming the encapsulant includes depositing the encapsulant such that the encapsulant does not cover the first surface of the pillar.

151. The method of claim 141, including forming a through-hole that extends through the insulative base and exposes the routing line after removing the support.

152. The method of claim 151, wherein forming the through-hole includes applying a laser that ablates the insulative base.

153. The method of claim 151, wherein forming the through-hole includes applying a plasma that etches the insulative base.

154. The method of claim 151, including forming a second terminal that contacts the routing line in the through-hole, extends vertically beyond the routing line in the second direction and is spaced from the connection joint during a plating operation.

155. The method of claim 154, including forming a first terminal that contacts the first surface of the pillar, extends vertically beyond the pillar in the first direction and is spaced from the connection joint and the second terminal during the plating operation.

156. The method of claim 141, wherein the routing line is an essentially flat planar lead, and the pillar has tapered sidewalls that extend between its first and second surfaces and extend inwardly towards its first surface.

157. The method of claim 141, including mechanically attaching a heat sink to the insulative base after removing the support, wherein the heat sink is electrically isolated from the chip, overlapped by the chip and disposed vertically beyond the insulative base the second direction.

158. The method of claim 157, including forming a first terminal that contacts the first surface of the pillar, extends vertically beyond the pillar in the first direction and is spaced from the connection joint and a metallic coating that contacts the heat sink, extends vertically beyond the heat sink in the second direction and is spaced from the first terminal and the connection joint during a plating operation.

159. The method of claim 141, including mechanically attaching a ground plane to the insulative base after removing the support, and then electrically connecting the ground plane to the routing line, wherein the ground plane is overlapped by the routing line and disposed vertically beyond the insulative base in the second direction.

160. The method of claim 159, including forming a first terminal that contacts the first surface of the pillar, extends vertically beyond the pillar in the first direction and is spaced from the connection joint and a metallic coating that contacts and electrically connects the routing line and the ground plane, extends through the insulative base, extends vertically beyond the ground plane in the second direction and is spaced from the first terminal and the connection joint during a plating operation.

161. A method of making a semiconductor chip assembly, comprising the following steps in the sequence set forth:
  providing a metal base, an etch mask and a routing line, wherein the metal base includes first and second opposing surfaces, the;
  etch mask is formed on the first surface of the metal base and the routing line is formed on the second surface of the metal base;
  mechanically attaching the metal base, the etch mask and the routing line to a support using an insulative base that extends between the metal base and the support, and between the routing line and the support;
  etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line;
  mechanically attaching a semiconductor chip to the routing line and the pillar using an adhesive that extends between the chip and the insulative base, wherein the chip includes first and second opposing surfaces, the first surface of the chip includes a conductive pad, the first surface of the pillar and the second surface of the chip face in a first direction, the first surface of the chip and the second surface of the pillar face in a second direction opposite the first direction, the chip, the routing line and the pillar overlap the insulative base and the support, the chip extends vertically beyond the routing line in the first direction, the pillar is disposed outside a periphery of the chip and extends vertically beyond the routing line and the first surface of the chip in the first direction, the routing line extends laterally from the pillar towards the chip, the insulative base extends vertically beyond the chip, the routing line and the pillar in the second direction, and the support extends vertically beyond the insulative base in the second direction;
  forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant;
  removing the support;
  forming a first through-hole that extends through the insulative base and exposes the routing line without exposing the pad and a second through-hole that extends through the insulative base and the adhesive and exposes the pad without exposing the routing line; and
  forming a wire bond connection joint that electrically connects the routing line and the pad, wherein the connection joint is electrically connected to the routing line in the first through-hole and the pad in the second through-hole, the connection joint extends vertically beyond the insulative base in the second direction, and a conductive trace that includes the routing line and the pillar is electrically connected to the pad and extends through the first surface of the encapsulant.

162. The method of claim 161, wherein forming the etch mask and the routing line includes:
  providing a first plating mask on the metal base, wherein the first plating mask includes an opening that exposes a first portion of the metal base;
  providing a second plating mask on the metal base, wherein the second plating mask includes an opening that exposes a second portion of the metal base; and then
  simultaneously electroplating the etch mask on the first exposed portion of the metal base through the opening in the first plating mask and the routing line on the second exposed portion of the metal base through the opening in the second plating mask.

163. The method of claim 161, wherein etching the metal base etches through the metal base, reduces contact area between the metal base and the routing line, exposes the routing line and electrically isolates the routing line from other routing lines formed on the metal base.

164. The method of claim 161, wherein mechanically attaching the chip to the routing line and the pillar provides that the first surface of the pillar extends vertically beyond the chip in the first direction.

165. The method of claim 161, wherein mechanically attaching the chip to the routing line and the pillar provides that the second surface of the pillar extends vertically beyond the chip in the second direction.

166. The method of claim 161, wherein removing the support includes etching the support.

167. The method of claim 161, wherein removing the support includes peeling-off the support.

168. The method of claim 161, wherein forming the encapsulant includes depositing the encapsulant on and in contact with the chip, the pillar and the insulative base.

169. The method of claim 161, wherein forming the encapsulant includes depositing the encapsulant such that the encapsulant covers the first surface of the pillar, and after depositing the encapsulant, the method includes grinding the first surface of the encapsulant without grinding the pillar, and then grinding the first surfaces of the pillar and the encapsulant such that the first surfaces of the pillar and the encapsulant are laterally aligned with one another.

170. The method of claim 161, wherein forming the encapsulant includes depositing the encapsulant such that the encapsulant does not cover the first surface of the pillar.

171. The method of claim 161, wherein forming the first through-hole includes applying a laser that ablates the insulative base, and forming the second through-hole includes applying a laser that ablates the insulative base and the adhesive.

172. The method of claim 161, wherein forming the first through-hole includes applying a plasma that etches the insulative base, and forming the second through-hole includes applying a plasma that etches the insulative base and the adhesive.

173. The method of claim 161, wherein forming the first and second through-holes includes forming the first and second through-holes in sequence.

174. The method of claim 161, including forming a second terminal that contacts the routing line in the first through-hole and extends vertically beyond the routing line in the second direction during a plating operation, and then forming the connection joint on the second terminal.

175. The method of claim 174, including forming a first terminal that contacts the first surface of the pillar, extends vertically beyond the pillar in the first direction and is spaced from the second terminal during the plating operation.

176. The method of claim 161, wherein the routing line is an essentially flat planar lead, and the pillar has tapered sidewalls that extend between its first and second surfaces and extend inwardly towards its first surface.

177. The method of claim 161, including mechanically attaching a heat sink to the insulative base after removing the support, wherein the heat sink is electrically isolated from the chip, overlapped by the chip and disposed vertically beyond the insulative base the second direction.

178. The method of claim 177, including forming a first terminal that contacts the first surface of the pillar, extends vertically beyond the pillar in the first direction and is spaced from the connection joint and a metallic coating that contacts the heat sink, extends vertically beyond the heat sink in the second direction and is spaced from the first terminal and the connection joint during a plating operation.

179. The method of claim 161, including mechanically attaching a ground plane to the insulative base after removing the support, and then electrically connecting the ground plane to the routing line, wherein the ground plane is overlapped by the routing line and disposed vertically beyond the insulative base in the second direction.

180. The method of claim 179, including forming a first terminal that contacts the first surface of the pillar, extends vertically beyond the pillar in the first direction and is spaced from the connection joint and a metallic coating that contacts and electrically connects the routing line and the ground plane, extends through the insulative base, extends vertically beyond the ground plane in the second direction and is spaced from the first terminal and the connection joint during a plating operation.

181. A method of making a semiconductor chip assembly, comprising the following steps in the sequence set forth:

providing a metal base, an etch mask and a routing line, wherein the metal base includes first and second opposing surfaces, the;

etch mask is formed on the first surface of the metal base and the routing line is formed on the second surface of the metal base;

mechanically attaching the metal base, the etch mask and the routing line to a support using an insulative base that extends between the metal base and the support, and between the routing line and the support;

etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line;

mechanically attaching a semiconductor chip to the routing line and the pillar using an adhesive that extends between the chip and the insulative base, wherein the chip includes first and second opposing surfaces, the first surface of the chip includes a conductive pad, the first surfaces of the chip and the pillar face in a first direction, the second surfaces of the chip and the pillar face in a second direction opposite the first direction, the chip, the routing line and the pillar overlap the insulative base and the support, the chip extends vertically beyond the routing line in the first direction, the pillar is disposed outside a periphery of the chip and extends vertically beyond the routing line and the second surface of the chip in the first direction, the routing line extends laterally from the pillar towards the chip, the insulative base extends vertically beyond the chip, the routing line and the pillar in the second direction, and the support extends vertically beyond the insulative base in the second direction;

forming a wire bond connection joint that electrically connects the routing line and the pad;

forming an encapsulant that covers the chip and the connection joint and extends vertically beyond the chip, the routing line and the connection joint in the first direction, wherein the encapsulant includes a first surface that faces in the first direction and a second surface that faces in the second direction, and the chip and the pillar are embedded in the encapsulant; and removing the support, wherein a conductive trace that includes the routing line and the pillar is electrically connected to the pad and extends through the first surface of the encapsulant.

182. The method of claim 181, wherein forming the etch mask and the routing line includes:

providing a first plating mask on the metal base, wherein the first plating mask includes an opening that exposes a first portion of the metal base;

providing a second plating mask on the metal base, wherein the second plating mask includes an opening that exposes a second portion of the metal base; and then simultaneously electroplating the etch mask on the first exposed portion of the metal base through the opening in the first plating mask and the routing line on the second exposed portion of the metal base through the opening in the second plating mask.

183. The method of claim 181, wherein etching the metal base etches through the metal base, reduces contact area between the metal base and the routing line, exposes the routing line and electrically isolates the routing line from other routing lines formed on the metal base.

184. The method of claim 181, wherein mechanically attaching the chip to the routing line and the pillar provides that the first surface of the pillar extends vertically beyond the chip in the first direction.

185. The method of claim 181, wherein mechanically attaching the chip to the routing line and the pillar provides that the second surface of the pillar extends vertically beyond the chip in the second direction.

186. The method of claim 181, wherein removing the support includes etching the support.

187. The method of claim 181, wherein removing the support includes peeling-off the support.

188. The method of claim 181, wherein forming the encapsulant includes depositing the encapsulant on and in contact with the chip, the insulative base and the connection joint.

189. The method of claim 181, wherein forming the encapsulant includes depositing the encapsulant such that the encapsulant covers the first surface of the pillar, and after depositing the encapsulant, the method includes grinding the first surface of the encapsulant without grinding the pillar, and then grinding the first surfaces of the pillar and the encapsulant such that the first surfaces of the pillar and the encapsulant are laterally aligned with one another.

190. The method of claim 181, wherein forming the encapsulant includes depositing the encapsulant such that the encapsulant does not cover the first surface of the pillar.

191. The method of claim 181, including forming a through-hole that extends through the insulative base and exposes the routing line after removing the support.

192. The method of claim 191, wherein forming the through-hole includes applying a laser that ablates the insulative base.

193. The method of claim 191, wherein forming the through-hole includes applying a plasma that etches the insulative base.

194. The method of claim 191, including forming a second terminal that contacts the routing line in the through-hole, extends vertically beyond the routing line in the second direction and is spaced from the connection joint during a plating operation.

195. The method of claim 194, including forming a first terminal that contacts the first surface of the pillar, extends vertically beyond the pillar in the first direction and is spaced from the connection joint and the second terminal during the plating operation.

196. The method of claim 181, wherein the routing line is an essentially flat planar lead, and the pillar has tapered sidewalls that extend between its first and second surfaces and extend inwardly towards its first surface.

197. The method of claim 181, including mechanically attaching a heat sink to the insulative base after removing the support, wherein the heat sink is electrically isolated from the chip, overlapped by the chip and disposed vertically beyond the insulative base the second direction.

198. The method of claim 197, including forming a first terminal that contacts the first surface of the pillar, extends vertically beyond the pillar in the first direction and is spaced from the connection joint and a metallic coating that contacts the heat sink, extends vertically beyond the heat sink in the second direction and is spaced from the first terminal and the connection joint during a plating operation.

199. The method of claim 181, including mechanically attaching a ground plane to the insulative base after removing the support, and then electrically connecting the ground plane to the routing line, wherein the ground plane is overlapped by the routing line and disposed vertically beyond the insulative base in the second direction.

200. The method of claim 199, including forming a first terminal that contacts the first surface of the pillar, extends vertically beyond the pillar in the first direction and is spaced from the connection joint and a metallic coating that contacts and electrically connects the routing line and the ground plane, extends through the insulative base, extends vertically beyond the ground plane in the second direction and is spaced from the first terminal and the connection joint during a plating operation.

201. A method of making a semiconductor chip assembly, comprising:

providing a metal base, an etch mask and a routing line, wherein the metal base includes first and second opposing surfaces, the etch mask is formed on the first surface of the metal base and the routing line is formed on the second surface of the metal base; then etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip;

forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; and forming a connection joint that electrically connects the routing line and the pad, wherein a conductive trace that includes the routing line and the pillar is electrically connected to the pad and extends through the first surface of the encapsulant.

202. The method of claim 201, wherein forming the routing line includes selectively depositing the routing line on the metal base.

203. The method of claim 201, wherein forming the routing line includes:
provided a plating mask on the metal base, wherein the plating mask includes an opening that exposes a portion of the metal base; and then
electroplating the routing line on the exposed portion of the metal base through the opening in the plating mask.

204. The method of claim 201, wherein forming the etch mask and the routing line includes simultaneously depositing the etch mask and the routing line on the metal base.

205. The method of claim 201, wherein forming the etch mask and the routing line includes:
providing a first plating mask on the metal base, wherein the first plating mask includes an opening that exposes a first portion of the metal base;
providing a second plating mask on the metal base, wherein the second plating mask includes an opening that exposes a second portion of the metal base; and then
simultaneously electroplating the etch mask on the first exposed portion of the metal base through the opening in the first plating mask and the routing line on the second exposed portion of the metal base through the opening in the second plating mask.

206. The method of claim 201, wherein etching the metal base etches through the metal base.

207. The method of claim 201, wherein etching the metal base exposes the routing line.

208. The method of claim 201, wherein etching the metal base reduces contact area between the metal base and the routing line.

209. The method of claim 201, wherein etching the metal base electrically isolates the routing line from other routing lines formed on the metal base.

210. The method of claim 201, wherein forming the encapsulant includes depositing the encapsulant on the pillar such that the encapsulant covers the pillar.

211. The method of claim 201, wherein forming the encapsulant includes depositing the encapsulant on the pillar such that the first surface of the pillar is exposed.

212. The method of claim 201, including removing a portion of the encapsulant thereby exposing the pillar.

213. The method of claim 212, wherein removing the portion of the encapsulant exposes the first surface of the pillar and laterally aligns the first surfaces of the encapsulant and the pillar with one another.

214. The method of claim 201, including removing a portion of the encapsulant thereby exposing the chip.

215. The method of claim 214, wherein removing the portion of the encapsulant exposes the second surface of the chip and laterally aligns the first surface of the encapsulant and the second surface of the chip with one another.

216. The method of claim 201, wherein forming the connection joint includes electroplating the connection joint on the routing line and the pad.

217. The method of claim 201, wherein forming the connection joint includes electrolessly plating the connection joint on the routing line and the pad.

218. The method of claim 201, wherein forming the connection joint includes depositing a non-solidified material on the routing line and the pad and then hardening the non-solidified material.

219. The method of claim 201, wherein forming the connection joint includes providing a wire bond that extends vertically beyond the chip and the routing line in the second direction.

220. The method of claim 201, wherein forming the connection joint occurs before forming the encapsulant.

221. The method of claim 201, wherein forming the connection joint occurs after forming the encapsulant.

222. The method of claim 201, wherein the first surface of the chip faces in the first direction after mechanically attaching the chip to the routing line and the pillar.

223. The method of claim 201, wherein the first surface of the chip faces in the second direction after mechanically attaching the chip to the routing line and the pillar.

224. The method of claim 201, wherein the routing line extends vertically beyond the chip in the second direction after mechanically attaching the chip to the routing line and the pillar.

225. The method of claim 201, wherein the routing line extends vertically beyond the pillar in the second direction after mechanically attaching the chip to the routing line and the pillar.

226. The method of claim 201, wherein the routing line extends within and outside the periphery of the chip after mechanically attaching the chip to the routing line and the pillar.

227. The method of claim 201, wherein the routing line is disposed outside the periphery of the chip after mechanically attaching the chip to the routing line and the pillar.

228. The method of claim 201, wherein the first surface of the pillar extends vertically beyond the chip in the first direction after mechanically attaching the chip to the routing line and the pillar.

229. The method of claim 201, wherein the second surface of the pillar extends vertically beyond the chip in the second direction after mechanically attaching the chip to the routing line and the pillar.

230. The method of claim 201, wherein the metal base is a copper plate.

231. The method of claim 201, wherein the routing line is an essentially planar metal lead.

232. The method of claim 201, wherein the pillar has a conical shape.

233. The method of claim 201, wherein the pillar is narrowest its first surface.

234. The method of claim 201, wherein the pillar is widest at its second surface.

235. The method of claim 201, wherein the pillar has tapered sidewalls that extend between its first and second surfaces and slant inwardly towards its first surface.

236. The method of claim 201, wherein the pillar has a first surface area at its first surface and a second surface area at its second surface, and the first surface area is at least 20 percent smaller than the second surface area.

237. The method of claim 201, including forming an insulative base that contacts the metal base and the routing line before forming the pillar, wherein the insulative base extends vertically beyond the chip, the routing line and the pillar in the second direction after mechanically attaching the chip to the routing line and the pillar.

238. The method of claim 237, including forming a through-hole that extends through the insulative base and exposes the pad, and then forming the connection joint.

239. The method of claim 201, including mechanically attaching the metal base and the routing line to a support before forming the pillar, and removing the support after forming the encapsulant.

240. The method of claim 239, including removing the support before forming the connection joint.

241. The method of claim 201, including mechanically attaching the chip to the routing line and the pillar using an insulative adhesive before forming the encapsulant.

242. The method of claim 241, including forming a through-hole that extends through the adhesive and exposes the pad, and then forming the connection joint.

243. The method of claim 242, wherein the adhesive contacts and is sandwiched between the routing line and the pad, and the routing line and the pad are electrically isolated from one another after forming the through-hole and before forming the connection joint.

244. The method of claim 201, including simultaneously forming the connection joint and a first terminal that contacts the first surface of the pillar, extends vertically beyond the pillar in the first direction and is spaced from the connection joint during a plating operation.

245. The method of claim 201, including simultaneously forming the connection joint and a second terminal that contacts the routing line, extends vertically beyond the routing line in the second direction and is spaced from the connection joint during a plating operation.

246. The method of claim 201, including simultaneously forming the connection joint, a first terminal that contacts the first surface of the pillar, extends vertically beyond the pillar in the first direction and is spaced from the connection joint, and a second terminal that contacts the routing line, extends vertically beyond the routing line in the second direction and is spaced from the connection joint and the first terminal during a plating operation.

247. The method of claim 246, including forming a first solder ball on the first terminal and a second solder ball on the second terminal.

248. The method of claim 201, including mechanically attaching a heat sink to the chip, the routing line, the pillar, the encapsulant and the connection joint, wherein the heat sink is electrically isolated from the chip, overlapped by the chip and disposed vertically beyond the chip in the second direction.

249. The method of claim 201, including mechanically attaching a ground plane to the chip, the routing line, the pillar, the encapsulant and the connection joint, and then electrically connecting the ground plane to the routing line, wherein the ground plane is overlapped by the routing line and disposed vertically beyond the routing line in the second direction.

250. The method of claim 201, wherein the assembly is devoid of wire bonds and TAB leads.

251. A method of making a semiconductor chip assembly, comprising:
  providing a metal base, an etch mask and a routing line, wherein the metal base includes first and second opposing surfaces, the etch mask is formed on the first surface of the metal base and the routing line is formed on the second surface of the metal base; then
  etching the metal base, thereby etching through the metal base and reducing contact area between the metal base and the routing line, wherein an unetched portion of the metal base defined by the etch mask forms a pillar that includes first and second opposing surfaces, the first surface of the pillar faces away from the routing line and contacts the etch mask, and the second surface of the pillar contacts the routing line; then
  mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip;
  forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; and
  forming a connection joint that electrically connects the routing line and the pad, wherein a conductive trace that includes the routing line and the pillar is electrically connected to the pad and extends through the first surface of the encapsulant.

252. The method of claim 251, wherein forming the etch mask and the routing line includes simultaneously electroplating the etch mask and the routing line on the metal base.

253. The method of claim 251, wherein forming the etch mask and the routing line includes:
  providing a first plating mask on the metal base, wherein the first plating mask includes an opening that exposes a first portion of the metal base;
  providing a second plating mask on the metal base, wherein the second plating mask includes an opening that exposes a second portion of the metal base; and then
  simultaneously electroplating the etch mask on the first exposed portion of the metal base through the opening in the first plating mask and the routing line on the second exposed portion of the metal base through the opening in the second plating mask.

254. The method of claim 253, wherein the first and second plating masks are photoresist.

255. The method of claim 251, wherein:
  the etch mask includes first and second metal layers, the first metal layer of the etch mask contacts the first surface of the metal base and has a different composition than the metal base, and the second metal layer of the etch mask contacts the first metal layer of the etch mask, has a different composition than the first metal layer of the etch mask and is spaced from the metal base; and
  the routing line includes first and second metal layers, the first metal layer of the routing line contacts the second surface of the metal base and has a different composition than the metal base, and the second metal layer of the routing line contacts the first metal layer of the routing line, has a different composition than the first metal layer of the routing line and is spaced from the metal base.

256. The method of claim 255, wherein the metal base and the second metal layers have similar compositions.

257. The method of claim 256, wherein the metal base and the second metal layers are copper, and the first metal layers are nickel.

258. The method of claim 256, wherein etching the metal base includes applying a wet chemical etch that is highly selective of the metal base and the second metal layers with respect to the first metal layers, thereby forming the pillar, removing the second metal layer of the etch mask and exposing the first metal layer of the routing line without removing the second metal layer of the routing line.

259. The method of claim 258, including applying a second wet chemical etch after forming the pillar that is selective of the first metal layers, thereby removing the etch mask, removing an exposed portion of the first metal layer of the routing line and exposing the first surface of the pillar.

260. The method of claim 259, wherein applying the second wet chemical etch occurs before mechanically attaching the chip to the routing line and the pillar.

261. A method of making a semiconductor chip assembly, comprising:
providing a metal base, an etch mask and a routing line, wherein the metal base includes first and second opposing surfaces, the etch mask is formed on the first surface of the metal base and the routing line is formed on the second surface of the metal base; then
etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then
mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip;
forming an encapsulant that covers the chip, the routing line and the pillar and extends vertically beyond the chip, the routing line and the pillar in the first direction, wherein the encapsulant includes a first surface that faces in the first direction and a second surface that faces in the second direction, and the chip and the pillar are embedded in the encapsulant;
removing a portion of the encapsulant, thereby exposing the first surface of the pillar such that the chip and the pillar remain embedded in the encapsulant; and
forming a connection joint that electrically connects the routing line and the pad, wherein a conductive trace that includes the routing line and the pillar is electrically connected to the pad and extends through the first surface of the encapsulant.

262. The method of claim 261, wherein forming the encapsulant includes transfer molding the encapsulant.

263. The method of claim 261, wherein forming the encapsulant includes curing the encapsulant.

264. The method of claim 261, wherein removing the portion of the encapsulant includes applying a laser that ablates the encapsulant.

265. The method of claim 261, wherein removing the portion of the encapsulant includes applying a plasma that etches the encapsulant.

266. The method of claim 261, wherein removing the portion of the encapsulant includes grinding the encapsulant.

267. The method of claim 266, wherein removing the portion of the encapsulant includes grinding the encapsulant without grinding the pillar, and then grinding the encapsulant and the pillar, and excludes grinding the chip.

268. The method of claim 266, wherein removing the portion of the encapsulant includes grinding the encapsulant without grinding the pillar and without grinding the chip, and then grinding the encapsulant, the pillar and the chip.

269. The method of claim 268, wherein removing the portion of the encapsulant includes grinding the encapsulant without grinding the pillar and without grinding the chip, then grinding the encapsulant and the pillar without grinding the chip, and then grinding the encapsulant, the pillar and the chip.

270. The method of claim 268, wherein removing the portion of the encapsulant includes grinding the encapsulant without grinding the pillar and without grinding the chip, then grinding the encapsulant and the chip without grinding the pillar, and then grinding the encapsulant, the pillar and the chip.

271. A method of making a semiconductor chip assembly, comprising:
providing a metal base, an etch mask and a routing line, wherein the metal base includes first and second opposing surfaces, the etch mask is formed on the first surface of the metal base and the routing line is formed on the second surface of the metal base; then
mechanically attaching the metal base, the etch mask and the routing line to a support using an insulative base, wherein the insulative base contacts and is sandwiched between the metal base and the support, and between the routing line and the support; then
etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then
mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip overlaps the insulative base and the support and extends vertically beyond the routing line in the first direction, the pillar is disposed outside a periphery of the chip and extends vertically beyond the routing line in the first direction, the routing line extends laterally from the pillar towards the chip, the insulative base extends vertically beyond the chip, the routing line and the pillar in the second direction, and the support extends vertically beyond the insulative base in the second direction;
forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant;
removing the support after forming the encapsulant; and
forming a connection joint that electrically connects the routing line and the pad, wherein a conductive trace that includes the routing line and the pillar is electrically connected to the pad and extends through the first surface of the encapsulant.

272. The method of claim 271, wherein mechanically attaching the metal base, the etch mask and the routing line to the support includes contacting the insulative base to the metal base and the routing line, then contacting the insulative base to the support, and then curing the insulative base.

273. The method of claim 271, wherein mechanically attaching the metal base, the etch mask and the routing line to the support includes contacting the insulative base to the support, then contacting the insulative base to the metal base and the routing line, and then curing the insulative base.

274. The method of claim 271, wherein mechanically attaching the chip to the routing line and the pillar includes using an insulative adhesive that contacts and is sandwiched between the chip and the insulative base.

275. The method of claim 271, wherein mechanically attaching the chip to the routing line and the pillar occurs after removing the etch mask.

276. The method of claim 271, wherein mechanically attaching the chip to the routing line and the pillar occurs while forming the connection joint.

277. The method of claim 271, wherein removing the support includes etching the support.

278. The method of claim 271, wherein removing the support includes peeling-off the support.

279. The method of claim 271, wherein removing the support occurs before forming the connection joint.

280. The method of claim 271, wherein removing the support occurs after forming the connection joint.

281. A method of making a semiconductor chip assembly, comprising:
providing a metal base, an etch mask and a routing line, wherein the metal base includes first and second opposing surfaces, the etch mask is formed on the first surface of the metal base and the routing line is formed on the second surface of the metal base; then
forming an insulative base that contacts the metal base and the routing line; then
etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then
mechanically attaching a semiconductor chip to the routing line and the pillar using an insulative adhesive that contacts and is sandwiched between the chip and the insulative base, wherein the chip includes first and second opposing surfaces, the first surface of the chip includes a conductive pad, the first surface of the pillar and the second surface of the chip face in a first direction, the first surface of the chip and the second surface of the pillar face in a second direction opposite the first direction, the chip extends vertically beyond the routing line in the first direction, the pillar is disposed outside a periphery of the chip and extends vertically beyond the routing line in the first direction, the routing line extends laterally from the pillar towards the chip, the adhesive extends vertically beyond the chip in the second direction, and the insulative base extends vertically beyond the adhesive in the second direction; then
forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; then
forming a through-hole that extends through the insulative base and the adhesive and exposes the pad; and then
forming a connection joint that electrically connects the routing line and the pad, wherein a conductive trace that includes the routing line and the pillar is electrically connected to the pad and extends through the first surface of the encapsulant.

282. The method of claim 281, wherein forming the through-hole includes applying a laser that ablates the insulative base and the adhesive.

283. The method of claim 281, wherein forming the through-hole includes applying a plasma that etches the insulative base and the adhesive.

284. The method of claim 281, wherein forming the through-hole exposes the routing line, and the connection joint contacts the routing line in the through-hole.

285. The method of claim 284, wherein forming the connection joint includes electroplating the connection joint on the routing line and the pad.

286. The method of claim 284, wherein forming the connection joint includes electrolessly plating the connection joint on the routing line and the pad.

287. The method of claim 284, wherein forming the connection joint includes depositing solder paste on the routing line and the pad and then reflowing the solder paste.

288. The method of claim 284, wherein forming the connection joint includes depositing conductive adhesive on the routing line and the pad and then curing the conductive adhesive.

289. The method of claim 281, wherein forming the through-hole does not expose the routing line, and the connection joint does not contact the routing line in the through-hole.

290. The method of claim 289, wherein forming the connection joint includes providing a wire bond that extends into and is electrically connected to the pad in the through-hole, and extends out of and is electrically connected to the routing line outside the through-hole.

291. A method of making a semiconductor chip assembly, comprising:
providing a metal base, an etch mask and a routing line, wherein the metal base includes first and second opposing surfaces, the etch mask is formed on the first surface of the metal base and the routing line is formed on the second surface of the metal base; then
etching the metal base, wherein an unetched portion of the metal base defined by the etch mask forms a pillar that includes first and second opposing surfaces, the first surface of the pillar faces away from the routing line and contacts the etch mask, and the second surface of the pillar contacts the routing line; then
mechanically attaching a semiconductor chip to the routing line and the pillar, wherein the chip includes first and second opposing surfaces, the first surface of the chip includes a conductive pad, the first surface of the pillar faces in a first direction, the second surface of the pillar faces in a second direction opposite the first direction, the chip extends vertically beyond the routing line in the first direction, the pillar is disposed outside a periphery of the chip and extends vertically beyond the routing line in the first direction, and the routing line extends laterally from the pillar towards the chip; then
forming an encapsulant that covers the chip and extends vertically beyond the chip and the routing line in the first direction, wherein the encapsulant includes a first surface that faces in the first direction and a second surface that faces in the second direction, and the chip and the pillar are embedded in the encapsulant; and then
forming a connection joint that contacts and electrically connects the routing line and the pad and a first terminal that contacts the first surface of the pillar, extends vertically beyond the pillar in the first direction and is spaced from the connection joint during a plating operation, wherein a conductive trace that includes the routing line, the pillar and the first terminal is electrically connected to the pad and extends through the first surface of the encapsulant.

292. The method of claim 291, wherein forming the connection joint and the first terminal includes simultaneously forming the connection joint and the first terminal during the plating operation.

293. The method of claim 291, wherein forming the connection joint and the first terminal includes forming a second terminal that contacts the routing line, extends vertically beyond the routing line in the second direction and is spaced from the connection joint and the first terminal during the plating operation.

294. The method of claim 291, wherein forming the connection joint and the first and second terminals includes simultaneously forming the connection joint and the first and second terminals during the plating operation.

295. The method of claim 293, wherein the first and second terminals are vertically aligned with one another.

296. The method of claim 293, wherein the first and second terminals are not vertically aligned with one another.

297. The method of claim 291, wherein the first surfaces of the pillar and the encapsulant are laterally aligned with one another, and the first terminal extends vertically beyond the encapsulant in the first direction.

298. The method of claim 293, wherein the second terminal extends vertically beyond the encapsulant in the second direction.

299. The method of claim 291, including forming a first solder ball on the first terminal.

300. The method of claim 293, including forming a first solder ball on the first terminal and a second solder ball on the second terminal.

* * * * *

UNITED STATES PATENT AND TRADEMARK OFFICE
CERTIFICATE OF CORRECTION

PATENT NO. : 7,094,676 B1  Page 1 of 1
APPLICATION NO. : 10/719823
DATED : August 22, 2006
INVENTOR(S) : Chuen-Rong Leu et al.

It is certified that error appears in the above-identified patent and that said Letters Patent is hereby corrected as shown below:

On Title Page, Item (54) should read,
METHOD OF MAKING A SEMICONDUCTOR CHIP ASSEMBLY WITH AN EMBEDDED METAL PILLAR.

Column 53
Lines 31-36, "providing a metal base . . . of the metal base;" is a subparagraph.
Line 33, delete ";" after "the".

Column 55
Lines 46-51, "providing a metal base . . . of the metal base;" is a subparagraph.
Line 48, delete ";" after "the".

Column 57
Lines 56-61, "providing a metal base . . . of the metal base;" is a subparagraph.
Line 58, delete ";" after "the".

Column 60
Lines 15-20, "providing a metal base . . . of the metal base;" is a subparagraph.
Line 17, delete ";" after "the".

Column 71
Line 16, change "291" to -- 293 --.

Signed and Sealed this

Twenty-fourth Day of October, 2006

JON W. DUDAS
*Director of the United States Patent and Trademark Office*